United States Patent
Yamazaki et al.

(10) Patent No.: US 10,831,291 B2
(45) Date of Patent: Nov. 10, 2020

(54) DISPLAY PANEL, DATA PROCESSOR, AND METHOD FOR MANUFACTURING DISPLAY PANEL

(71) Applicant: Semiconductor Energy Laboratory Co., Ltd., Atsugi (JP)

(72) Inventors: Shunpei Yamazaki, Tokyo (JP); Koji Kusunoki, Kanagawa (JP); Yoshiharu Hirakata, Kanagawa (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 170 days.

(21) Appl. No.: 15/290,073

(22) Filed: Oct. 11, 2016

(65) Prior Publication Data

US 2017/0031471 A1 Feb. 2, 2017

Related U.S. Application Data

(62) Division of application No. 15/092,221, filed on Apr. 6, 2016, now abandoned.

(30) Foreign Application Priority Data

| | | |
|---|---|---|
| Apr. 13, 2015 | (JP) | 2015-081519 |
| Jun. 8, 2015 | (JP) | 2015-115638 |
| Jul. 30, 2015 | (JP) | 2015-150202 |

(51) Int. Cl.
*G06F 3/0354* (2013.01)
*G02F 1/1362* (2006.01)
(Continued)

(52) U.S. Cl.
CPC ........ *G06F 3/03547* (2013.01); *G02F 1/1334* (2013.01); *G02F 1/1362* (2013.01);
(Continued)

(58) Field of Classification Search
CPC ............ H01L 27/3232; H01L 27/3267; H01L 2227/323; G02F 1/13452; G02F 1/133514;
(Continued)

(56) References Cited

U.S. PATENT DOCUMENTS

| | | |
|---|---|---|
| 6,127,199 A | 10/2000 | Inoue et al. |
| 6,372,608 B1 | 4/2002 | Shimoda et al. |

(Continued)

FOREIGN PATENT DOCUMENTS

| | | |
|---|---|---|
| CN | 001375734 A | 10/2002 |
| CN | 001403856 A | 3/2003 |

(Continued)

OTHER PUBLICATIONS

Shieh.H. "Transflective display by Hybrid OLED and LCD", LEOS 2005 (IEEE Lasers and Electro-Optics Society Annual Meeting), Oct. 22, 2005, pp. 650-651, IEEE.

(Continued)

*Primary Examiner* — Hoan C Nguyen
(74) *Attorney, Agent, or Firm* — Fish & Richardson P.C.

(57) ABSTRACT

Provided is a novel display panel that is highly convenient or reliable, a novel data processor that is highly convenient or reliable, or a method for manufacturing a novel display panel that is highly convenient or reliable. The display panel includes a pixel and a terminal electrically connected to the pixel. The pixel includes a first insulating film, a first contact portion in a first opening provided in the first insulating film, a pixel circuit electrically connected to the first contact portion, a second contact portion electrically connected to the pixel circuit, a first display element electrically connected to the first contact portion, and a second display element electrically connected to the second contact portion. The first insulating film includes a region lying between the (Continued)

first display element and the second display element. The terminal includes a surface at which contact with other component can be made.

30 Claims, 31 Drawing Sheets

(51) Int. Cl.
*G02F 1/1368* (2006.01)
*G02F 1/1333* (2006.01)
*G02F 1/1345* (2006.01)
*G02F 1/1335* (2006.01)
*G02F 1/1343* (2006.01)
*G06F 3/041* (2006.01)
*G09G 3/20* (2006.01)
*H01L 27/32* (2006.01)
*G02F 1/1334* (2006.01)
*G02F 1/1337* (2006.01)
*G02F 1/1339* (2006.01)
*G02F 1/167* (2019.01)
*G09G 3/3233* (2016.01)
*G09G 3/36* (2006.01)

(52) U.S. Cl.
CPC ........ *G02F 1/1368* (2013.01); *G02F 1/13338* (2013.01); *G02F 1/13452* (2013.01); *G02F 1/13624* (2013.01); *G02F 1/133305* (2013.01); *G02F 1/133345* (2013.01); *G02F 1/133514* (2013.01); *G02F 1/133553* (2013.01); *G02F 1/133555* (2013.01); *G02F 1/134309* (2013.01); *G02F 1/134336* (2013.01); *G02F 1/136227* (2013.01); *G02F 1/136286* (2013.01); *G06F 3/0416* (2013.01); *G09G 3/2003* (2013.01); *G09G 3/2007* (2013.01); *H01L 27/3232* (2013.01); *H01L 27/3267* (2013.01); *G02F 1/1337* (2013.01); *G02F 1/1339* (2013.01); *G02F 1/13394* (2013.01); *G02F 1/133512* (2013.01); *G02F 1/167* (2013.01); *G02F 2001/13398* (2013.01); *G02F 2001/134345* (2013.01); *G02F 2001/136222* (2013.01); *G02F 2201/44* (2013.01); *G06F 2203/04102* (2013.01); *G06F 2203/04103* (2013.01); *G09G 3/3233* (2013.01); *G09G 3/3648* (2013.01); *G09G 3/3677* (2013.01); *G09G 2300/023* (2013.01); *G09G 2310/08* (2013.01); *G09G 2320/0247* (2013.01); *G09G 2330/021* (2013.01); *G09G 2380/02* (2013.01); *H01L 2227/323* (2013.01)

(58) Field of Classification Search
CPC ............. G02F 1/133555; G02F 1/1362; G02F 1/136227; G02F 1/13624; G02F 1/136286; G02F 1/1368; G02F 1/134336; G02F 1/133553; G02F 1/1334; G02F 1/13338; G02F 1/133345; G02F 1/33305; G02F 1/134309; G02F 1/13394; G02F 1/167; G02F 2001/13398; G02F 2001/134345; G02F 1/36222; G02F 2201/44; G02F 1/1339; G02F 1/1337; G02F 1/133512; G09G 3/2007; G09G 3/2003; G09G 3/3233; G09G 3/3648; G09G 2320/0247; G09G 2380/02; G09G 2300/023; G09G 3/3677; G09G 2330/021; G09G 2310/08; G06F 3/0416; G06F 3/03547; G06F 2203/04103; G06F 2203/04102

USPC ........................................................ 349/43
See application file for complete search history.

(56) References Cited

U.S. PATENT DOCUMENTS

| | | |
|---|---|---|
| 6,501,521 B2 | 12/2002 | Matsushita et al. |
| 6,556,260 B1 | 4/2003 | Itou et al. |
| 6,645,830 B2 | 11/2003 | Shimoda et al. |
| RE38,466 E | 3/2004 | Inoue et al. |
| 6,714,268 B2 | 3/2004 | Wang et al. |
| 6,818,530 B2 | 11/2004 | Shimoda et al. |
| 6,885,418 B2 | 4/2005 | Matsushita et al. |
| 6,900,852 B2 | 5/2005 | Okada et al. |
| 6,912,021 B2 | 6/2005 | Kimura |
| 7,038,641 B2 | 5/2006 | Hirota et al. |
| 7,084,936 B2 | 8/2006 | Kato |
| 7,094,665 B2 | 8/2006 | Shimoda et al. |
| 7,102,704 B2 | 9/2006 | Mitsui et al. |
| 7,176,991 B2 | 2/2007 | Mitsui et al. |
| 7,239,361 B2 | 7/2007 | Kato |
| 7,248,235 B2 | 7/2007 | Fujii et al. |
| 7,285,476 B2 | 10/2007 | Shimoda et al. |
| 7,304,696 B2 | 12/2007 | Yamagishi |
| 7,333,072 B2 | 2/2008 | Yamazaki et al. |
| 7,385,654 B2 | 6/2008 | Mitsui et al. |
| RE40,601 E | 12/2008 | Inoue et al. |
| 7,468,308 B2 | 12/2008 | Shimoda |
| 8,492,757 B2 | 7/2013 | Sakata et al. |
| 8,502,225 B2 | 8/2013 | Yamazaki et al. |
| 8,742,422 B2 | 6/2014 | Sakakura et al. |
| 8,823,893 B2 | 9/2014 | Yamazaki |
| 8,830,424 B2 | 9/2014 | Hirakata et al. |
| 8,872,175 B2 | 10/2014 | Sakata et al. |
| 8,916,870 B2 | 12/2014 | Sakata et al. |
| 8,957,411 B2 | 2/2015 | Yamazaki et al. |
| 9,053,985 B2 | 6/2015 | Tanaka et al. |
| 9,082,678 B2 | 7/2015 | Yamazaki et al. |
| 9,189,997 B2 | 11/2015 | Kimura et al. |
| 9,230,475 B2 | 1/2016 | Yamamoto et al. |
| 9,244,323 B2 | 1/2016 | Yamazaki |
| 9,324,878 B2 | 4/2016 | Sakata et al. |
| 9,356,049 B2 | 5/2016 | Ikeda et al. |
| 9,406,725 B2 | 8/2016 | Yamazaki et al. |
| 9,412,763 B2 | 8/2016 | Morosawa |
| 9,431,465 B2 | 8/2016 | Yamazaki et al. |
| 9,431,618 B2 | 8/2016 | Kawata et al. |
| 9,477,133 B2 | 10/2016 | Ueda et al. |
| 9,496,414 B2 | 11/2016 | Sakata et al. |
| 9,620,525 B2 | 4/2017 | Yamazaki |
| 9,666,649 B2 | 5/2017 | Choi et al. |
| 9,721,977 B2 | 8/2017 | Morosawa |
| 9,991,396 B2 | 6/2018 | Sakata et al. |
| 10,141,382 B2 | 11/2018 | Choi et al. |
| 10,236,391 B2 | 3/2019 | Sakata et al. |
| 10,256,254 B2 | 4/2019 | Yamazaki |
| 10,672,915 B2 | 6/2020 | Yamazaki et al. |
| 2002/0145687 A1 | 10/2002 | Mitsui et al. |
| 2003/0102801 A1 | 6/2003 | Senbonmatsu |
| 2003/0142255 A1 | 7/2003 | Ishii et al. |
| 2003/0201960 A1 | 10/2003 | Fujieda |
| 2006/0072047 A1 | 4/2006 | Sekiguchi |
| 2007/0242031 A1 | 10/2007 | Kimura et al. |
| 2008/0180618 A1 | 7/2008 | Fujieda |
| 2009/0002591 A1 | 1/2009 | Yamazaki et al. |
| 2009/0032955 A1 | 2/2009 | Tanaka et al. |
| 2010/0007942 A1 | 1/2010 | Oikawa et al. |
| 2010/0171905 A1 | 7/2010 | Huang et al. |
| 2011/0205468 A1 | 8/2011 | Hirakata et al. |
| 2011/0210325 A1 | 9/2011 | Sakakura et al. |
| 2011/0292095 A1 | 12/2011 | Yoshida et al. |
| 2012/0229438 A1 | 9/2012 | Fujita |
| 2012/0287092 A1 | 11/2012 | Tatara et al. |
| 2013/0301124 A1 | 11/2013 | Yamazaki et al. |
| 2014/0062844 A1 | 3/2014 | Yamamoto et al. |
| 2014/0065430 A1 | 3/2014 | Yamazaki et al. |
| 2014/0152685 A1 | 6/2014 | Iwaki |
| 2014/0231802 A1 | 8/2014 | Sakakura et al. |

(56) References Cited

U.S. PATENT DOCUMENTS

| | | |
|---|---|---|
| 2015/0355516 A1 | 12/2015 | Imai et al. |
| 2015/0364073 A1 | 12/2015 | Ogawa |
| 2016/0042696 A1* | 2/2016 | Hirakata ............... G02F 1/1334 345/207 |
| 2016/0042702 A1 | 2/2016 | Hirakata et al. |
| 2016/0048045 A1 | 2/2016 | Imai et al. |
| 2016/0268360 A1 | 9/2016 | Ikeda et al. |
| 2016/0275911 A1 | 9/2016 | Kubota et al. |
| 2016/0283028 A1* | 9/2016 | Yamazaki ......... G02F 1/133345 |
| 2016/0343781 A1 | 11/2016 | Kawata et al. |
| 2019/0214499 A1 | 7/2019 | Sakata et al. |
| 2019/0288013 A1 | 9/2019 | Yamazaki |

FOREIGN PATENT DOCUMENTS

| | | |
|---|---|---|
| CN | 001439928 A | 9/2003 |
| CN | 001714380 A | 12/2005 |
| CN | 101359647 A | 2/2009 |
| CN | 102738405 A | 10/2012 |
| CN | 103680390 A | 3/2014 |
| CN | 104766928 A | 7/2015 |
| CN | 104885007 A | 9/2015 |
| CN | 105140292 A | 12/2015 |
| CN | 105449119 A | 3/2016 |
| EP | 0858110 A | 8/1998 |
| EP | 1229379 A | 8/2002 |
| EP | 1351308 A | 10/2003 |
| EP | 1655633 A | 5/2006 |
| EP | 1744365 A | 1/2007 |
| EP | 1758169 A | 2/2007 |
| EP | 2498242 A | 9/2012 |
| EP | 2894688 A | 7/2015 |
| JP | 07-140944 A | 6/1995 |
| JP | 10-125931 A | 5/1998 |
| JP | 11-212116 A | 8/1999 |
| JP | 2001-066593 A | 3/2001 |
| JP | 2001-191750 A | 7/2001 |
| JP | 2002-196702 A | 7/2002 |
| JP | 2002-328630 A | 11/2002 |
| JP | 2002-333622 A | 11/2002 |
| JP | 2003-076302 A | 3/2003 |
| JP | 2003-157026 A | 5/2003 |
| JP | 2003-157029 A | 5/2003 |
| JP | 2003-222854 A | 8/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2004-310069 A | 11/2004 |
| JP | 3852931 | 12/2006 |
| JP | 2007-059125 A | 3/2007 |
| JP | 2007-232882 A | 9/2007 |
| JP | 4161574 | 10/2008 |
| JP | 2009-037115 A | 2/2009 |
| JP | 2009-139452 A | 6/2009 |
| JP | 2010-206040 A | 9/2010 |
| JP | 2011-077513 A | 4/2011 |
| JP | 2011-191750 A | 9/2011 |
| JP | 2011-237760 A | 11/2011 |
| JP | 2012-189828 A | 10/2012 |
| JP | 2012-237806 A | 12/2012 |
| JP | 2013-008543 A | 1/2013 |
| JP | 2013-221965 A | 10/2013 |
| JP | 2014-032960 A | 2/2014 |
| JP | 2014-048486 A | 3/2014 |
| JP | 2014-063723 A | 4/2014 |
| JP | 2014-086705 A | 5/2014 |
| JP | 2014-130577 A | 7/2014 |
| JP | 2014-164389 A | 9/2014 |
| JP | 2015-025968 A | 2/2015 |
| JP | 2015-043081 A | 3/2015 |
| JP | 2015-062060 A | 4/2015 |
| KR | 2003-0022049 A | 3/2003 |
| KR | 10-0500183 | 7/2005 |
| KR | 2009-0014102 A | 2/2009 |
| KR | 2014-0029181 A | 3/2014 |
| TW | 200302947 | 8/2003 |
| TW | 588185 | 5/2004 |
| TW | 200912832 | 3/2009 |
| TW | 201125126 | 7/2011 |
| WO | WO-2004/053819 | 6/2004 |
| WO | WO-2010/090008 | 8/2010 |
| WO | WO-2011/027661 | 3/2011 |
| WO | WO-2011/027676 | 3/2011 |
| WO | WO-2011/074391 | 6/2011 |
| WO | WO-2014/129589 | 8/2014 |

OTHER PUBLICATIONS

Lee.J et al., "High ambient-contrast-ratio display using tandem reflective liquid crystal display and organic light-emitting device", Optics Express, Nov. 14, 2005, vol. 13, No. 23, pp. 9431-9438.

International Search Report (Application No. PCT/IB2016/051932) dated Jul. 19, 2016.

Written Opinion (Application No. PCT/IB2016/051932) dated Jul. 19, 2016.

* cited by examiner

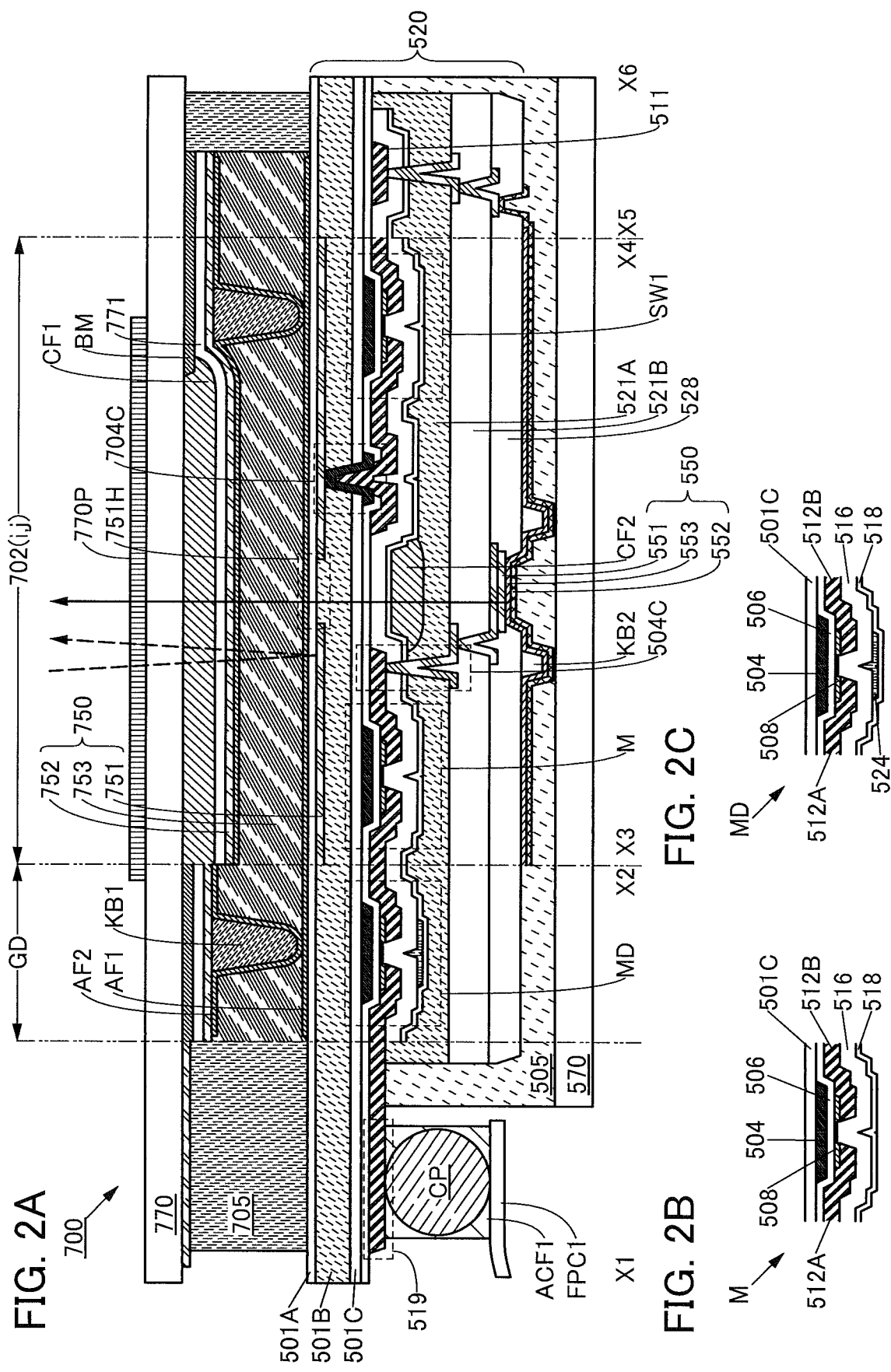

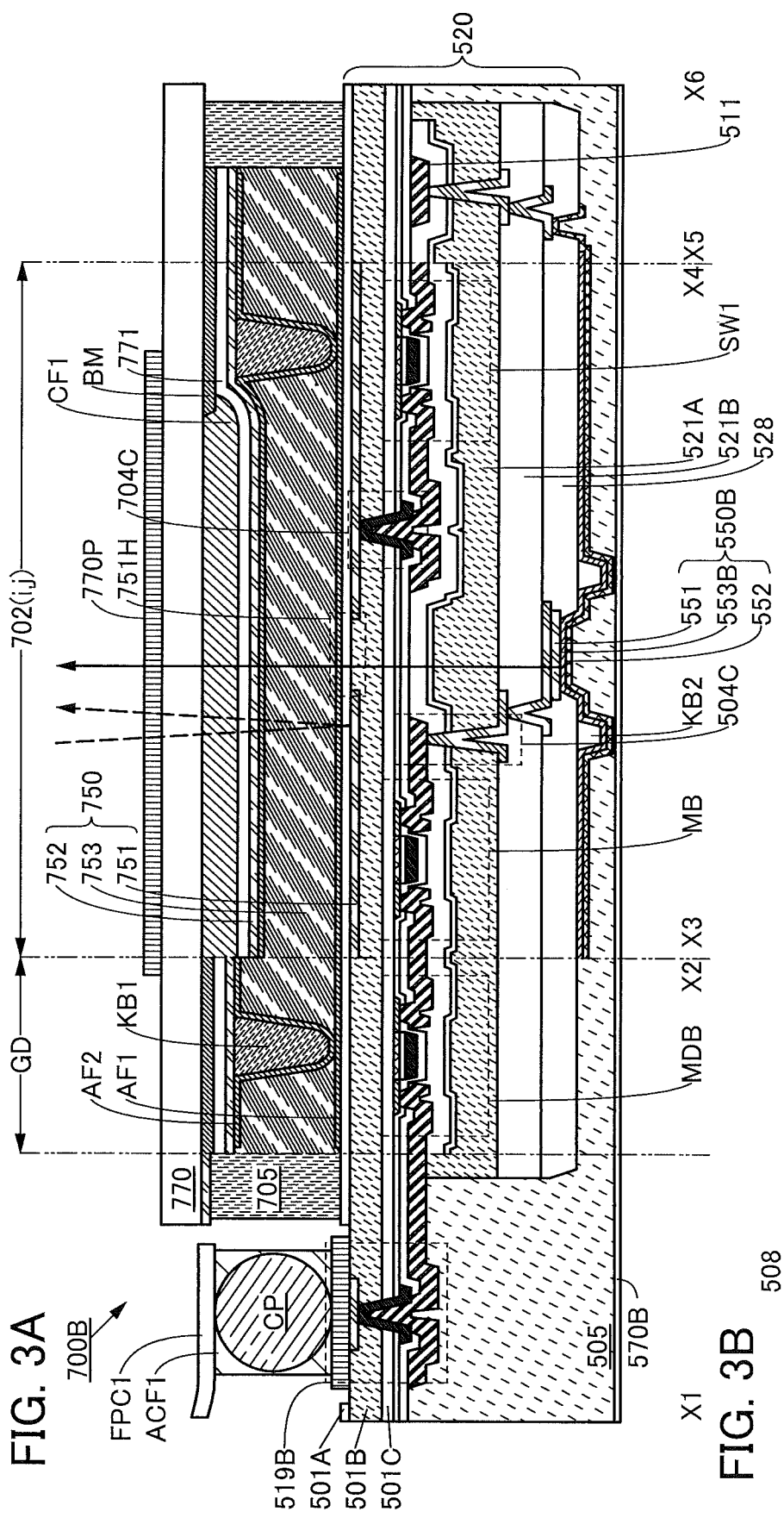
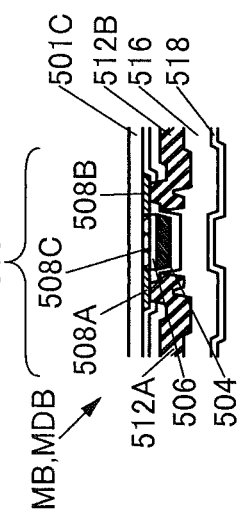
FIG. 3A
FIG. 3B

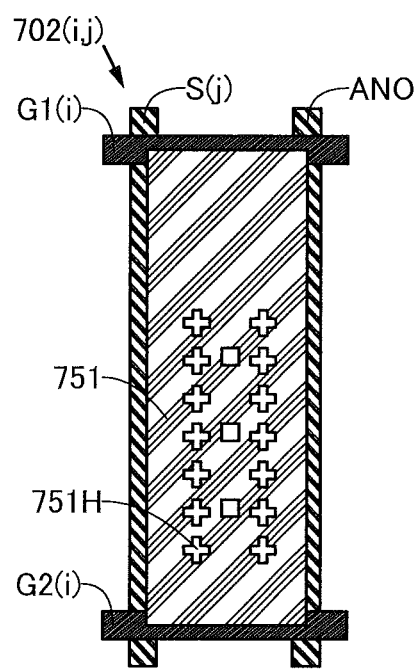
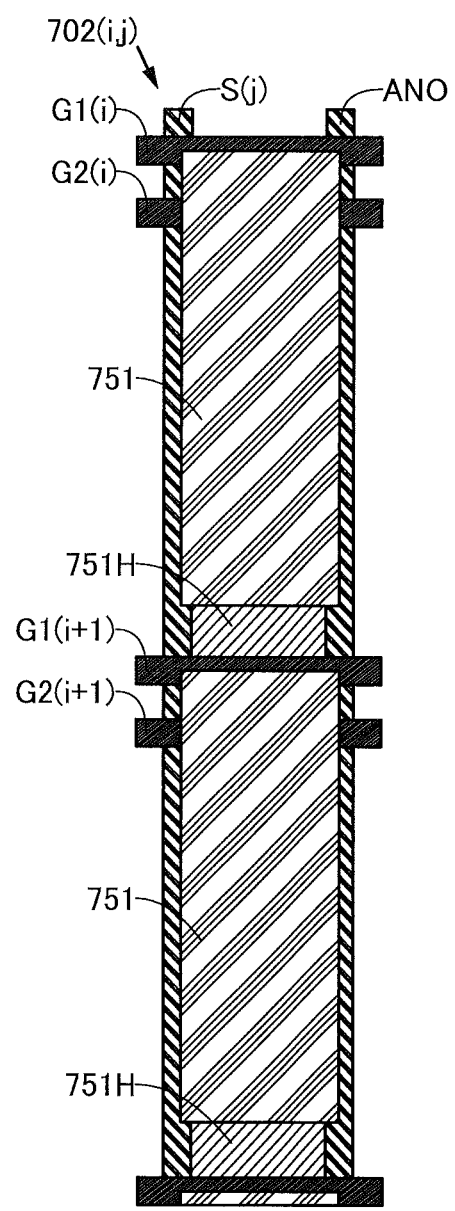
FIG. 6A
FIG. 6B

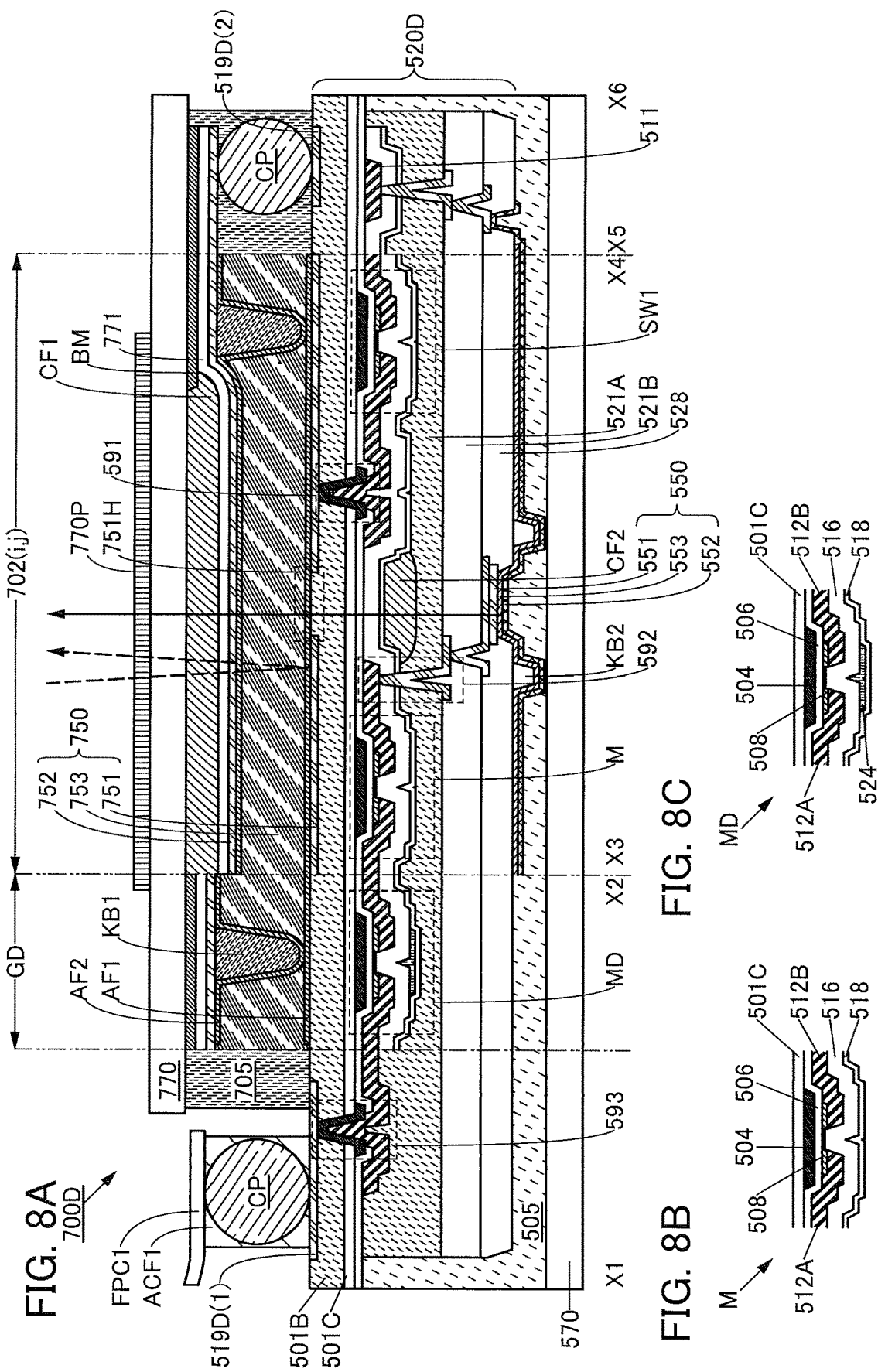

FIG. 31A1
FIG. 31A2
FIG. 31A3
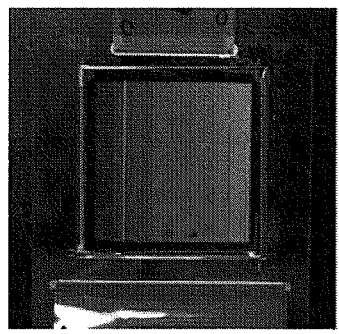
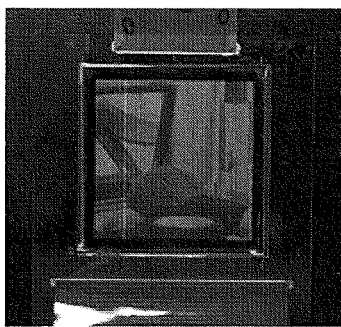
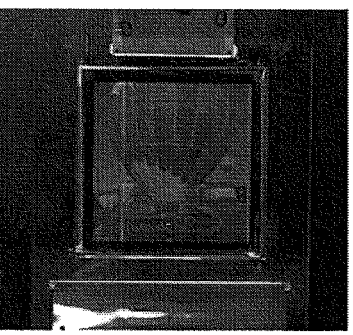
FIG. 31B1
FIG. 31B2
FIG. 31B3
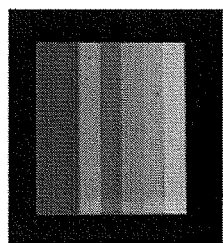
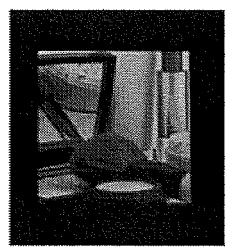
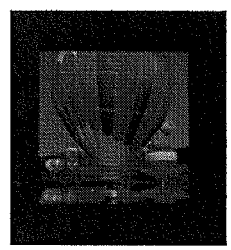
FIG. 31C

DISPLAY PANEL, DATA PROCESSOR, AND METHOD FOR MANUFACTURING DISPLAY PANEL

CROSS-REFERENCE TO RELATED APPLICATIONS

This application is a divisional of U.S. application Ser. No. 15/092,221, filed Apr. 6, 2016, now pending, which claims the benefit of foreign priority applications filed in Japan as Serial No. 2015-081519 on Apr. 13, 2015, Serial No. 2015-115638 on Jun. 8, 2015, and Serial No. 2015-150202 on Jul. 30, 2015, all of which are incorporated by reference.

TECHNICAL FIELD

One embodiment of the present invention relates to a display panel, a data processor, a method for manufacturing a display panel, or a semiconductor device.

Note that one embodiment of the present invention is not limited to the above technical field. The technical field of one embodiment of the invention disclosed in this specification and the like relates to an object, a method, or a manufacturing method. Another embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a light-condensing means and a pixel electrode are provided on one side of a substrate and a region transmitting visible light in the pixel electrode is provided to overlap with an optical axis of the light-condensing means is known. In addition, a liquid crystal display device which uses an anisotropic light-condensing means having a light-condensing direction X and a non-light-condensing direction Y, where the non-light-condensing direction Y corresponds to a longitudinal direction of a region transmitting visible light in the pixel electrode is known (Patent Document 1).

REFERENCE

Patent Document

[Patent Document 1] Japanese Published Patent Application No. 2011-191750

DISCLOSURE OF INVENTION

One object of one embodiment of the present invention is to provide a novel display panel that is highly convenient or reliable. Another object of one embodiment of the present invention is to provide a novel data processor that is highly convenient or reliable. Another object of one embodiment of the present invention is to provide a method for manufacturing a novel display panel that is highly convenient or reliable. Another object of one embodiment of the present invention is to provide a novel display panel, a novel data processor, a method for manufacturing a novel display panel, or a novel semiconductor device.

The descriptions of these objects do not disturb the existence of other objects. Note that one embodiment of the present invention does not necessarily achieve all the objects. Other objects will be apparent from and can be derived from the descriptions of the specification, the drawings, the claims, and the like.

Means for Solving the Problems (1) One embodiment of the present invention is a display panel including a pixel and a terminal.

The pixel includes a first insulating film, a first contact in a first opening provided in the first insulating film, a pixel circuit electrically connected to the first contact, a second contact electrically connected to the pixel circuit, a first display element electrically connected to the first contact, and a second display element electrically connected to the second contact.

The first insulating film includes a region lying between the first display element and the second display element. The first display element includes a reflective film. The reflective film reflects incident light and includes a second opening. The first display element is configured to control the intensity of the reflected light.

The second display element includes a region overlapping with the second opening. The region overlapping with the second opening emits light toward the second opening.

The terminal is electrically connected to the pixel circuit and includes a surface at which contact with other component can be made.

(2) One embodiment of the present invention is the display panel in which the pixel circuit includes a switching element.

The display panel according to one embodiment of the present invention includes the pixel and the terminal electrically connected to the pixel. The pixel includes the first insulating film, the first contact in the first opening provided in the first insulating film, the pixel circuit electrically connected to the first contact, the second contact electrically connected to the pixel circuit, the first display element electrically connected to the first contact, and the second display element electrically connected to the second contact. The first insulating film includes the region lying between the first display element and the second display element. The terminal includes the surface at which contact with other component can be made.

With the structure, the first display element and the second display element between which the first insulating film is provided can be driven using the pixel circuit connected to the terminal, for example. Thus, a novel display panel which is highly convenient or reliable can be provided.

(3) One embodiment of the present invention is the display panel in which the pixel circuit includes a transistor capable of suppressing off-state current more than a transistor in which amorphous silicon is used as a semiconductor.

Since the pixel circuit of the display panel according to one embodiment of the present invention includes the transistor capable of suppressing off-state current, the frequency of supplying a selection signal to the pixel circuit can be reduced while flickers with display performance is suppressed. Thus, a novel display panel with reduced power consumption which is highly convenient or reliable can be provided.

(4) One embodiment of the present invention is the display panel in which the first display element includes a layer containing a liquid crystal material and first and second conductive films. The first and second conductive films are provided so that the alignment of the liquid crystal material can be controlled. The first conductive film is electrically connected to the first contact.

(5) One embodiment of the present invention is the display panel in which the second display element includes a third conductive film, a fourth conductive film including a region overlapping with the third conductive film, and a layer containing a light-emitting organic compound between the third conductive film and the fourth conductive film. The third conductive film is electrically connected to the second contact and transmits light.

In the display panel, which is one embodiment of the present invention, a reflective liquid crystal element and an organic EL element are used as the first display element and the second display element, respectively.

Owing to the structure, in a bright place, external light and the reflective liquid crystal element are utilized to perform display, while in a dark place, light emitted from the organic EL element is utilized to perform display. In a dim place, external light and light emitted from the organic EL element are utilized to perform display. Thus, a novel display panel capable of performing display with high visibility, a novel display panel with reduced power consumption, or a novel display panel highly convenient or reliable can be provided.

(6) One embodiment of the present invention is the display panel in which the first display element is configured to reflect external light and in which the ratio of the total area of the second opening provided in the reflective film to that of a portion of the reflective film other than the second opening is more than or equal to 0.052 and less than or equal to 0.6. The area of the second opening is larger than or equal to 3 $\mu m^2$ and smaller than or equal to 25 $\mu m^2$.

The display panel, which is one embodiment of the present invention, includes the second element which is configured to reflect external light and one or more of the openings. The area of one opening is larger than or equal to 3 $\mu m^2$ and smaller than or equal to 25 $\mu m^2$. The ratio of the total area of the opening to that of the reflective film other than the opening is more than or equal to 0.052 and less than or equal to 0.6

Thus, irregular alignment of the liquid crystal material can be avoided. In a bright place, display can be performed utilizing external light. In a dark place, display can be performed utilizing light emitted from the organic EL element. Thus, a novel display panel capable of performing display with high visibility, a novel display panel with reduced power consumption, or a novel display panel highly convenient or reliable can be provided.

(7) One embodiment of the present invention is the display panel in which the reflective film includes a region embedded in the first insulating film and a region not covered by the first insulating film.

Since the display panel, which is one embodiment of the present invention, includes the reflective film which is composed of the exposed region and the region embedded in the first insulating film, a step at the edge of the reflective film can be minimized to reduce the possibility of alignment defects due to the step. In addition, the surface serving as the contact of the terminal can be exposed. Thus, a novel display panel which is highly convenient or reliable can be provided.

(8) One embodiment of the present invention is the display panel in which the surface at which contact with other component can be made faces the same direction as a surface of the reflective film which reflects external light used for performing display. The terminal includes a region embedded in the first insulating film and a region not covered by the second insulating film.

The display panel according to one embodiment of the present invention includes the terminal including the region embedded in the first insulating film and the region not covered by the second insulating film. Accordingly, the surface of the terminal at which contact with other component can be made can be exposed. Thus, such a novel display panel which is highly convenient or reliable can be provided.

(9) One embodiment of the present invention is the display panel in which the pixel includes a second insulating film. The second insulating film includes a region that is provided such that the reflective film is sandwiched between the region and the first insulating film, and a region that covers the reflective film.

(10) One embodiment of the present invention is a data processor including an arithmetic device and an input/output device.

The arithmetic device is configured to receive positional information and to supply image information and control information.

The input/output device is configured to supply the positional information and to receive the image information and the control information. The input/output device includes a display portion that displays the image information and an input portion that supplies the positional information.

The display portion includes the above-mentioned display panel. The input portion is configured to detect the position of a pointer and to supply the positional information based on the position.

The arithmetic device is configured to determine the moving speed of the pointer in accordance with the positional information and to determine the contrast or brightness of the image information in accordance with the moving speed of the pointer.

The data processor of one embodiment of the present invention includes the input/output device that supplies the positional information and receives the image information and the arithmetic device. The arithmetic device receives the positional information and supplies the image information and determines the contrast or brightness of the image information in accordance with the moving speed of the pointer. With the structure, eyestrain on a user which might be caused by scrolling the image information can be reduced, that is, eye-friendly display can be achieved. Thus, a novel data processor that is highly convenient or reliable can be provided.

(11) One embodiment of the present invention is the data processor in which the input portion includes at least one of a keyboard, a hardware button, a pointing device, a touch sensor, an illuminance sensor, an imaging device, an audio input device, a viewpoint input device, and a pose detection device.

Thus, power consumption can be reduced and excellent visibility can be ensured even in a bright place. Thus, a novel data processor that is highly convenient or reliable can be provided.

(12) One embodiment of the present invention is a manufacturing method of the display panel including the following 11 steps.

A step 1 is for forming the first insulating film over a substrate for use in manufacturing processes.

A step 2 is for forming the reflective film and the terminal.

A step 3 is for forming the second insulating film covering the reflective film and the terminal.

A step 4 is for forming the first contact electrically connected to the reflective film and the third contact electrically connected to the terminal.

A step 5 is for forming the pixel circuit electrically connected to the first contact and the third contact.

A step 6 is for forming the second contact electrically connected to the pixel circuit.

A step 7 is for forming the second display element electrically connected to the second contact.

A step 8 is for stacking a substrate.

A step 9 is for separating the substrate for use in manufacturing processes.

A step 10 is for removing the first insulating film to expose the reflective film and the terminal.

A step 11 is for forming the first display element.

The manufacturing method of the display panel, which is one embodiment of the present invention, includes the step for separating the substrate for use in manufacturing processes and the step for removing the first insulating film to expose the reflective film and the terminal. Accordingly, a step at the edge of the reflective film can be minimized to reduce the possibility of alignment defects due to the step. In addition, the surface of the terminal at which contact with other components is made can be exposed. A manufacturing method of a novel display panel that is highly convenient or reliable can be thus provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. Further, in a p-channel transistor, a terminal to which a lower potential is applied is called a drain, and a terminal to which a higher potential is applied is called a source. In this specification, although connection relation of the transistor is described assuming that the source and the drain are fixed in some cases for convenience, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of the transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected parallel to each other means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, a connection state means not only a state of direct connection but also a state of indirect connection through a circuit element such as a wiring, a resistor, a diode, or a transistor that allows current, voltage, or a potential to be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

In addition, in this specification, one of a first electrode and a second electrode of a transistor refers to a source electrode and the other refers to a drain electrode.

One embodiment of the present invention provides a novel display panel that is highly convenient or reliable, a novel information processing device that is highly convenient or reliable, a method for manufacturing a novel display panel that is highly convenient or reliable, a novel display panel, a novel information processing device, a method for manufacturing a display panel, or a novel semiconductor device.

Note that the description of these effects does not disturb the existence of other effects. One embodiment of the present invention does not necessarily achieve all the effects listed above. Other effects will be apparent from and can be derived from the description of the specification, the drawings, the claims, and the like.

BRIEF DESCRIPTION OF DRAWINGS

FIGS. 2A to 2C are cross-sectional views illustrating the structure of a display panel according to one embodiment of the present invention.

FIGS. 3A and 3B are cross-sectional views illustrating the structure of a terminal of a display panel according to one embodiment of the present invention.

FIGS. 6A and 6B are top views illustrating the structure of a pixel according to one embodiment of the present invention.

FIGS. 8A to 8C are cross-sectional views illustrating the structure of a display panel according to one embodiment of the present invention.

FIGS. 31A1 to 31C are images for showing the display quality of a display panel according to one example of the present invention.

BEST MODE FOR CARRYING OUT THE INVENTION

Figure 1A:
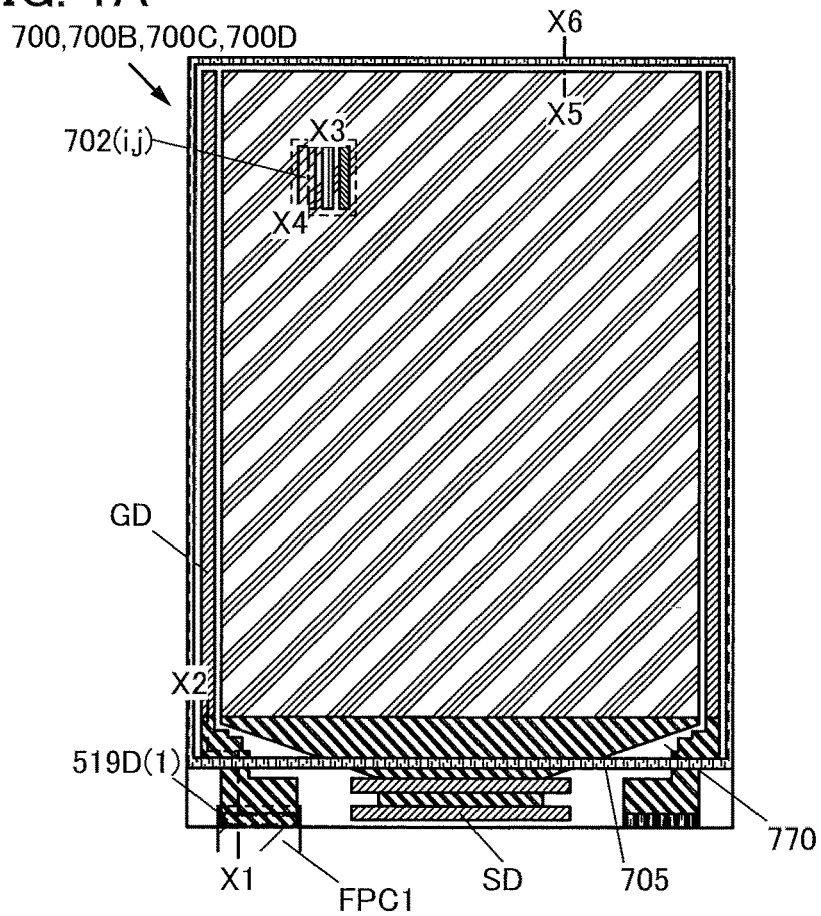
FIG. 1A to 1C are top views and a circuit diagram illustrating the structure of a display panel according to one embodiment of the present invention.

The display panel according to one embodiment of the present invention includes the pixel and the terminal electrically connected to the pixel. The pixel includes the second insulating film, the first contact in the opening provided in the second insulating film, the pixel circuit electrically connected to the first contact, the second contact electrically connected to the pixel circuit, the first display element electrically connected to the first contact, and the second display element electrically connected to the second contact. The second insulating film includes the region lying between the first display element and the second display element. The terminal includes the surface at which contact with other component can be made.

With the structure, the first display element and the second display element between which the second insulating film is provided can be driven using the pixel circuit connected to the terminal, for example. Thus, a novel display panel which is highly convenient or reliable can be provided.

Embodiments will be described in detail with reference to drawings. Note that the present invention is not limited to the description below, and it is easily understood by those skilled in the art that various changes and modifications can be made without departing from the spirit and scope of the present invention. Accordingly, the present invention should not be interpreted as being limited to the content of the embodiments below. Note that in the structures of the invention described below, the same portions or portions having similar functions are denoted by the same reference numerals in different drawings, and description of such portions is not repeated.

Embodiment 1

In this embodiment, the structure of a display panel of one embodiment of the present invention will be described with reference to FIGS. 1A to 1C and FIGS. 2A to 2C.

Figure 1B:
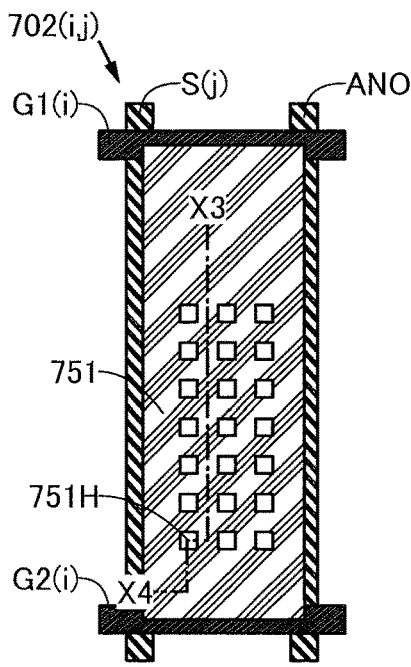
Figure 1C:
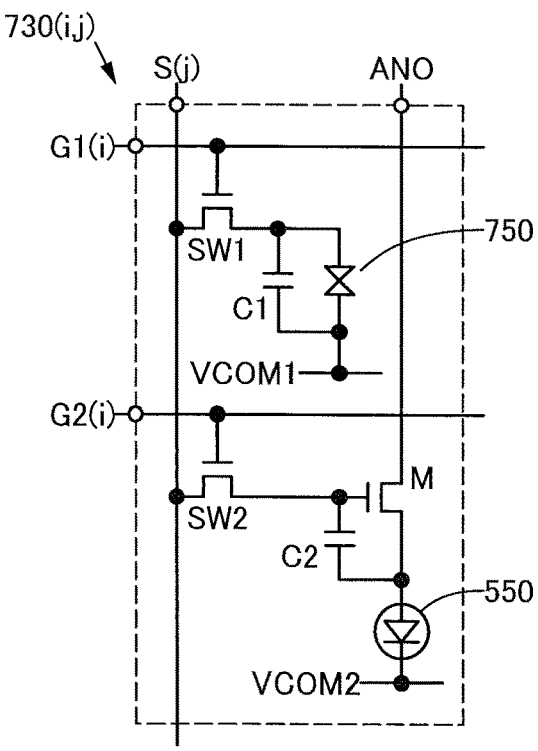

FIGS. 1A to 1C illustrate the structure of the display panel of one embodiment of the present invention. FIG. 1A is a top or bottom view of a display panel 700, 700B, or 700C of one embodiment of the present invention. FIG. 1B is a top view of a pixel 702(i,j) illustrated in FIG. 1B. Note that in this specification, an integral variable of 1 or more may be used for reference numerals. For example, "(p)" where p is an integral variable of 1 or more may be used for part of a reference numeral that specifies any one of components (p components in maximum). For another example, "(m, n)" where in and n are each an integral variable of 1 or more may be used for part of a reference numeral that specifies any one of components (m×n components in maximum).

FIGS. 2A to 2C illustrate the structure of the display panel of one embodiment of the present invention. FIG. 2A is a cross-sectional view of the display panel 700 taken along the section lines X1-X2, X3-X4, and X5-X6 in FIG. 1A. FIG. 2B is a cross-sectional view of a transistor M in FIG. 2A. FIG. 2C is a cross-sectional view of a transistor MD in FIG. 2A.

Structure Example 1 of Display Panel

The display panel 700 described in this embodiment includes the pixel 702(i,j) and a substrate 770 (see FIG. 1A).

The substrate 770 includes a region overlapping with the pixel 702(i,j) (see FIG. 2A).

The pixel 702(i,j) includes a first display element 750, a second display element 550 having a region overlapping with the first display element 750, and a functional layer 520 between the first display element 750 and the second display element 550.

The functional layer 520 includes a first contact 704C electrically connected to the first display element 750, a second contact 504C electrically connected to the second display element 550, and a pixel circuit 730(i,j) electrically connected to the first contact 704C and the second contact 504C (see FIG. 1C and FIG. 2A).

The first display element 750 includes a reflective film reflecting incident light and has a function of controlling the ratio of reflection to incident light. For example, a first conductive film 751 can serve as the reflective film (see FIG. 2A).

The reflective film includes an opening 751H. The second display element 550 has a region overlapping with the opening 751H. In the case of using the first conductive film 751 as the reflective film, the first conductive film 751 has the opening 751H.

The region of the second display element 550 overlapping with the opening 751H has a function of emitting light toward the opening 751H. Note that light emitted from the second display element 550 is extracted from a display surface of the display panel 700 through the opening 751H.

The pixel circuit 730(i,j) of the display panel 700 includes a switching element, such as a switch SW1 or a switch SW2 (see FIG. 1C).

The display panel 700 includes the first display element 750, the second display element 550 having the region overlapping with the first display element 750, the first contact 704C electrically connected to the first display element 750, the second contact 504C electrically connected to the second display element 550, and the pixel circuit 730(i,j) electrically connected to the first contact 704C and the second contact 504C.

With the structure, the first and second display elements can be driven by the pixel circuit which can be formed in the same process and can be included in the functional layer. Thus, a novel display panel which is highly convenient or reliable can be provided.

The pixel circuit 730(i,j) of the display panel 700 also includes a transistor that can be used as a switch and can suppress off-state current more than a transistor including an amorphous silicon as a semiconductor (see FIG. 1C).

Since the pixel circuit 730(i,j) of the display panel 700 includes such a transistor capable of suppressing off-state current, the frequency of supplying a selection signal to the pixel circuit can be reduced while suppressing flickers with display. Thus, a novel display panel with reduced power consumption and which is highly convenient or reliable can be provided.

The first display element 750 of the display panel 700 includes a layer 753 containing a liquid crystal material, the first conductive film 751, and the second conductive film 752. The first conductive film 751 and the second conductive film 752 are provided to control the alignment of the liquid crystal material. Electrical connection with the first conductive film 751 is made at the first contact 704C.

The second display element 550 of the display panel 700 includes a third conductive film 551, a fourth conductive film 552 having a region overlapping with the third conductive film 551, and a layer 553 containing a light-emitting organic compound between the third conductive film 551 and the fourth conductive film 552. The third conductive film 551 is electrically connected to the second contact 504C and transmits light.

The display panel 700 includes a reflective liquid crystal element and an organic EL element which are respectively used as the first display element 750 and the second display element 550.

Owing to the structure, in a bright place, external light and the reflective liquid crystal element are utilized to perform display, while in a dark place, light emitted from the organic EL element is utilized to perform display. Thus, a novel display panel highly convenient or reliable can be provided.

The second display element 550 preferably has a function of reflecting external light. For example, a material reflecting visible light can be used for the fourth conductive film 552.

The ratio of the total area of openings including the opening 751H in the reflective film to that of a portion of the reflective film other than the openings is more than or equal to 0.052 and less than or equal to 0.6. The area of one opening 751H is larger than or equal to 3 μm$^2$ and smaller than or equal to 25 μm$^2$. Note that in the case of using the first conductive film 751 as the reflective film, the ratio of the total area of openings including the opening 751H in the first conductive film 751 to that of a portion of the first conductive film 751 other than the openings is more than or equal to 0.052 and less than or equal to 0.6 (see FIG. 1B).

When the area of a pixel is assumed to be 1, the area of the reflective film can be more than or equal to 0.5 and less than or equal to 0.95 of the area of the pixel. Furthermore, the area of the opening 751H can be more than or equal to 0.052 and less than or equal to 0.3 of the area of the pixel.

Owing to the structure, in a bright place, external light and the reflective liquid crystal element are utilized to perform display, while in a dark place, light emitted from the organic EL element is utilized to perform display. In a dim place, external light and light emitted from the organic EL element are utilized to perform display. In addition, the size of the opening is small enough to perform display while avoiding irregular alignment of liquid crystal elements. Thus, a novel display panel highly convenient or reliable can be provided.

The pixel 702(i,j) of the display panel 700 includes an insulating film 501A covering the first conductive film 751 and an insulating film 501B between the first conductive film 751 and the pixel circuit 730(i,j).

The first conductive film 751 is provided between the insulating film 501A and the insulating film 501B and is embedded in the insulating film 501B.

Since the display panel 700 includes the first conductive film 751 embedded in the insulating film 501B, a step at the edge of the first conductive film can be minimized to reduce the possibility of alignment defects due to the step. Thus, a novel display panel highly convenient or reliable can be provided.

Note that the display panel 700 can include one or a plurality of pixels. For example, n pixels 702(i,j) can be arranged in a row direction and m pixels 702(i,j) can be arranged in a column direction which intersects with the row direction. Note that i is an integer greater than or equal to 1 and less than or equal to m, j is an integer greater than or equal to 1 and less than or equal to n, and each of in and n is an integer greater than or equal to 1.

In addition, the display panel 700 can include scan lines G1(i) and G2(i) electrically connected to pixels 702(i,1) to 702(i, n) arranged in the row direction (see FIG. 1C).

In addition, the display panel 700 can include a signal line S(j) electrically connected to pixels 702(1,j) to 702(m,j) arranged in the column direction.

In addition, the pixel 702(i,j) of the display panel 700 includes a coloring film CF1 having a region overlapping with the first display element 750, a light blocking film BM having an opening in a region overlapping with the first display element 750, and an insulating film 771 between the coloring film CF1 or the blocking film BM and the layer 753 containing a liquid crystal material (see FIG. 2A). Owing to the insulating film 771, unevenness due to the thickness of the coloring film CF1 can be avoided. Alternatively, impurities can be prevented from being diffused from the light blocking film BM, the coloring film CF1, or the like to the layer 753 containing a liquid crystal material The display panel 700 includes an alignment film AF2 between the substrate 770 and the layer 753 containing a liquid crystal material and an alignment film AF1 between the layer 753 containing a liquid crystal material and the insulating film 501A.

In the display panel 700, the layer 753 containing a liquid crystal material is surrounded by the substrate 770, the insulating film 501A, and a sealant 705. The sealant 705 has a function of bonding the substrate 770 and the insulating film 501A.

The display panel 700 includes a structure KB1 for the space between the substrate 770 and the insulating film 501A.

The display panel 700 includes an optical film 770P having a region overlapping with the pixel 702(*i,j*). In the display panel 700, the substrate 770 is provided between the optical film 770P and the layer 753 containing a liquid crystal material.

The display panel 700 includes the functional layer 520. The functional layer 520 includes the insulating film 501A, the insulating film 501B, an insulating film 501C, an insulating film 521B, an insulating film 521A, and an insulating film 528.

The insulating film 501B and the insulating film 501C each have an opening where the first contact 704C is provided. Although the insulating film 501C is stacked over the insulating film 501B in this embodiment, the insulating film 501C may be omitted.

The insulating film 521B has a region overlapping with the insulating film 501C.

The insulating film 521A lies between the insulating film 501C and the insulating film 521B.

The insulating film 521A has an opening where the second contact 504C is provided.

The insulating film 528 has an opening where the second display element 550 is provided.

In the display panel 700, a coloring film CF2 lies between the second display element 550 and the opening 751H in the reflective film.

The display panel 700 includes a substrate 570 having a region overlapping with the functional layer 520, and a bonding layer 505 bonding the functional layer 520 and the substrate 570.

In the display panel 700, the second display element 550 lies between the functional layer 520 and the substrate 570.

The display panel 700 includes a structure KB2 between the functional layer 520 and the substrate 570 to provide a space therebetween.

The display panel 700 includes a driver circuit GD. The driver circuit GD includes the transistor MD, for example (see FIG. 1A and FIG. 2A). The driver circuit GD has a function of supplying a selection signal to the scan line G1(*i*) or the scan line G2(*i*), for example.

The display panel 700 includes a wiring 511 and a terminal 519 which are electrically connected to the pixel circuit 730(ij). The display panel 700 can include a wiring ANO, a wiring VCOM1, and a wiring VCOM2 (see FIG. 1C and FIG. 2A).

Note that a flexible printed circuit board FPC1 can be electrically connected to the terminal 519 using a conductive material film ACF1. For example, the display panel 700 can be electrically connected to a driver circuit SD using the conductive material film ACF1.

Figure 4A:
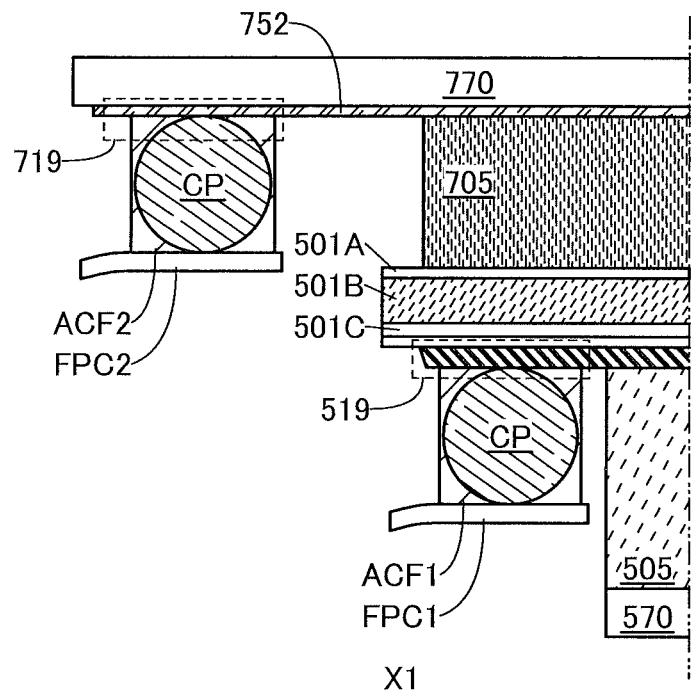
FIGS. 4A and 4B are cross-sectional views illustrating the structure of a terminal of a display panel according to one embodiment of the present invention.

The display panel 700 can include a terminal 719 (see FIG. 4A). The terminal 719 is electrically connected to the second conductive film 752, for example. Note that a flexible printed circuit board FPC2 can be electrically connected to the terminal 719 using a conductive material film ACF2. Note that a material of the terminal 519 can be used for the terminal 719 and a material of the conductive material film ACF1 can be used for the conductive material film ACF2.

Figure 4B:
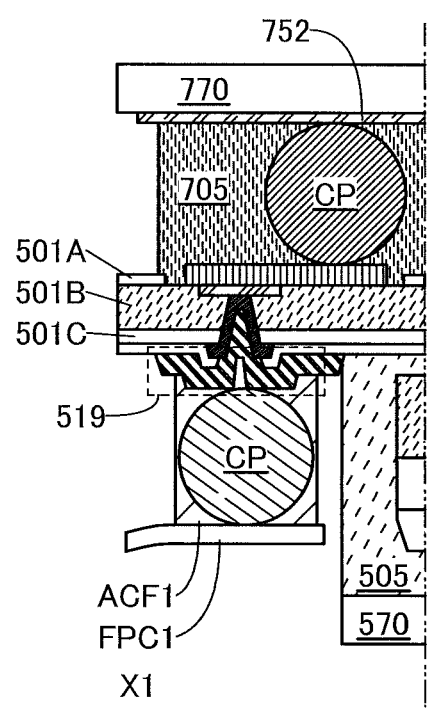
Figure 5:
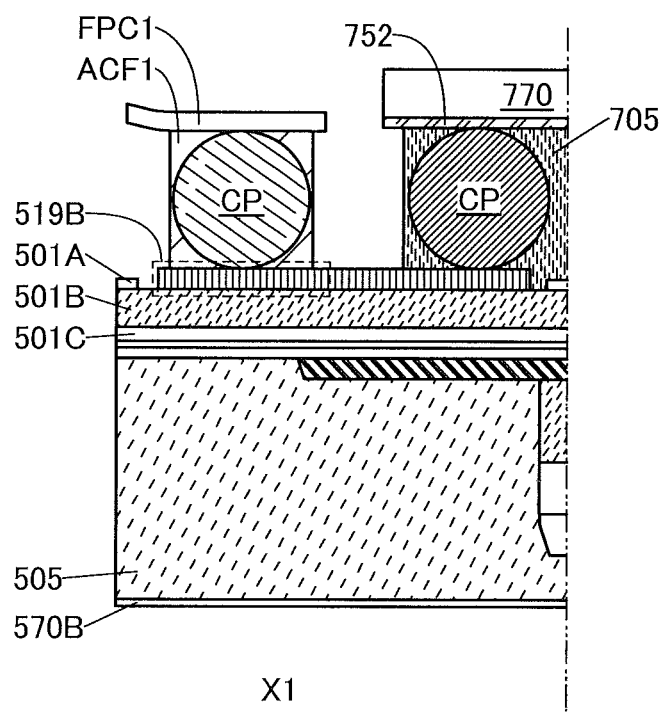
FIG. 5 is a cross-sectional view illustrating the structure of a terminal of a display panel according to one embodiment of the present invention.

The display panel 700 can include a conductive member electrically connecting the second conductive film 752 and the terminal 519 (see FIG. 4B or FIG. 5). For example, a conductive particle can be used as the conductive member.

Note that the driver circuit SD supplies an image signal in accordance with image information.

Components of the display panel 700 will be described below. Note that the components cannot be clearly distinguished and one unit serves as another unit or include part of another unit in some cases.

For example, in the case where a conductive film reflecting visible light is used as the first conductive film 751, the first conductive film 751 can be used as a reflective film: the first conductive film 751 serves as the reflective film, and the reflective film serves as the first conductive film 751.

<Structure>

The display panel 700 includes the substrate 570, the substrate 770, the wiring 511, and the terminal 519.

The display panel 700 includes the sealant 705, the bonding layer 505, the structure KB1, and the structure KB2.

The display panel 700 includes the pixel 702(*i,j*), the first display element 750, and the second display element 550.

The display panel 700 includes the first conductive film 751, the second conductive film 752, the layer 753 containing a liquid crystal material, the opening 751H, and the reflective film.

The display panel 700 includes the third conductive film 551, the fourth conductive film 552, and the layer 553 containing a light-emitting organic compound.

The display panel 700 includes the functional layer 520, the pixel circuit 730(*i,j*), the first contact 704C, and the second contact 504C.

The display panel 700 includes the switching element, the transistor M, the transistor MD, the insulating film 501A, the insulating film 501B, the insulating film 501C, the insulating film 521A, the insulating film 521B, and the insulating film 528.

The display panel 700 includes the coloring film CF1, the coloring film CF2, the light-blocking film BM, the insulating film 771, the alignment film AF1, the alignment film AF2, and the optical film 770P.

The display panel 700 includes the driver circuit GD and the driver circuit SD.

<<Substrate 570>>

The substrate 570 can be formed using a material having heat resistance high enough to withstand heat treatment in the manufacturing process.

For example, a large-sized glass substrate having any of the following sizes can be used as the substrate 570: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570, an organic material, an inorganic material, a composite material of an organic material and an inorganic material, or the like can be used. For example, an inorganic material such as glass, ceramic, or a metal can be used for the substrate 570.

Specifically, non-alkali glass, soda-lime glass, potash glass, crystal glass, quartz, sapphire, or the like can be used for the substrate 570. Specifically, a material containing an inorganic oxide, an inorganic nitride, an inorganic oxynitride, or the like can be used for the substrate 570. For example, a material containing silicon oxide, silicon nitride, silicon oxynitride, aluminum oxide, or the like can be used for the substrate 570. Stainless steel, aluminum, or the like can be used for the substrate 570.

For example, a single crystal semiconductor substrate or a polycrystalline semiconductor substrate of silicon or silicon carbide, a compound semiconductor substrate of silicon germanium, or an SOI substrate can be used as the substrate 570. Thus, a semiconductor element can be formed over the substrate 570.

For example, a composite material, such as a resin film to which a metal plate, a thin glass plate, or an inorganic film is bonded can be used for the substrate 570. For example, a composite material formed by dispersing a fibrous or particulate metal, glass, inorganic material, or the like into a resin film can be used for the substrate 570. For example, a composite material formed by dispersing a fibrous or particulate resin, organic material, or the like into an inorganic material can be used for the substrate 570.

A single-layer material or a stacked-layer material in which a plurality of layers are stacked can be used for the substrate 570. For example, a stacked-layer material in which a base, an insulating film that prevents diffusion of impurities contained in the base, and the like are stacked can be used for the substrate 570. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 570. Alternatively, a stacked-layer material in which a resin and a film for preventing diffusion of impurities that penetrate the resin, such as a silicon oxide film, a silicon nitride film, and a silicon oxynitride film are stacked can be used for the substrate 570.

Specifically, a material including polyester, polyolefin, polyamide (e.g., nylon or aramid), polyimide, polycarbonate, an acrylic resin, a urethane resin, an epoxy resin, a resin having a siloxane bond, such as a silicone resin, or the like can be used for the substrate 570. Alternatively, a film, a plate, a stacked body, or the like which contains any one or more of the resins can be used for the substrate 570.

Specifically, polyethylene terephthalate (PET), polyethylene naphthalate (PEN), polyethersulfone (PES), acrylic, or the like can be used for the substrate 570.

Alternatively, paper, wood, or the like can be used for the substrate 570.

For example, a flexible substrate can be used as the substrate 570.

Note that a transistor, a capacitor, or the like can be directly formed on the substrate. Alternatively, a transistor, a capacitor, or the like can be formed over a substrate for use in manufacturing processes having heat resistance and can be transferred to another substrate, in which case heat treatment temperature in the process for fabricating the substrate 570 included in the display panel of one embodiment of the present invention can be reduced, for example. Thus, a transistor, a capacitor, or the like can be formed over a flexible substrate.

<<Substrate 770>>

A light-transmitting material can be used for the substrate 770. For example, a material that can be used for the substrate 570 can be used for the substrate 770.

<<Wiring 511 and Terminal 519>>

A conductive material can be used for the wiring 511 or the terminal 519.

For example, an inorganic conductive material, an organic conductive material, or the like can be used for the wiring 511 or the terminal 519.

Specifically, the wiring 511 or the terminal 519 can be formed of a metal, conductive ceramic, or the like. For example, a metal element selected from aluminum, gold, platinum, silver, copper, chromium, tantalum, titanium, molybdenum, tungsten, nickel, iron, cobalt, palladium, and manganese can be used for the wiring 511 or the terminal 519. Alternatively, an alloy including any of the above-described metal elements, or the like can be used for wiring 511 or the terminal 519. In particular, an alloy of copper and manganese is preferably used in microfabrication using wet etching.

Specifically, the following structures can be used for the wiring 511 or the terminal 519: a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like.

For example, a conductive oxide, such as indium oxide, indium tin oxide, indium zinc oxide, zinc oxide, or zinc oxide to which gallium is added, can be used for the wiring 511 or the terminal 519.

Specifically, a film containing graphene or graphite can be used for the wiring 511 or the terminal 519.

For example, a film containing graphene formed by reducing a film containing graphene oxide can be used. Specifically, the reduction can be performed by applying heat, using a reducing agent, or the like.

A conductive high molecule compound can be used for the wiring 511 or the terminal 519.

<<First Contact 704C and Second Contact 504C>>

The first contact 704C or the second contact 504C can be formed using a conductive material. For example, the materials of the wiring 511 or the terminal 519 can be used.

<<Bonding Layer 505 and Sealant 705>>

An inorganic material, an organic material, a composite material of an inorganic material and an organic material, or the like can be used for the bonding layer 505 or the sealant 705.

For example, an organic material, such as a resin having thermal fusibility or a curable resin, can be used for the bonding layer 505 or the sealant 705.

For example, an organic material, such as a reactive curable adhesive, a light curable adhesive, a thermosetting adhesive, and/or an anaerobic adhesive, can be used for the bonding layer 505 or the sealant 705.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the bonding layer 505 or the sealant 705.

<<Structures KB1 and KB2>>

The structures KB1 and KB2 can be formed using an organic material, an inorganic material, a composite material of an organic material and an inorganic material, or the like. Accordingly, a predetermined space can be provided between components between which the structure KB1 or KB2 is provided.

Specifically, for structures KB1 and KB2, polyester, polyolefin, polyamide, polyimide, polycarbonate, polysiloxane, an acrylic resin, or the like, or a composite material of a plurality of kinds of resins selected from these can be used. A photosensitive material can be used.

<<Pixel 702(i,j)>>

The pixel 702(i,j) can include the first display element 750, the second display element 550, and the functional layer 520.

The pixel 702(i,j) can include the coloring film CF1, the light-blocking film BM, the insulating film 771, the alignment film AF1, the alignment film AF2, and the coloring film CF2.

<<First display element 750>>

For example, a display element having a function of controlling transmission or reflection of light can be used as the first display element 750. For example, a combined structure of a polarizing plate and a liquid crystal element or a MEMS shutter display element can be used. The use of a reflective display element can reduce power consumption of a display panel. Specifically, a reflective liquid crystal display element can be used as the first display element 750.

Specifically, a liquid crystal element that can be driven by any of the following driving methods can be used: an in-plane switching (IPS) mode, a twisted nematic (TN) mode, a fringe field switching (FFS) mode, an axially symmetric aligned micro-cell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, or antiferroelectric liquid crystal can be used. These liquid crystal materials exhibit a cholesteric phase, a smectic phase, a cubic phase, a chiral nematic phase, an isotropic phase, or the like depending on conditions. Alternatively, a liquid crystal material which exhibits a blue phase can be used.

For example, the liquid crystal element 750 can include the layer 753 containing a liquid crystal material, the first conductive film 751, and the second conductive film 752. The first conductive film 751 and the second conductive film 752 are disposed to apply an electric field for controlling the alignment of the liquid crystal material.

The first conductive film 751 or the second conductive film 752 can be formed using a conductive material.

For example, the material of the wiring 511 can be used for the first conductive film 751 or the second conductive film 752.

<<Reflective Film>>

The reflective film can be formed of a material reflecting light which passes through the layer 753 containing a liquid crystal material, in which case the first display element 750 can be a reflective liquid crystal element.

Alternatively, a material or the like with an uneven surface can be used for the reflective film, in which case incident light is reflected in various directions to display white.

Note that the first conductive film 751 formed using a material reflecting visible light can be used as the reflective film.

Other structures may be used as the reflective film without limitation to the first conductive film 751. For example, a reflective film containing a material reflecting visible light may be provided between the layer 753 containing a liquid crystal material and the first conductive film 751. Alternatively, the first conductive film 751 formed using a light-transmitting and conductive material may be provided between a reflective film containing a material reflecting visible light and the layer 753 containing a liquid crystal material.

Note that the second conductive film 752 can be formed using the conductive material transmitting visible light.

For example, a conductive oxide or a conductive oxide containing indium can be used for the second conductive film 752. Alternatively, a metal film thin enough to transmit light can be used as the second conductive film 752.

Specifically, indium oxide, indium tin oxide, indium zinc oxide, zinc oxide, zinc oxide to which gallium is added, or the like can be used for the second conductive film 752.

<<Opening 751H>>

The ratio of the total area of the opening 751H in the reflective film in one pixel to that of a portion of the reflective film other than the opening is preferably more than or equal to 0.052 and less than or equal to 0.6. If the ratio of the total area of the opening 751H is too large, display performed using the first display element 750 is dark. If the ratio of the total area of the opening 751H is too small, display performed using the second display element 550 is dark.

In the case where the first conductive film 751 is used as the reflective film, the area of one opening 751H is larger than or equal to 3 $\mu m^2$ and smaller than or equal to 25 $\mu m^2$. If the area of the opening 751H in the first conductive film 751 is too large, electric field is not uniformly applied to the layer 753 containing a liquid crystal material, which lowers the display performance of the first display element 750. If the area of the opening 751H in the first conductive film 751 is too small, light emitted from the second display element 550 is not efficiently extracted for display.

The opening 751H may have a polygonal shape, a quadrangular shape, an elliptical shape, a circular shape, a cross shape, a stripe shape, a slit-like shape, or a checkered pattern, for example (see FIG. 1B and FIG. 6A). The opening 751H may be close to the next pixel (see FIG. 6B). The opening 751H is provided close to preferably a pixel emitting light of the same color, in which case an undesired phenomenon in which light emitted from the second display element 550 enters a coloring film of the adjacent pixel, which is called cross talk, can be suppressed.

Note that the opening 751H is preferably not provided in a region overlapping with a seam between the coloring films CF1 transmitting different colors, in which case light emitted from the second display element 550 is less likely to reach a coloring film of the adjacent pixel.

As a result, a display panel with high color reproducibility can be produced.

<<Second Display Element 550>>

A light-emitting element, for example, can be used as the second display element 550. Specifically, an organic electroluminescence element, an inorganic electroluminescence element, a light-emitting diode, or the like can be used for the second display element 550.

For example, a stack formed to emit white light can be used as the layer 553 containing a light-emitting organic material. Specifically, a stack of a layer containing a light-emitting organic material containing a fluorescent material that emits blue light, a layer containing a material that is other than a fluorescent material and that emits green light and/or red light, or a layer containing a material that is other than a fluorescent material and that emits yellow light can be used as the layer 553 containing a light-emitting organic material.

For example, a material used for the wiring 511 can be used for the third conductive film 551 or the fourth conductive film 552.

For example, a conductive material that transmits visible light can be used for the third conductive film 551.

For example, a conductive material that transmits visible light can be used for the fourth conductive film 552.

Specifically, conductive oxide, indium-containing conductive oxide, indium oxide, indium tin oxide, indium zinc oxide, zinc oxide, zinc oxide to which gallium is added, or the like can be used for the third conductive film 551.

Alternatively, a metal film that is thin enough to transmit light can be used as the third conductive film 551.

<<Functional Layer 520>>

The functional layer 520 includes the pixel circuit 730(i, j), the first contact 704C, and the second contact 504C. The functional layer 520 includes the insulating film 501A, the insulating film 501B, the insulating film 501C, the insulating film 521A, the insulating film 521B, or the insulating film 528.

<<Pixel Circuit 730(i,j)>>

A circuit electrically connected to the scan line G1(i), the scan line G2(j), the signal line S(j), the wiring ANO, the wiring VCOM1, and the wiring VCOM2 can be used as the pixel circuit 730(i,j) (see FIG. 1C).

Specifically, the pixel circuit 730(i,j) can include the switch SW1, the capacitor C1, the switch SW2, the capacitor C2, and the transistor M.

The switch SW1 includes a control electrode and a first electrode which are electrically connected to the scan line G1(i) and the signal line S(j), respectively. Note that the switch SW1 may be a transistor.

The capacitor C1 includes a first electrode and a second electrode which are electrically connected to a second electrode of the switch SW1 and the wiring VCOM1, respectively.

Note that the first conductive film 751 and the second conductive film 752 of the first display element 750 can be electrically connected to the second electrode of the switch SW1 and the wiring VCOM1, respectively.

The switch SW2 includes a control electrode and a first electrode which are electrically connected to the scan line G2(i) and the signal line S(j), respectively. Note that the switch SW2 may be a transistor.

The transistor M includes a gate electrode and a first electrode which are electrically connected to a second electrode of the switch SW2 and the wiring ANO, respectively.

The capacitor C2 includes a first electrode and a second electrode which are electrically connected to the second electrode of the switch SW2 and a second electrode of the transistor M, respectively.

Note that the third conductive film 551 and the fourth conductive film 552 of the second display element 550 can be electrically connected to the second electrode of the transistor M and the wiring VCOM2, respectively.

<<Transistor M>>

The transistor M includes the semiconductor film 508 and the conductive film 504 which includes a region overlapping with the semiconductor film 508 (see FIG. 2B). The transistor M includes the conductive film 512A, the conductive film 512B, and the insulating film 506 between the semiconductor film 508 and the conductive film 504.

Note that the conductive film 504 serves as a gate electrode, and the insulating film 506 serves as a gate insulating film. The conductive film 512A has one of a function as a source electrode and a function as a drain electrode, and the conductive film 512B has the other.

Note that the functional layer 520 can include the insulating film 516 and the insulating film 518 which cover the transistor M, thereby suppressing impurity diffusion to the transistor M.

As the transistor M, a bottom-gate transistor, a top-gate transistor, or the like can be used.

For example, a transistor including a semiconductor containing an element of Group 4 can be used. Specifically, a semiconductor containing silicon can be used for a semiconductor film. For example, single crystal silicon, polysilicon, microcrystalline silicon, amorphous silicon, or the like can be used for the semiconductor films of the transistors.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit in the transistor that uses an oxide semiconductor for the semiconductor film can hold an image signal for a longer time than a pixel circuit in a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Switches SW1 and SW2>>

A transistor can serve as the switches SW1 and SW2.

For example, a transistor which can be fabricated in the same process as the transistor M can be used as the switches SW1 and SW2.

<<Insulating Film 501A>>

The insulating film 501A can be formed using an inorganic oxide film, an inorganic nitride film, an inorganic oxynitride film, or a material stacking any of these films. Specifically, the insulating film 501A can be formed using silicon oxide, silicon nitride, silicon oxynitride, aluminum oxide, or a material stacking a plurality of them.

Specifically, a film containing a stacked-layer material of a 600-nm-thick silicon oxynitride film and a 200-nm-thick silicon nitride film can be used as the insulating film 501A.

Specifically, a film containing a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the insulating film 501A.

Alternatively, the insulating film 501A can be formed using a material containing resin, such as polyimide.

An insulating film is formed over a substrate for use in manufacturing processes and is separated from the substrate to be used as the insulating film 501A. In that case, the thickness of the insulating film 501A can be 5 µm or less, preferably 1.5 µm or less, further preferably 1 µm or less.

<<Insulating Film 501B and Insulating Film 501C>>

For example, an insulating inorganic material, an insulating organic material, or an insulating composite material containing an inorganic material and an organic material can be used for the insulating film 501B and the insulating film 501C.

Specifically, an inorganic oxide film, an inorganic nitride film, an inorganic oxynitride film, or a material stacking any of these films can be used for the insulating film 501B and the insulating film 501C. For example, a silicon oxide film, a silicon nitride film, an aluminum oxide film, a silicon oxynitride film, or a material stacking any of these films can be used for the insulating film 501B and the insulating film 501C.

For example, the material which can be used for the insulating film 501A can be used for the insulating film 501C.

Specifically, for the insulating film 501B and the insulating film 501C, polyester, polyolefin, polyamide, polyimide, polycarbonate, polysiloxane, an acrylic resin, and the like, or a stacked material of or a composite material of a plurality of kinds of resins selected from these can be used. Alternatively, a photosensitive material can be used.

<<Insulating Films 521A, 521B, and 528>>

The materials which can be used for the insulating film 501B or the insulating film 501C can be used for the insulating film 521A, 521B, or 528.

Thus, steps due to components overlapping with the insulating film 521A, for example, can be covered so that a flat surface can be formed. The insulating film 521B provided between a plurality of wirings can prevent short circuit of the plurality of wirings. The insulating film 528 having an opening which overlaps with the third conductive film 551 can prevent short circuit between the third conductive film 551 and the fourth conductive film which can occur at the edges of the third conductive film 551.

<<Coloring Films CF1 and CF2>>

The coloring film CF1 can be formed using a material transmitting light of a predetermined color, and can thus be used as a color filter or the like.

For example, the coloring film CF1 can be formed using a material transmitting light of blue, green, red, yellow, or white.

The coloring film CF2 can be formed using, for example, the material of the coloring film CF1, specifically, a material transmitting light passing through the coloring film CF1. In that case, part of light emitted from the second display element 550 that passes through the coloring film CF2, the opening 751H, and the coloring film CF1 can be extracted to the outside of the display panel. Note that a material having a function of converting the emitted light to a predetermined color light can be used for the color film CF2. Specifically, quantum dots can be used for the color film CF2. Thus, display with high color purity can be achieved.

<<Light-Blocking Film BM>>

A material that prevents light transmission can be used for the light-blocking film BM, in which case the light-blocking film BM serves as a black matrix, for example.

<<Insulating Film 771>>

The insulating film 771 can be formed of polyimide, epoxy resin, acrylic resin, or the like.

<<Alignment Films AF1 and AF2>>

The alignment films AF1 and AF2 can be formed of a material containing polyimide or the like, such as a material formed to have a predetermined alignment by a rubbing process or an optical alignment process.

<<Optical Film 770P>>

For example, a polarizing plate, a retardation plate, a diffusing film, an anti-reflective film, a condensing film, or the like can be used as the optical film 770P. Alternatively, a polarizing plate containing a dichromatic pigment can be used for the optical film 770P.

Alternatively, an antistatic film preventing the attachment of a foreign substance, a water repellent film suppressing the attachment of stain, a hard coat film suppressing a scratch in use, or the like can be used for the optical film 770P.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed at the same step as the transistor M can be used.

As the transistor MD, a transistor different from the transistor M can be used, such as a transistor including the conductive film 524. The semiconductor film 508 is provided between the conductive films 524 and 504. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that the transistor MD can have the same structure as the transistor M.

<<Driver Circuit SD>>

For example, an integrated circuit can be used in the driver circuit SD. Specifically, an integrated circuit formed over a silicon substrate can be used.

For example, a chip on glass (COG) method can be used to mount the driver circuit SD on a pad provided over the insulating film 501C. Specifically, a conductive material film can be used to mount the integrated circuit on the pad. Note that the pad is electrically connected to the pixel circuit 730(0.

Structure Example 2 of Display Panel

Another structure of the display panel of one embodiment of the present invention will be described with reference to FIGS. 3A and 3B.

FIG. 3A is a cross-sectional view illustrating cross-sectional structures of the display panel 700B of one embodiment of the present invention taken along the section lines X1-X2, X3-X4, and X5-X6 in FIG. 1A. FIG. 3B is a cross-sectional view illustrating the transistor MB or the transistor MDB in FIG. 3A.

Structures different from those in the display device described in Structure example 1 will be described in detail below, and the above description is referred to for the other similar structures.

Specifically, the display panel 700B in FIGS. 3A and 3B is different from the display panel 700 in FIGS. 2A to 2C in that the coloring film CF2 is omitted, that the second display element 550B emitting light of blue, green, red, or the like, that top gate transistors MB and MDB are provided, that a terminal 519B electrically connected to the wiring 511 using a through electrode is provided, and that an insulating film 570B is provided instead of the substrate 570.

<<Second Display Element 550B>>

In one pixel (also referred to as sub-pixel), the second display element 550B that emits light of a color different from that emitted from the second display element provided in another sub-pixel is used. For example, the second display element 550B that emits blue light is used in one pixel, and the second display element that emits green light or red light is used in another pixel.

Specifically, an organic EL element including a layer 553B containing a light-emitting organic compound that emits blue light is used in the second display element 550B. An organic EL element including a layer containing a light-emitting organic compound that emits green light or red light is used in another pixel.

Note that an evaporation method, an ink-jet method, or a printing method using a shadow mask can be employed to form the layer containing a light-emitting organic compound. In that case, in one pixel, the layer containing a light-emitting organic compound that emits light of a color different from that emitted from the second display element provided in another pixel can be used.

Note that the second display element 550B may have a concave shape, and emitted light may be gathered into the opening 751H. Thus, a region having a light-emitting function of the second display element 550B can be widened to a region not overlapping with the opening 751H. For example, the area of the region not overlapping with the opening 751H can be 20% or more of the area of a region overlapping with the opening 751H. Accordingly, the density of current flowing through the second display element 550B can be reduced, and for example, heat generation can be suppressed. Furthermore, reliability can be improved. Furthermore, the area of the opening 751H can be reduced.

<<Transistor MB>>

The transistor MB includes the conductive film 504 having a region overlapping with an insulating film 501C and the semiconductor film 508 having a region provided between the insulating film 501C and the conductive film 504. Note that the conductive film 504 functions as a gate electrode (see FIG. 3B).

The semiconductor film 508 is consisted of a first region 508A, a second region 508B, and a third region 508C. The first region 508A and the second region 508B do not overlap with the conductive film 504. The third region 508C is positioned between the first region 508A and the second region 508B and overlaps with the conductive film 504.

The transistor MB includes an insulating film 506 between the third region 508C and the conductive film 504. Note that the insulating film 506 functions as a gate insulating film.

The first region 508A and the second region 508B have a lower resistance than the third region 508C, and function as a source region and a drain region.

Note that, for example, a method for controlling the resistivity of the oxide semiconductor film to be described later can be used as a method for forming the first region 508A and the second region 508B in the semiconductor film 508. Specifically, plasma treatment using a gas containing a rare gas can be used. For example, when the conductive film 504 is used as a mask, the shape of part of the third region 508C can be the same as the shape of an end portion of the conductive film 704.

The transistor MB includes the conductive films 512A and 512B which are in contact with the first region 508A and the second region 508B, respectively. The conductive film 512A serves as one of the source electrode and drain electrode, and the conductive film 512B serves as the other thereof.

The transistor which can be formed in the same process as the transistor MB can be used as the transistor MDB or the switch SW1.

<<Terminal 519B>>

A conductive film formed in the opening in the insulating films 501A, 501B, and 501C can be used for the through electrode. Thus, the terminal 519B can be provided on the side of the insulating film 501A, 501B, or 501C opposite to the side where the pixel circuit is provided. That is, the insulating film 501A, 501B, and 501C can be provided between the pixel circuit and the terminal 519B.

<<Insulating Film 570B>>

As the insulating film 570B, an insulating film having a thickness of more than or equal to 50 nm and less than 10 μm, preferably more than or equal to 100 nm and less than 5 μm, can be used, for example. Specifically, such an insulating film may be formed on a substrate for use in manufacturing processes and be transferred therefrom to a different substrate. The thickness of the display panel 700B can thus be small.

Specifically, a film containing a stacked-layer material of a 600-nm-thick silicon oxynitride film and a 200-nm-thick silicon nitride film can be used as the insulating film 570B.

Specifically, a film containing a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order can be used as the insulating film 570B.

Structure Example 3 of Display Panel

Another structure of a display panel of one embodiment of the present invention will be described with reference to FIG. 7.

Figure 7:
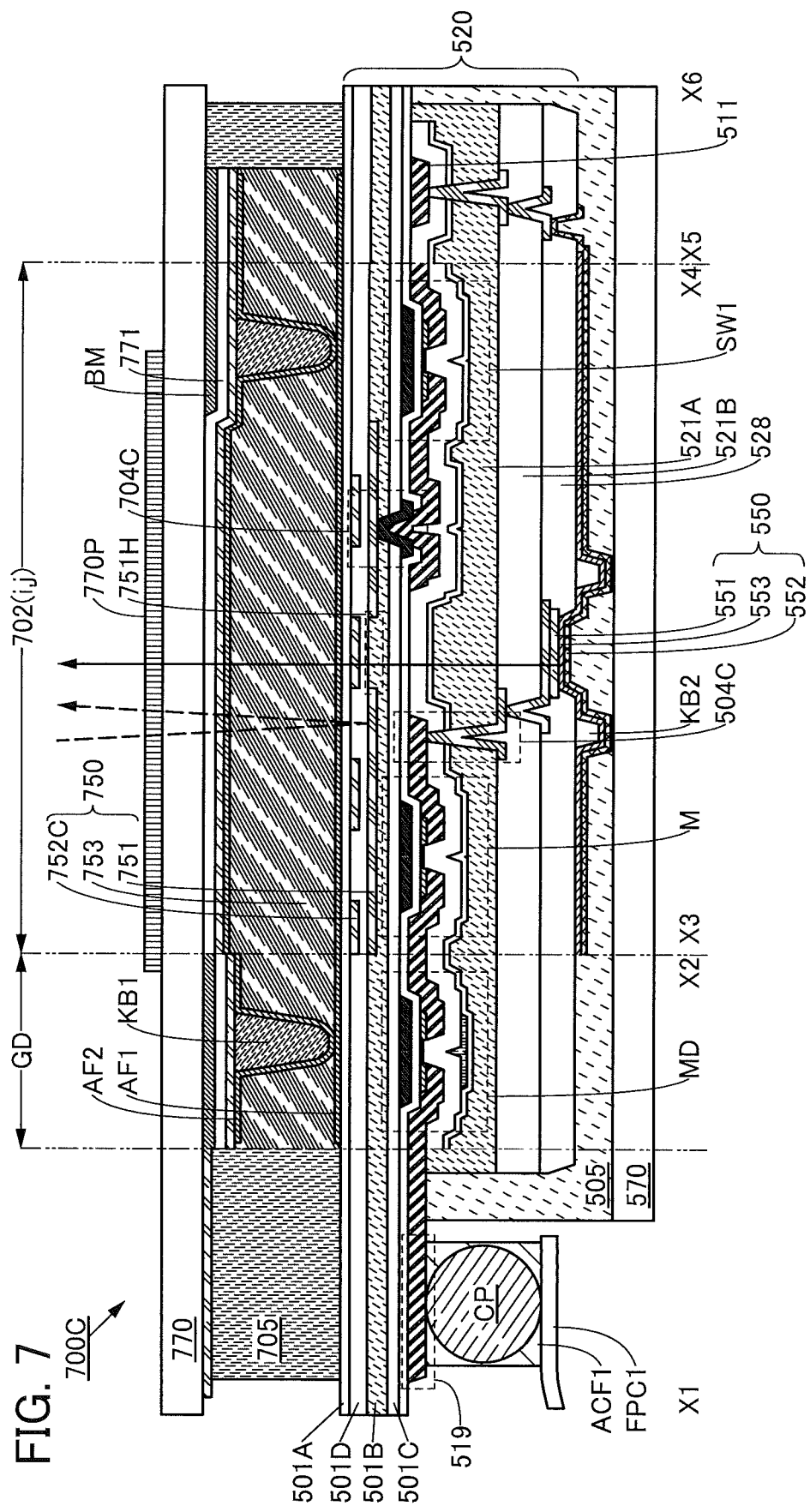
FIG. 7 is a cross-sectional view illustrating the structure of a display panel according to one embodiment of the present invention.

FIG. 7 is a cross-sectional view illustrating cross-sectional structures of a display panel 700C of one embodiment of the present invention taken along the section lines X1-X2, X3-X4, and X5-X6 in FIG. 1.

Structures different from those in the display device described in Structure example 1 will be described in detail below, and the above description is referred to for the other similar structures.

Specifically, the display panel in FIG. 7 is different from that in FIGS. 2A to 2C in that the coloring films CF1 and CF2 are omitted, the second display element 550B emits light of blue, green, red, or the like, that a fourth insulating film 501D is provided between the insulating film 501A and the insulating film 501B, that a second conductive film 752C instead of the second conductive film 752 is provided between the insulating film 501A and the fourth insulating film 501D, and that the second conductive film 752C has a comb-like shape.

With such a structure, the first conductive film 751 and the second conductive film 752C can apply a horizontal electric field in the thickness direction of the layer 753 containing a liquid crystal material; thus, the first display element 750 can be driven in an FFS mode.

<<Fourth Insulating Film 501D>>

The fourth insulating film 501D can be formed using any of the materials which can be used for the insulating film 501A and the insulating film 501B.

<Method for Controlling Resistivity of Oxide Semiconductor Film>

The method for controlling the resistivity of an oxide semiconductor film will be described.

An oxide semiconductor film with a certain resistivity can be used for the semiconductor film 508, the conductive film 524, the first region 508A, or the second region 508B.

For example, a method for controlling the concentration of impurities such as hydrogen and water contained in the oxide semiconductor and/or the oxygen vacancies in the film can be used as the method for controlling the resistivity of an oxide semiconductor film.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1\times10^{22}$ atoms/cm$^3$ is formed in contact with the oxide semiconductor film, in that case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8\times10^{19}$ atoms/cm$^3$, preferably greater than or equal to $1\times10^{20}$ atoms/cm$^3$, more preferably greater than or equal to $5\times10^{20}$ atoms/cm$^3$ can be suitably used for the conductive film 524, the first region 508A, or the second region 508B.

On the other hand, an oxide semiconductor with a high resistivity can be used for a semiconductor film where a channel of a transistor is formed.

For example, an insulating film containing oxygen, in other words, an insulating film capable of releasing oxygen, is formed in contact with an oxide semiconductor film, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8\times10^{11}$/cm$^3$, preferably lower than $1\times10^{11}$/cm$^3$, further preferably lower than $1\times10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1\times10^6$ μm and a channel length L of 10 μm, the off-state current can be lower than or equal to the measurement limit of a semiconductor parameter analyzer, that is, lower than or equal to $1\times10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor has a hydrogen concentration which is measured by secondary ion mass spectrometry (SIMS) of lower than or equal to $2\times10^{20}$ atoms/cm$^3$, preferably lower than or equal to $5\times10^{19}$ atoms/cm$^3$, more preferably lower than or equal to $1\times10^{19}$ atoms/cm$^3$, more preferably lower than $5\times10^{18}$ atoms/cm$^3$, more preferably lower than or equal to $1\times10^{18}$ atoms/cm$^3$, more preferably lower than or equal to $5\times10^{17}$ atoms/cm$^3$, more preferably lower than or equal to $1\times10^{16}$ atoms/cm$^3$ can be favorably used for a semiconductor film where a channel of a transistor is formed.

An oxide semiconductor film that has a higher hydrogen concentration and/or a larger number of oxygen vacancies and that has a lower resistivity than the semiconductor film 508 is used as the conductive film 524.

The hydrogen concentration in the conductive film 524 is twice or more, preferably ten times or more that in the semiconductor film 508.

The resistivity of the conductive film 524 is greater than or equal to $1\times10^{-8}$ times and less than $1\times10^{-1}$ times that of the semiconductor film 508.

Specifically, the resistivity of the conductive film 524 is higher than or equal to $1\times10^{-3}$ Ωcm and lower than $1\times10^4$Ωcm, preferably higher than or equal to $1\times10^{-3}$ Ωcm and lower than $1\times10^{-1}$ Ωcm.

This embodiment can be combined with any of the other embodiments in this specification as appropriate.

Embodiment 2

In this embodiment, the structure of a display panel of one embodiment of the present invention will be described with reference to FIGS. 1A to 1C and FIGS. 8A and 8B.

FIGS. 1A and 1C illustrate the structure of a display panel of one embodiment of the present invention. FIGS. 1A and 1B are top views of a display panel 700D of one embodiment of the present invention and the pixel 702(i,j) in FIG. 1A, respectively.

FIGS. 8A to 8C illustrate the structure of the display panel of one embodiment of the present invention. FIG. 8A is a cross-sectional view of the display panel 700D taken along the section lines X1-X2, X3-X4, and X5-X6 in FIG. 1A. FIG. 8B is a cross-sectional view of the transistor M in FIG. 8A. FIG. 8C is a cross-sectional view of the transistor MD in FIG. 8A.

Structure Example 1 of Display Panel

The display panel 700D described in this embodiment includes the pixel 702(i,j) and a terminal 519D(1) (see FIG. 1A).

The pixel 702(i,j) includes the insulating film 501B, a first contact 591 in an opening provided in the insulating film 501B, the pixel circuit 730(i,j) electrically connected to the first contact 591, a second contact 592 electrically connected to the pixel circuit 730(i,j), the first display element 750 electrically connected to the first contact 591, and the second display element 550 electrically connected to the second contact 592 (see FIG. 1C and FIG. 8A).

The insulating film 501B includes a region lying between the first display element 750 and the second display element 550.

The first display element 750 includes a reflective film which reflects incident light and has the opening 751H. The first display element 750 is configured to control the intensity of the reflected light. Note that the first conductive film 751 can be used as the reflective film.

The region of the second display element 550 overlapping with the opening 751H has a function of emitting light toward the opening 751H.

The terminal 519D(1) is electrically connected to the pixel circuit 730(i,j) and has a surface at which contact with other component can be made. The surface at which contact with other component can be made faces the same direction as a surface of the reflective film which reflects external light used for performing display.

The pixel circuit 730(i,j) of the display panel 700D includes a switching element, such as the switch SW1 or SW2 (see FIG. 1C).

The display panel 700D according to one embodiment of the present invention includes the pixel 702(i,j) and the terminal 519D(i,j) electrically connected to the pixel. The pixel 702(i,j) includes the insulating film 501B, the first contact 591 in the opening provided in the insulating film 501B, the pixel circuit electrically connected to the first contact 591, the second contact 592 electrically connected to the pixel circuit 730(i,j), the first display element 750 electrically connected to the first contact 591, and the second display element 550 electrically connected to the second contact 592. The insulating film 501B includes the region lying between the first display element 750 and the second display element 550. The terminal 519D(i,j) includes the surface at which contact with other component can be made. The surface at which contact with other component can be made faces the same direction as a surface of the reflective film which reflects external light used for performing display.

With the structure, the first display element and the second display element between which the second insulating film is provided can be driven using the pixel circuit connected to the terminal, for example. Thus, a novel display panel which is highly convenient or reliable can be provided.

The pixel circuit 730(i,j) of the display panel 700D also includes a transistor that can be used as a switch and can suppress off-state current more than a transistor including an amorphous silicon as a semiconductor (see FIG. 1C).

Since the pixel circuit 730(i,j) of the display panel 700D includes such a transistor capable of suppressing off-state current, the frequency of supplying a selection signal to the pixel circuit can be reduced while suppressing flickers with display. Thus, a novel display panel with reduced power consumption and which is highly convenient or reliable can be provided.

The first display element 750 of the display panel 700D includes a layer 753 containing a liquid crystal material, the first conductive film 751, and the second conductive film 752. The first conductive film 751 and the second conductive film 752 are provided to control the alignment of the liquid crystal material. Electrical connection with the first conductive film 751 is made at the first contact 591 (see FIG. 8A).

The second display element 550D of the display panel 700 includes a third conductive film 551, a fourth conductive film 552 having a region overlapping with the third conductive film 551, and a layer 553 containing a light-emitting organic compound between the third conductive film 551 and the fourth conductive film 552. The third conductive film 551 is electrically connected to the second contact 592 and transmits light.

The display panel 700D includes a reflective liquid crystal element and an organic EL element which are respectively used as the first display element 750 and the second display element 550.

Owing to the structure, in a bright place, external light and the reflective liquid crystal element are utilized to perform display, while in a dark place, light emitted from the organic EL element is utilized to perform display. Thus, a novel display panel highly convenient or reliable can be provided. Thus, a novel display panel capable of performing display with high visibility, a novel display panel with reduced power consumption, or a novel display panel highly convenient or reliable can be provided.

The second display element 550 preferably has a function of reflecting external light. For example, a material reflecting visible light can be used for the fourth conductive film 552.

The ratio of the total area of one or a plurality of openings including the opening 751H in the reflective film to that of a portion of the reflective film other than the openings is more than or equal to 0.052 and less than or equal to 0.6. The area of one opening 751H is larger than or equal to 3 $\mu m^2$ and smaller than or equal to 25 $\mu m^2$. Note that in the case of using the first conductive film 751 as the reflective film, the ratio of the total area of openings including the opening 751H in the first conductive film 751 to that of a portion of the first conductive film 751 other than the openings is more than or equal to 0.052 and less than or equal to 0.6 (see FIG. 1B).

When the area of a pixel is assumed to be 1, the area of the reflective film can be more than or equal to 0.5 and less than or equal to 0.95 of the area of the pixel. Furthermore, the area of the opening 751H can be more than or equal to 0.052 and less than or equal to 0.3 of the area of the pixel.

Owing to the structure, irregular alignment of the liquid crystal material can be avoided. In addition, in a bright place, external light and the reflective liquid crystal element are utilized to perform display, while in a dark place, light emitted from the organic EL element is utilized to perform display. Thus, a novel display panel highly convenient or reliable can be provided.

The reflective film of the display panel 700D includes a region embedded in the insulating film 501B and a region not covered by the insulating film 501B. For example, in the case where the first conductive film 751 is used as the reflective film, a region embedded in the insulating film 501B is provided on the side surface of the first conductive film 751 and the surface thereof in contact with the first contact 591.

The terminal 519D(1) includes a region embedded in the insulating film 501B and a region not covered by the insulating film 501B.

Thus, a step at the edge of the first conductive film can be minimized to reduce the possibility of alignment defects due to the step. Thus, a novel display panel highly convenient or reliable can be provided.

Note that the display panel 700D can include one or a plurality of pixels. For example, n pixels 702($i,j$) can be arranged in a row direction and m pixels 702($i,j$) can be arranged in a column direction which intersects with the row direction. Note that i is an integer greater than or equal to 1 and less than or equal to m, j is an integer greater than or equal to 1 and less than or equal to n, and each of in and n is an integer greater than or equal to 1.

In addition, the display panel 700D can include scan lines G1($i$) and G2($i$) electrically connected to pixels 702($i$,1) to 702($i$, $n$) arranged in the row direction (see FIG. 1C).

In addition, the display panel 700D can include a signal line S(j) electrically connected to pixels 702(1,$j$) to 702($m,j$) arranged in the column direction.

In addition, the pixel 702($i,j$) of the display panel 700 includes a coloring film CF1 having a region overlapping with the first display element 750, a light blocking film BM having an opening in a region overlapping with the first display element 750, and an insulating film 771 between the coloring film CF1 or the blocking film BM and the layer 753 containing a liquid crystal material (see FIG. 8A). Owing to the insulating film 771, unevenness due to the thickness of the coloring film CF1 can be avoided. Alternatively, impurities can be prevented from being diffused from the light blocking film BM, the coloring film CF1, or the like to the layer 753 containing a liquid crystal material The display panel 700D includes an alignment film AF2 between the substrate 770 and the layer 753 containing a liquid crystal material and an alignment film AF1 between the layer 753 containing a liquid crystal material and the insulating film 501B.

In the display panel 700D, the layer 753 containing a liquid crystal material is surrounded by the substrate 770, the insulating film 501B, and a sealant 705. The sealant 705 has a function of bonding the substrate 770 and the insulating film 501B.

The display panel 700D includes a structure KB1 for the space between the substrate 770 and the insulating film 501B.

The display panel 700D includes an optical film 770P having a region overlapping with the pixel 702($i,j$). In the display panel 700D, the substrate 770 is provided between the optical film 770P and the layer 753 containing a liquid crystal material.

The display panel 700D includes the functional layer 520D. The functional layer 520D includes the insulating film 501B, the insulating film 501C, the insulating film 521A, the insulating film 521B, and the insulating film 528.

The insulating film 501B and the insulating film 501C each have an opening where the first contact 591 is provided and an opening where the third contact 593 is provided.

Although the insulating film 501C is stacked over the insulating film 501B in this embodiment, the insulating film 501C may be omitted.

The insulating film 521B has a region overlapping with the insulating film 501B.

The insulating film 521A lies between the insulating film 501B and the insulating film 521B.

The insulating film 521A has an opening where the second contact 592 is provided.

The insulating film 528 has an opening where the second display element 550 is provided.

In the display panel 700D, a coloring film CF2 lies between the second display element 550 and the opening 751H in the reflective film.

The display panel 700D includes a substrate 570 having a region overlapping with the functional layer 520D, and a bonding layer 505 bonding the functional layer 520D and the substrate 570.

In the display panel 700D, the second display element 550 lies between the functional layer 520D and the substrate 570.

The display panel 700D includes a structure KB2 between the functional layer 520D and the substrate 570 to provide a space therebetween.

The display panel 700D includes a driver circuit GD. The driver circuit GD includes the transistor MD, for example (see FIG. 1A and FIG. 8A). The driver circuit GD has a function of supplying a selection signal to the scan line G1($i$) or the scan line G2($i$), for example.

The display panel 700D includes a wiring 511 and a terminal 519D(1) which are electrically connected to the pixel circuit 730($i,j$). The display panel 700D can include a wiring ANO, a wiring VCOM1, and a wiring VCOM2 (see FIG. 1C and FIG. 8A).

Note that a flexible printed circuit board FPC1 can be electrically connected to the terminal 519D(1) using a conductive material film ACF1. For example, the display panel 700D can be electrically connected to a driver circuit SD using the conductive material film ACF1.

The display panel 700D can include the terminal 519D(2). The terminal 519D(2) is electrically connected to a terminal which can be formed in the same process for forming the pixel circuit 730($i,j$) or the terminal 519D(1). One surface of the terminal 519D(2) is contact with other component and faces the same direction as a surface of the reflective film which reflects external light used for performing display. Note that the terminal 519D(2) can be electrically connected to the second conductive film 752 using the conductive member CP, for example.

Note that the driver circuit SD supplies an image signal in accordance with image information.

Components of the display panel 700D will be described below. Note that the components cannot be clearly distinguished and one unit serves as another unit or include part of another unit in some cases.

For example, in the case where a conductive film reflecting visible light is used as the first conductive film 751, the first conductive film 751 can be used as a reflective film: the first conductive film 751 serves as the reflective film, and the reflective film serves as the first conductive film 751.

<Structure>

The display panel 700D includes the substrate 570, the substrate 770, the wiring 511, and the terminals 519D(1) and 519D(2) (see FIG. 8A).

The display panel 700D includes the sealant 705, the bonding layer 505, the structure KB1, and the structure KB2.

The display panel 700D includes the pixel 702(i,j), the first display element 750, and the second display element 550.

The display panel 700D includes the first conductive film 751, the second conductive film 752, the layer 753 containing a liquid crystal material, the opening 751H, and the reflective film.

The display panel 700D includes the third conductive film 551, the fourth conductive film 552, and the layer 553 containing a light-emitting organic compound.

The display panel 700D includes the functional layer 520D, the pixel circuit 730(i,j), the first contact 591, the second contact 592, or the third contact 593 (see FIG. 8A and FIG. 1C).

The display panel 700D includes the switching element SW1, the switching element SW2, the transistor M, the transistor MD, the insulating film 501B, the insulating film 501C, the insulating film 521A, the insulating film 521B, and the insulating film 528.

The display panel 700D includes the coloring film CF1, the coloring film CF2, the light-blocking film BM, the insulating film 771, the alignment film AF1, the alignment film AF2, and the optical film 770P.

The display panel 700D includes the driver circuit GD and the driver circuit SD.

<<Substrate 570>>

The substrate 570 can be formed using a material having heat resistance high enough to withstand heat treatment in the manufacturing process. For example, a material similar to the material which can be used for the substrate 570 and is described in Embodiment 1 can be used.

<<Substrate 770>>

A light-transmitting material can be used for the substrate 770. For example, a material that can be used for the substrate 570 can be used for the substrate 770.

<<Wiring 511, Terminal 519D(1), and Terminal 519D(2)>>

A conductive material can be used for the wiring 511, the terminal 519D(1), or the terminal 519D(2). For example, a material similar to the material which can be used for the wiring 511 or 519 in Embodiment 1 can be used.

<<First Contact 591, Second Contact 592, and Third Contact 593>>

A conductive material can be used for the first contact 592 or the second contact 592. For example, a material similar to the material which can be used for the wiring 511 or the terminal 519D(1) or 519D(2) can be used.

<<Bonding Layer 505 and Sealant 705>>

An inorganic material, an organic material, a composite material of an inorganic material and an organic material, or the like can be used for the bonding layer 505 or the sealant 705. For example, a material similar to the material of the bonding layer 505 or the sealant 705 described in Embodiment 1 can be used.

<<Structures KB1 and KB2>>

The structures KB1 and KB2 can be formed using an organic material, an inorganic material, a composite material of an organic material and an inorganic material, or the like. Accordingly, a predetermined space can be provided between components between which the structure KB1 or KB2 is provided. For example, a material similar to the material which can be used for the structure KB1 or KB2 and is described in Embodiment 1 can be used.

<<Pixel 702(i,j)>>

The pixel 702(i,j) can include the first display element 750, the second display element 550, and the functional layer 520D.

The pixel 702(i,j) can include the coloring film CF1, the light-blocking film BM, the insulating film 771, the alignment film AF1, the alignment film AF2, and the coloring film CF2.

<<First Display Element 750>>

For example, a display element having a function of controlling transmission or reflection of light can be used as the first display element 750. For example, a combined structure of a polarizing plate and a liquid crystal element or a MEMS shutter display element can be used. The use of a reflective display element can reduce power consumption of a display panel. Specifically, a reflective liquid crystal display element can be used as the first display element 750. For example, a material similar to the material which can be used for the first display element 750 and is described in Embodiment 1 can be used.

<<Reflective Film>>

The reflective film can be formed of a material reflecting light which passes through the layer 753 containing a liquid crystal material, in which case the first display element 750 can be a reflective liquid crystal element. For example, a material similar to the material which can be used for the reflective film and is described in Embodiment 1 can be used.

<<Opening 751H>>

For example, the opening described in Embodiment 1 can be used as the opening.

<<Second Display Element 550>>

A light-emitting element, for example, can be used as the second display element 550. Specifically, an organic electroluminescence element, an inorganic electroluminescence element, a light-emitting diode, or the like can be used for the second display element 550.

For example, a stack formed to emit white light can be used as the layer 553 containing a light-emitting organic material. Specifically, a stack of a layer containing a light-emitting organic material containing a fluorescent material that emits blue light, a layer containing a material that is other than a fluorescent material and that emits green light and/or red light, or a layer containing a material that is other than a fluorescent material and that emits yellow light can be used as the layer 553 containing a light-emitting organic material.

For example, a material used for the wiring 511 can be used for the third conductive film 551 or the fourth conductive film 552.

For example, a conductive material that transmits visible light can be used for the third conductive film 551.

For example, a conductive material that transmits visible light can be used for the fourth conductive film 552.

Specifically, conductive oxide, indium-containing conductive oxide, indium oxide, indium tin oxide, indium zinc oxide, zinc oxide, zinc oxide to which gallium is added, or the like can be used for the third conductive film 551.

Alternatively, a metal film that is thin enough to transmit light can be used as the third conductive film 551.

<<Functional Layer 520D>>

The functional layer 520D includes the pixel circuit 730(i,j), the first contact 591, the second contact 592, and the third contact 593. The functional layer 520D includes the insulating film 501A, the insulating film 501B, the insulating film 501C, the insulating film 521A, the insulating film 521B, and the insulating film 528.

<<Pixel Circuit 730(i,j)>>

For example, a structure similar to the structure which can be used for the pixel circuit 730(i,j) and is described in Embodiment 1 can be used.

<<Transistor M>>

The transistor M includes the semiconductor film 508 and the conductive film 504 which includes a region overlapping with the semiconductor film 508 (see FIG. 8B). The transistor M includes the conductive film 512A, the conductive film 512B, and the insulating film 506 between the semiconductor film 508 and the conductive film 504. For example, a structure similar to the structure which can be used for the transistor M and is described in Embodiment 1 can be used.

<<Switches SW1 and SW2>>

A transistor can serve as the switch SW1 or SW2.

For example, a transistor which can be fabricated in the same process as the transistor M can be used as the switch SW1 or SW2.

<<Insulating Film 501B and Insulating Film 501C>>

Although the insulating film 501C is stacked over the insulating film 501B in this embodiment, the insulating film 501C may be omitted. For example, a material similar to the material which can be used for the insulating film 501B or the insulating film 501C and is described in Embodiment 1 can be used.

<<Insulating Films 521A, 521B, and 528>>

For example, a material similar to the material which can be used for the insulating film 521A, 521B, or 528 and is described in Embodiment 1 can be used.

<<Coloring Film CF1 and CF2>>

For example, a material similar to the material which can be used for the coloring film CF1 or CF2 and is described in Embodiment 1 can be used.

<<Light-Blocking Film BM>>

A material that prevents light transmission can be used for the light-blocking film BM, in which case the light-blocking film BM serves as a black matrix, for example.

<<Insulating Film 771>>

The insulating film 771 can be formed of polyimide, epoxy resin, acrylic resin, or the like.

<<Alignment Films AF1 and AF2>>

The alignment films AF1 and AF2 can be formed of a material containing polyimide or the like, such as a material formed to have a predetermined alignment by a rubbing process or an optical alignment process.

<<Optical Film 770P>>

For example, a material similar to the material which can be used for the optical film 770P and is described in Embodiment 1 can be used.

<<Driver Circuit GD>>

For example, a structure similar to the structure which can be used for the driver circuit GD and is described in Embodiment 1 can be used.

<<Driver Circuit SD>>

For example, an integrated circuit can be used in the driver circuit SD. Specifically, an integrated circuit formed over a silicon substrate can be used.

For example, a chip on glass (COG) method can be used to mount the driver circuit SD on a pad provided over the insulating film 501C. Specifically, a conductive material film can be used to mount the integrated circuit on the pad. Note that the pad is electrically connected to the pixel circuit 730(i,j).

Structure Example 2 of Display Panel

Another structure of a display panel of one embodiment of the present invention will be described with reference to FIGS. 9A to 9D.

FIGS. 9A to 9D illustrate structures of a pixel circuit which can be used for the display panel of one embodiment of the present invention. The pixel circuit shown in FIGS. 9A to 9D can be used instead of the pixel circuit 730(i,j) in FIG. 1C.

Figure 9A:
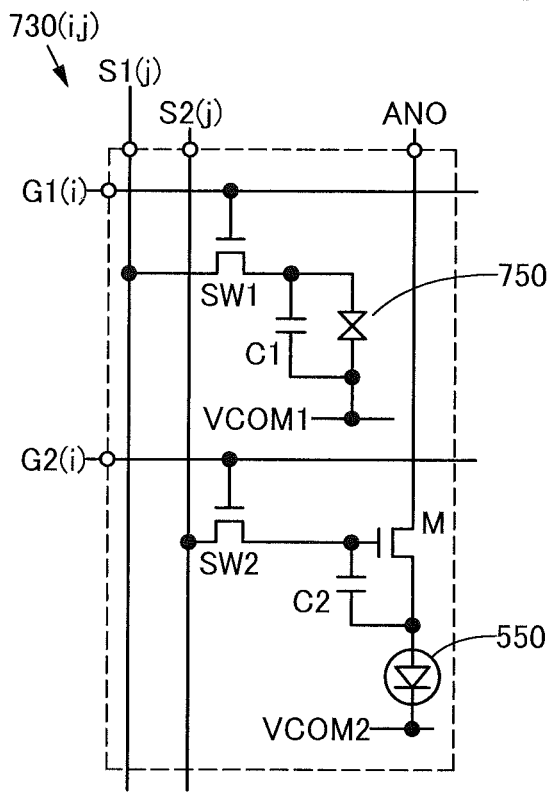
FIGS. 9A to 9D are circuit diagrams illustrating the structure of a display portion according to one embodiment of the present invention.

Note that the pixel circuit 730(i,j) in FIG. 9A is different from the pixel circuit 730(i,j) in FIG. 1C in that it is electrically connected to signal lines S1(j) and S2(j).

Figure 9B:
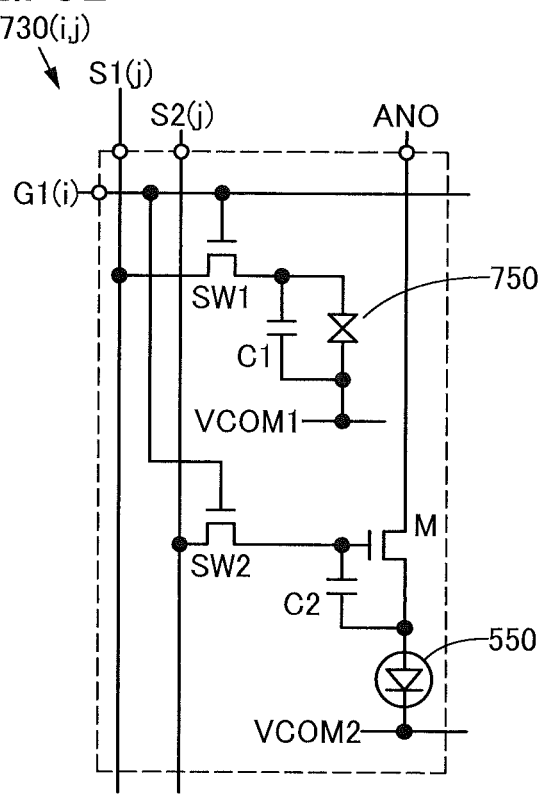
Figure 9C:
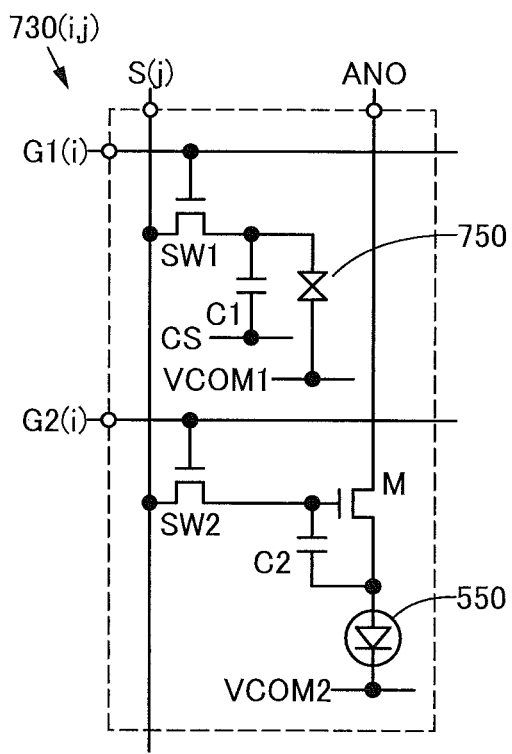

The pixel circuit 730(i,j) shown in FIG. 9B is different from the pixel circuit 730(i,j) shown in FIG. 1C in that it is electrically connected to the signal lines S1(j) and S2(j) and that the control electrodes of the switches SW1 and SW2 are electrically connected to the scan line G1(i). The pixel circuit 730(i,j) shown in FIG. 9C is different from the pixel circuit 730(i,j) shown in FIG. 1C in that the second electrode of the capacitor C1 is electrically connected to a wiring CS. Note that a wiring other than the wiring VCOM1 can be used as the wiring CS.

Figure 9D:
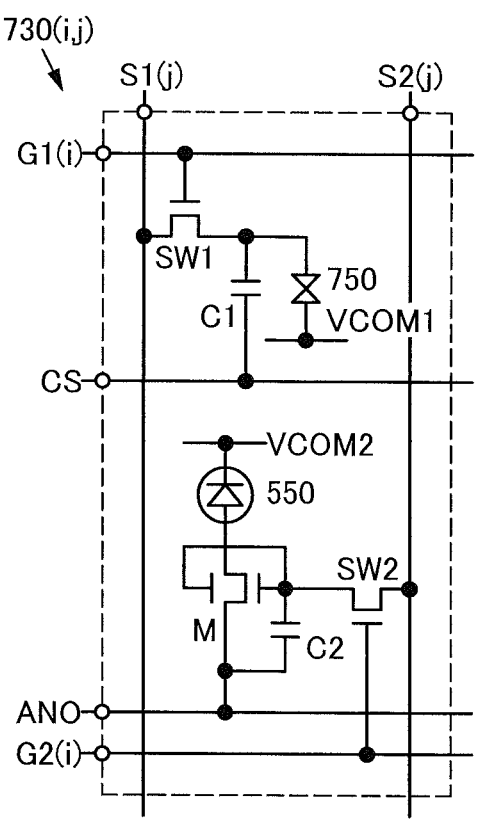

The pixel circuit 730(i,j) shown in FIG. 9D is different from the pixel circuit 730(i,j) shown in FIG. 9A in that the second electrode of the capacitor C2 is electrically connected to the wiring ANO and that the second electrode of the transistor M is electrically connected to the wiring ANO. Note that for example, the transistor M can have a structure similar to the transistor MD including the conductive film 524.

Structure Example 3 of Display Panel

Another structure of the display panel of one embodiment of the present invention will be described with reference to FIG. 10.

Figure 10:
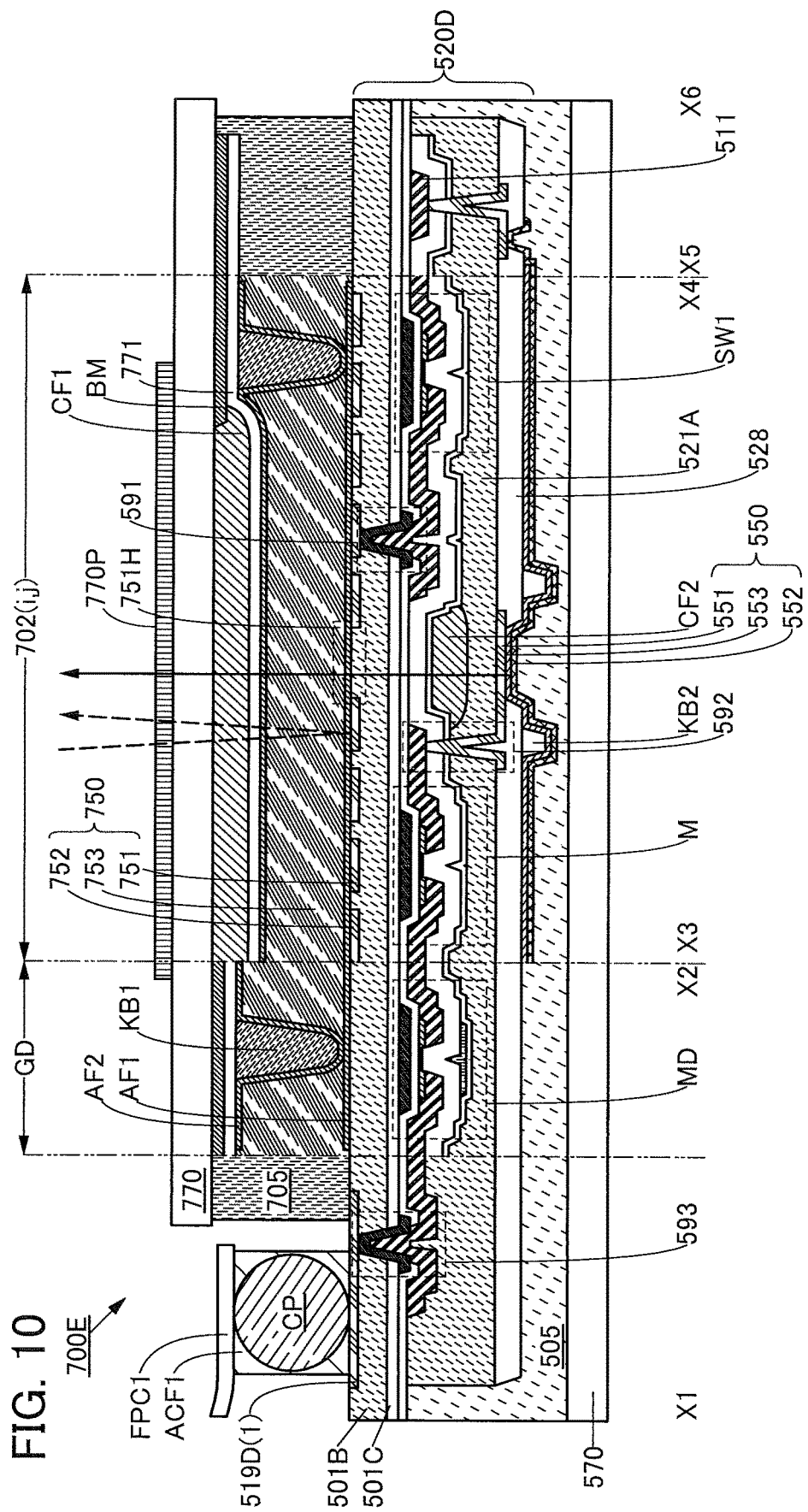
FIG. 10 is a cross-sectional view illustrating the structure of a display panel according to one embodiment of the present invention.

FIG. 10 illustrates the structure of the display panel of one embodiment of the present invention. FIG. 10 is a cross-sectional view of a display panel 700E, which is one embodiment of the present invention, taken along the section lines X1-X2, X3-X4, and X5-X6 in FIG. 1A.

Note that the display panel 700E shown in FIG. 10 is different from the display panel 700D shown in FIG. 8A in that the first conductive film 751 and the second conductive film 752 include a region embedded in the insulating film 501B and a region exposed from the insulating film 501B and that the second contact 592 and the third conductive film 551 contain the same conductive material.

Specifically, the first display element 750 of the display panel 700E includes a liquid crystal display element driven in an IPS mode or the like.

Structure Example 4 of Display Panel

Another structure of the display panel of one embodiment of the present invention will be described with reference to FIG. 11.

Figure 11:
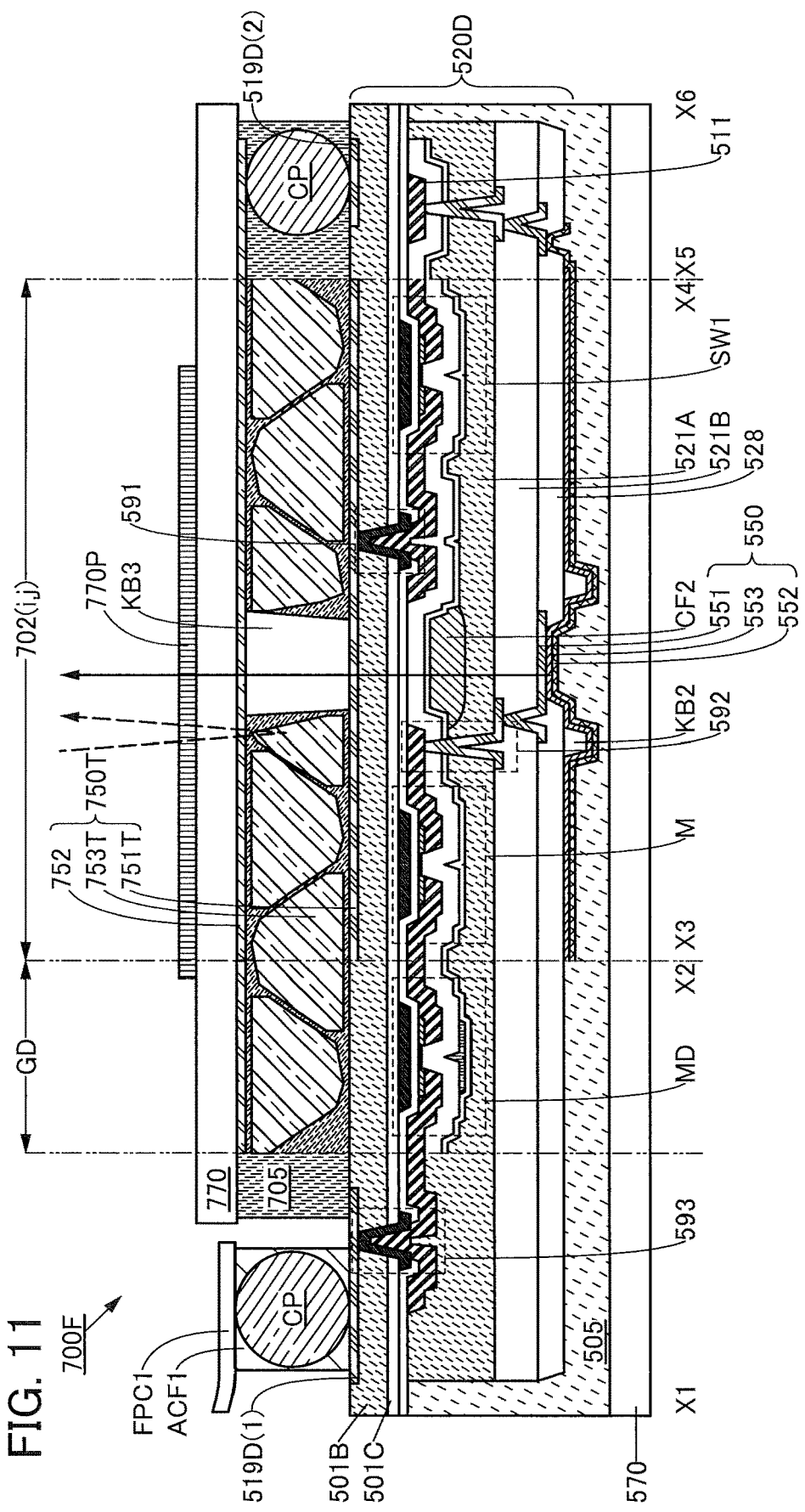
FIG. 11 is a cross-sectional view illustrating the structure of a display panel according to one embodiment of the present invention.

FIG. 11 illustrates a structure of the display panel of one embodiment of the present invention. FIG. 11 is a cross-sectional view of the display panel 700E, which is one embodiment of the present invention, taken along the section lines X1-X2, X3-X4, and X5-X6 in FIG. 1A.

Note that the display panel 700F in FIG. 11 is different from the display panel 700D in FIG. 8A in that a layer 753T containing electronic ink is provided instead of the layer 753 containing a liquid crystal material, that a first transparent conductive film 751T is provided instead of the first conductive film 751 having the opening 751H, and that a transparent structure KB3 lies in a region overlapping with the second display element 550.

Specifically, the layer 753T containing electronic ink of the display panel 700F contains rewritable electronic ink, such as electrophoretic ink. By electrical control of the electronic ink, rewriting and erasing can be performed.

This embodiment can be combined with any of the other embodiments in this specification as appropriate.

Embodiment 3

In this embodiment, a method for manufacturing a display panel of one embodiment of the present invention will be described with reference to FIGS. 12 to 19.

Figure 12:
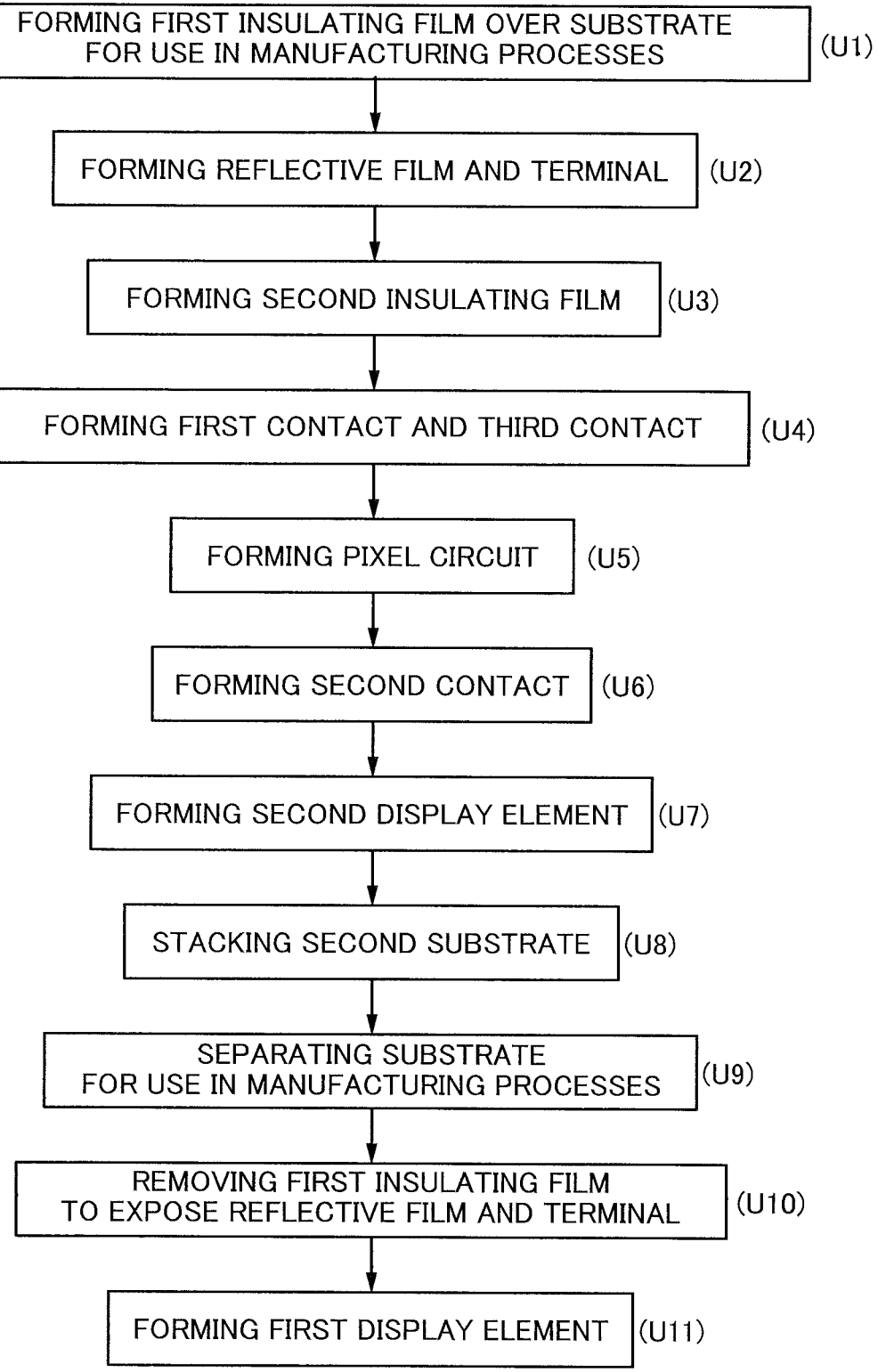
FIG. 12 is a flow chart illustrating a method for manufacturing a display panel according to one embodiment of the present invention.

FIG. 12 is a flow chart illustrating a method for manufacturing a display panel 700D of one embodiment of the present invention. FIGS. 13 to 19 are cross-sectional views of the display panel 700D in the manufacturing steps taken along the section lines X1-X2, X3-X4, and X5-X6 of FIG. 1A.

<Method for Manufacturing Display Panel>

The method for manufacturing the display panel 700D described in this embodiment is composed of the following 11 steps.

<Step 1>

In a step 1, the insulating film 501A is formed over a substrate for use in manufacturing processes (see U1 in FIG. 12). For example, the insulating film 501A is formed so that a separation film 510W is provided between the insulating film 501A and a substrate 510.

The substrate for use in manufacturing processes can include, for example, the substrate 510 and the separation film 510W having a region overlapping with the substrate 510.

The substrate 510 can be formed using a material having heat resistance high enough to withstand heat treatment in the manufacturing process.

For example, a large-sized glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm) Thus, a large-sized LCD can be used as the substrate 510, and a large-sized display device can be manufactured.

For the substrate 510, an organic material, an inorganic material, a composite material of an organic material and an inorganic material, or the like can be used. For example, an inorganic material such as glass, ceramic, or metal can be used for the substrate 510.

Specifically, non-alkali glass, soda-lime glass, potash glass, crystal glass quartz, sapphire, or the like can be used for the substrate 510. Specifically, an inorganic oxide, an inorganic nitride, an inorganic oxynitride, or the like can be used for the substrate 510. For example, a silicon oxide film, a silicon nitride film, a silicon oxynitride film, or an aluminum oxide film can be used for the substrate 510. Stainless steel, aluminum, or the like can be used for the substrate 510.

For example, an organic material such as a resin, a resin film, or plastic can be used for the substrate 510. Specifically, a resin film or resin plate of polyester, polyolefin, polyamide, polyimide, polycarbonate, an acrylic resin, or the like can be used for the substrate 510.

For example, a composite material such as a resin film to which a metal plate, a thin glass plate, or a film of an inorganic material is attached can be used for the substrate 510. For example, a composite material formed by dispersing a fibrous or particulate metal, glass, inorganic material, or the like into a resin film can be used as the substrate 510.

For example, a composite material formed by dispersing a fibrous or particulate resin, organic material, or the like into an inorganic material can be used as the substrate 510.

A single-layer material or a stacked-layer material in which a plurality of layers are stacked can be used for the substrate 510. For example, a stacked-layer material in which a base, an insulating film that prevents diffusion of impurities contained in the base, and the like are stacked can be used for the substrate 510.

For example, the separation film 510W can be formed using a material that allows the insulating film 501A to be separated from the substrate 510 in the step 9.

Note that the separation film 510W can remain on the substrate 510 side after the insulating film 501A is separated from the substrate 510. Alternatively, the separation film 510W can be separated together with the insulating film 501A from the substrate 510.

Specifically, the separation film 510W can remain on the substrate 510 side after the insulating film 501A can be separated from the substrate 510 in the case where the substrate 510, the separation film 501W, and the insulating film 501A are formed using a non-alkali glass substrate, a film containing tungsten or the like, and a film containing inorganic oxide or inorganic oxynitride, respectively.

The separation film 510W can be separated together with the insulating film 501A from the substrate 510 when the substrate 510, the separation film 510W, and the insulating film 501A are formed using a non-alkali glass substrate, a film containing polyimide, and a film containing various materials, respectively.

For example, the insulating film 501A is formed on the separation film 510W by a chemical vapor deposition method, a sputtering method, a coating method, or the like. Then, unnecessary portions are removed by a photolithography process, or the like so that the insulating film 501A is completed.

Note that it is preferable that the insulating film 501A be larger than the separation film 510W so that the peripheral portion of the insulating film 501A is in contact with the substrate 510, in which case occurrence of unintended separation of the insulating film 501A from the substrate for use in manufacturing processes can be reduced.

Specifically, a 0.7-mm-thick glass plate is used as the substrate 510, and a stacked-layer material of a 200-nm-thick silicon oxynitride film and a 30-nm-thick tungsten film stacked in this order from the substrate 510 side is used for the separation film 510W. In addition, a film including a stacked-layer material in which a 600-nm-thick silicon oxynitride film and a 200-nm-thick silicon nitride film are stacked in this order from the separation film 510W side can be used as the insulating film 501A. Note that a silicon oxynitride film refers to a film that includes more oxygen than nitrogen, and a silicon nitride oxide film refers to a film that includes more nitrogen than oxygen.

Specifically, instead of the insulating film 501A, a film including a stacked-layer material of a 600-nm-thick silicon oxynitride film, a 200-nm-thick silicon nitride film, a 200-nm-thick silicon oxynitride film, a 140-nm-thick silicon nitride oxide film, and a 100-nm-thick silicon oxynitride film stacked in this order from the separation film 510W side can be used.

<<Step 2>>

In a step 2, a reflective film and terminals are formed (see U2 in FIG. 12). Note that the first conductive film 751 serves as the reflective film in an example of this embodiment.

The reflective film includes the opening 751H. The terminals include the terminals 519D(1) and 519D(2).

A film containing a conductive material is formed on the insulating film 501A by a chemical vapor deposition method, a sputtering method, a coating method, or the like. Then, unnecessary portions are removed by a photolithography process, so that the first conductive film 751 used as the reflective film and the terminals 519D(1) and 519D(2) are completed.

<<Step 3>>

In a step 3, the insulating film 501B covering the reflective film and the terminal is formed (see U3 in FIG. 12). Note that the insulating film 501C having a region overlapping with the insulating film 501B may be formed successively after the insulating film 501B is formed.

The insulating film 501B and the insulating film 501C have openings.

A film suppressing impurity diffusion is formed to cover the reflective film and the terminal by a chemical vapor deposition method, a sputtering method, a coating method, or the like.

Then, an opening reaching the first conductive film 751 and an opening reaching the terminal 519D(1) are formed by a photolithography process or the like, so that the insulating film 501B and the insulating film 501C are completed.

<<Step 4>>

Figure 13:
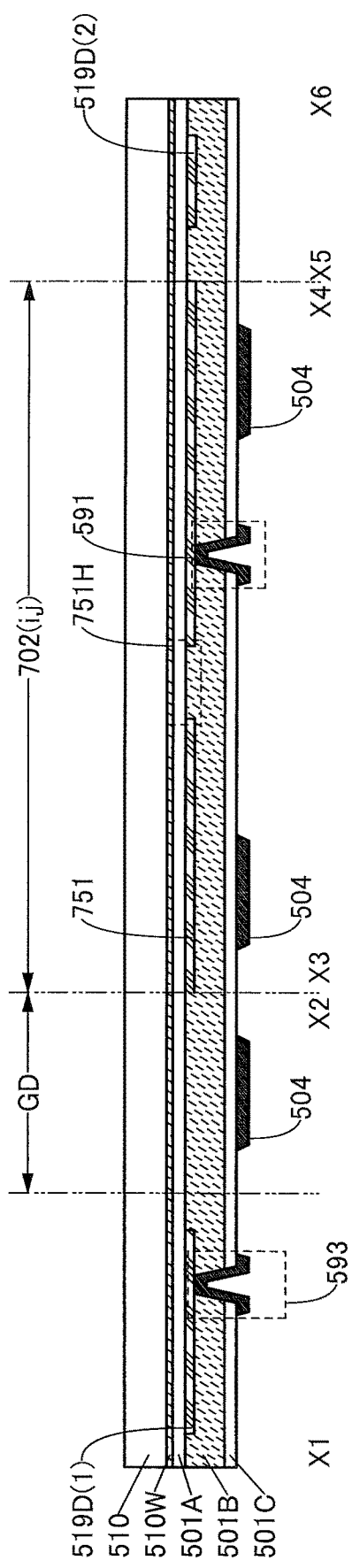
FIG. 13 illustrates a method for manufacturing a display panel according to one embodiment of the present invention.

In a step 4, the first contact 591 and the third contact 593 are formed (see U4 in FIG. 12 and FIG. 13). The reflective film is electrically connected to the first contact 591. The terminal 519D(1) is electrically connected to the third contact 593. Note that the conductive film 504 serving as a gate electrode of the transistor M, the transistor MD, or the transistor which can be used as the switch SW1 may be formed together with the first contact 591 and the terminal 519D.

A film containing a conductive material is formed to be in contact with the insulating film 501C, the opening reaching the first conductive film 751, and the opening reaching the terminal 519D(1) by a chemical vapor deposition method, a sputtering method, a coating method, or the like.

Then, unnecessary portions are removed by a photolithography process or the like, so that the first contact 591, the third contact 593, and the conductive film 504 are completed.

<<Step 5>>

In a step 5, a pixel circuit electrically connected to the first contact 591 and the third contact 593 is formed (see U5 in FIG. 12).

A film containing a conductive material, a film containing an insulating material, a film containing a semiconductor material, and the like are formed by a chemical vapor deposition method, a sputtering method, or the like. Then, unnecessary portions of the films are removed by a photolithography method or the like. With combination of a deposition method and a photolithography method or the like, the pixel circuit including the transistor M, the transistor MD, and the transistor or the like serving as the switch SW1 is completed.

Next, the insulating films 516 and 518 protecting elements, such as transistors, of the pixel circuit are formed. Furthermore, the conductive film 524 serving as a second gate electrode is formed between the insulating films 516 and 518.

Then, the coloring film CF2 is formed.

Then, the insulating film 521A is formed. An opening reaching the pixel circuit is formed in the insulating films 516, 518, and 521A.

<<Step 6>>

Figure 14:
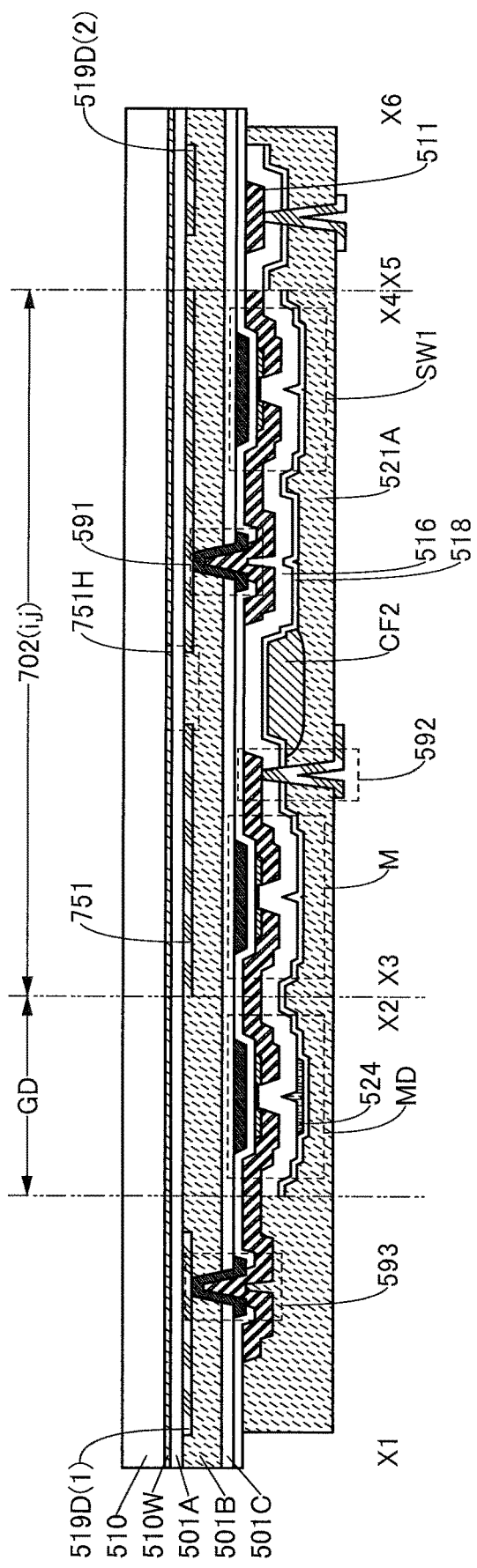
FIG. 14 illustrates a method for manufacturing a display panel according to one embodiment of the present invention.

In a step 6, the second contact 592 electrically connected to the pixel circuit is formed (see U6 in FIG. 12 and FIG. 14). Note that a wiring may be formed together with the second contact 592.

For example, a film containing a conductive material is formed by a chemical vapor deposition method, a sputtering method, a coating method, or the like.

Then, unnecessary portions of the films are removed by a photolithography method or the like to form the second contact 592.

<<Step 7>>

Figure 15:
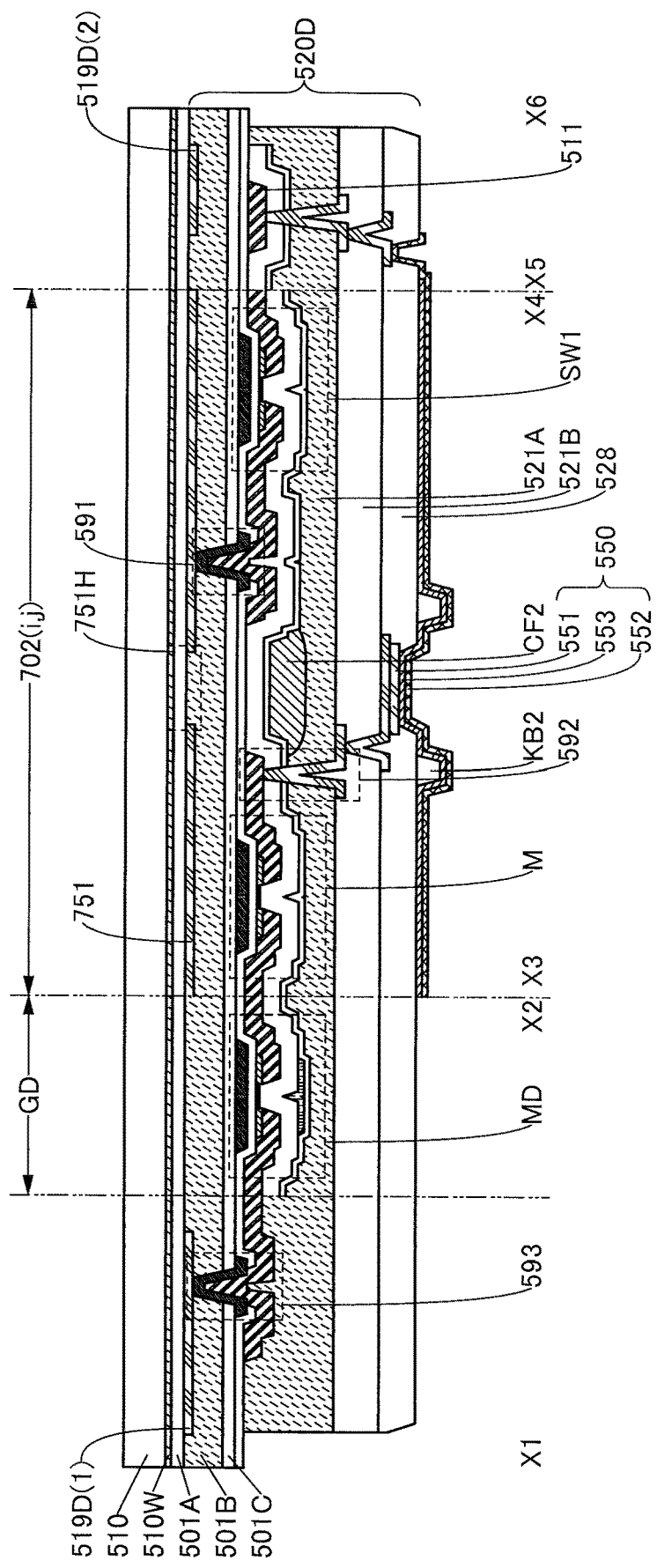
FIG. 15 illustrates a method for manufacturing a display panel according to one embodiment of the present invention.

In a step 7, the second display element 550 electrically connected to the second contact 592 is formed (see U7 in FIG. 12 and FIG. 15).

For example, the insulating film 521B is formed between the second contact 592 and the second display element 550.

Next, to form the third conductive film 551 electrically connected to the second contact 592, a film containing a conductive material is formed by a chemical vapor deposition method, a sputtering method, or the like. Then, unnecessary portions are removed by a photolithography method, so that the third conductive film 551 is finished.

Next, the insulating film 528 having an opening in a region overlapping with the third conductive film 551 is formed. Note that the ends of the third conductive film 551 are covered by the insulating film 528. For example, a photosensitive polymer film is formed by a coating method or the like, and its unnecessary portions are removed by a photolithography method or the like, so that the insulating film 528 is finished.

Then, the structure KB2 in contact with the insulating film 528 is formed by a method similar to that of the insulating film 528, for example.

Then, the layer 553 containing a light-emitting organic compound is formed to cover the third conductive film 551 exposed in the opening of the insulating film 528. An evaporation method, a printing method, an ink-jet method, or the like using a shadow mask can be used.

Then, the fourth conductive film 552 is formed such that the layer 553 containing a light-emitting organic compound is provided between the third conductive film 551 and the fourth conductive film 552. Specifically, an evaporation method, a sputtering method, or the like using a shadow mask can be used. Note that the fourth conductive film 552 is electrically connected to the wiring 511.

<<Step 8>>

Figure 16:
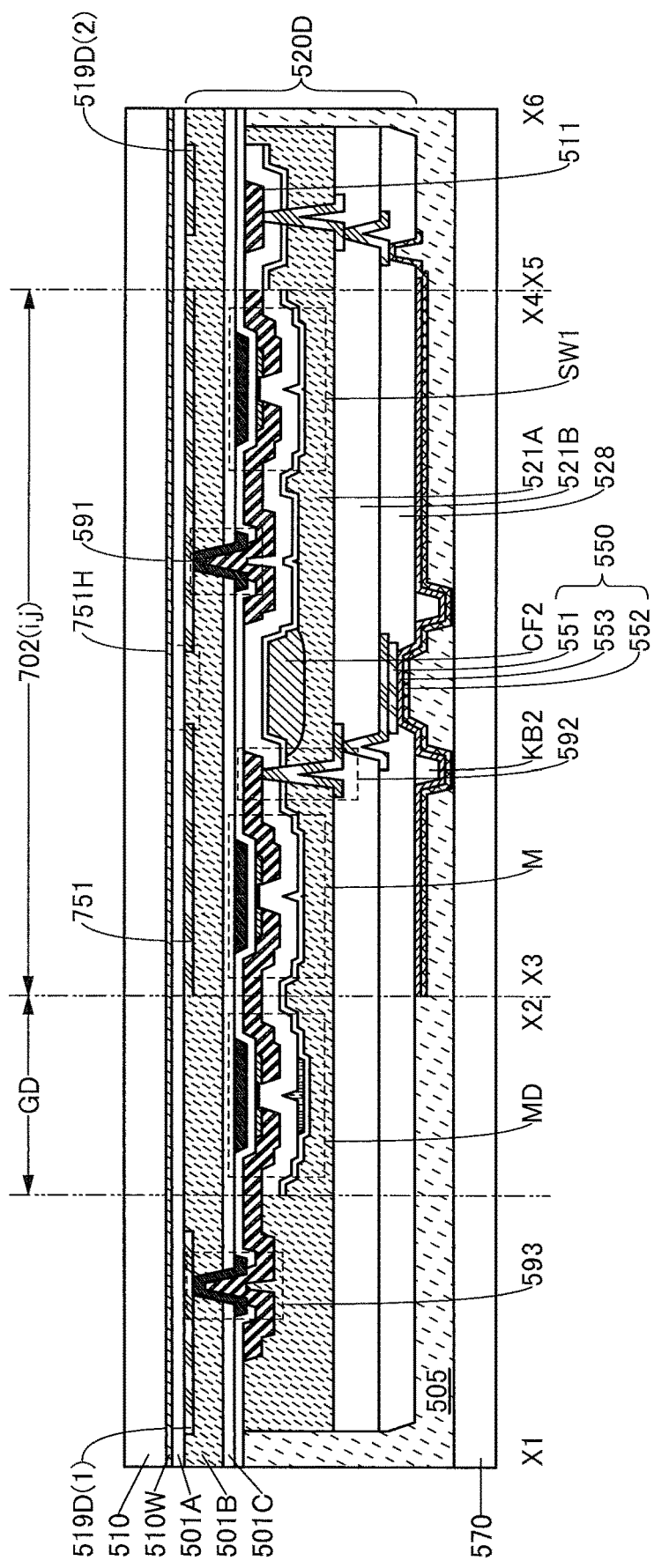
FIG. 16 illustrates a method for manufacturing a display panel according to one embodiment of the present invention.

In a step 8, the substrate 570 is stacked (see U8 in FIG. 12 and FIG. 16).

A fluid resin or the like is applied to form the bonding layer 505. Specifically, a coating method, a printing method, an ink-jet method, or the like can be used. Alternatively, a sheet-like fluid resin or the like is bonded to form the bonding layer 505.

Then, the functional layer 520D and the substrate 570 are bonded using the bonding layer 505.

<<Step 9>>

Figure 17:
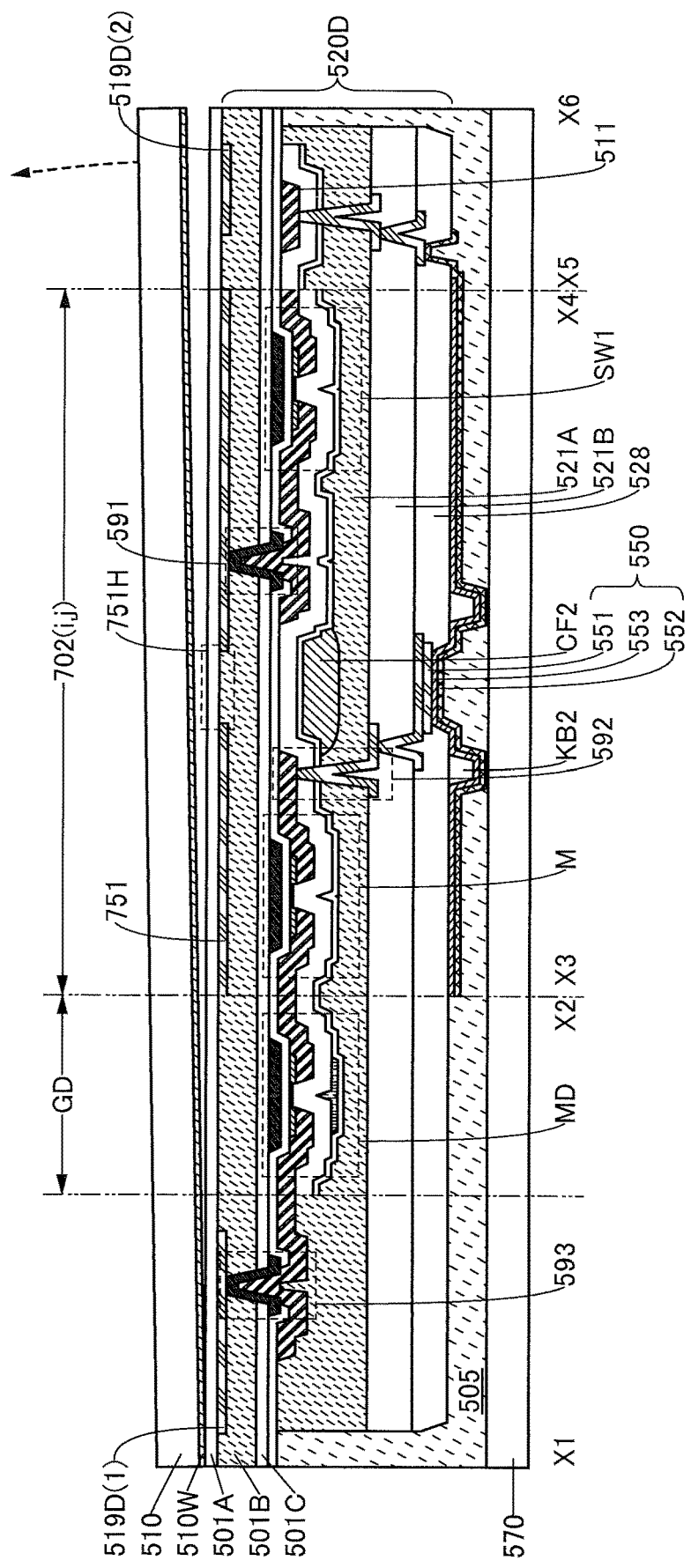
FIG. 17 illustrates a method for manufacturing a display panel according to one embodiment of the present invention.

In a step 9, the substrate 510 for use in manufacturing processes is separated (see U9 in FIG. 12 and FIG. 17).

For example, part of the separation film 510W can be removed from the insulating film 501A by sticking a sharp tip into the separation film 510W from the substrate 510 for use in manufacturing processes, or by a method using a laser or the like (e.g., a laser ablation method), thereby forming a separation starting point.

Then, the substrate 510 for use in manufacturing processes is gradually separated from the separation starting point.

Note that the separation may be performed while the vicinity of the interface between the separation film 510W and the insulating film 501A is irradiated with ions to remove static electricity. Specifically, the ions may be generated by an ionizer. Alternatively, a liquid may be ejected and sprayed by a nozzle to the interface between the separation film 510W and the insulating film 501A. For example, as the liquid to be injected or the liquid to be sprayed, water, a polar solvent, a liquid which dissolves the separation film 510W, or the like can be used. By injecting such a liquid, influence of static electricity and the like accompanying the separation can be reduced.

Particularly in the case where a film containing tungsten oxide is used for the separation film 510W, the substrate 510 is separated while a water-containing liquid is injected or sprayed, which leads to a reduction in stress with separation.

<<Step 10>>

Figure 18:
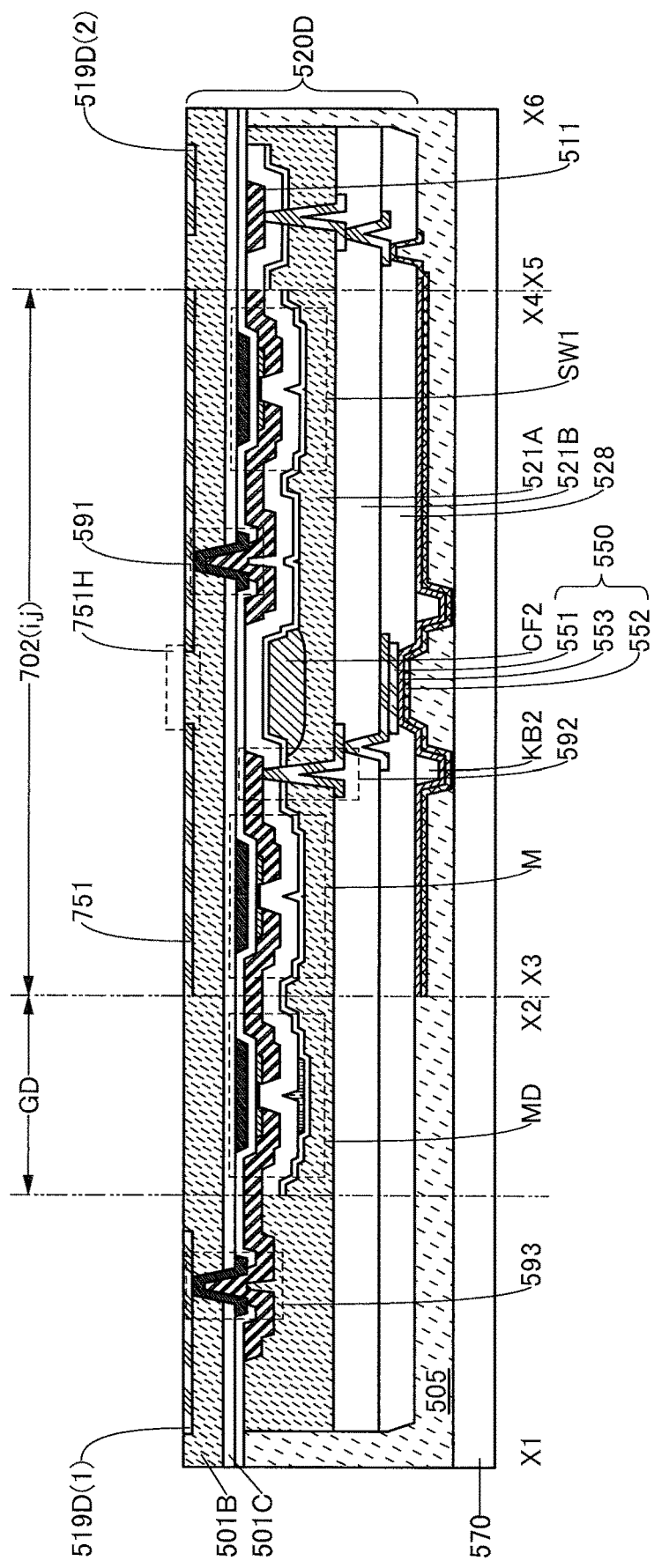
FIG. 18 illustrates a method for manufacturing a display panel according to one embodiment of the present invention.

In a step 10, the insulating film 501A is removed to expose the reflective film and the terminal (see U10 in FIG. 12 and FIG. 18).

The insulating film 501A can be removed by etching, chemical mechanical polishing, or the like, such as wet etching or dry etching.

<<Step 11>>

Figure 19:
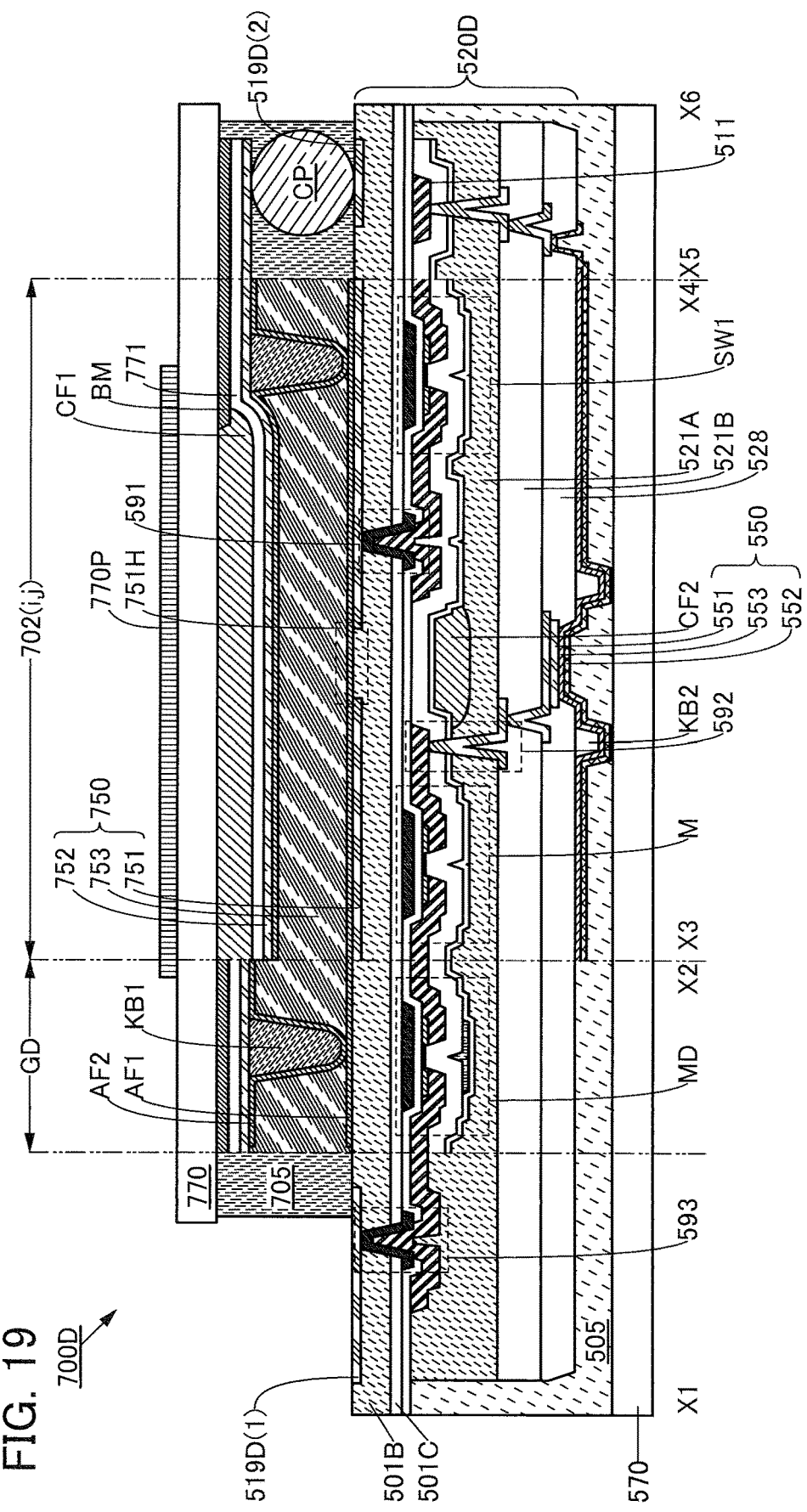
FIG. 19 illustrates a method for manufacturing a display panel according to one embodiment of the present invention.

In a step 11, the first display element is formed (see U11 in FIG. 12 and FIG. 19).

A counter substrate is prepared. Specifically, the substrate 770 including the light blocking film BM, the coloring film CF1, the insulating film 771, the second conductive film 752, the structure KB1, and the alignment film AF2 is prepared as the counter substrate.

Then, the alignment film AF1 including a region overlapping with the insulating film 501B and the first conductive film 751 is formed using a printing method, a rubbing method, and the like.

The sealant 705 is formed. Specifically, a fluid resin is applied to form a frame-like shape using a dispensing method, a printing method, or the like. Note that a material containing the conductive member CP is applied to a region of the sealant 705 overlapping with the terminal 519D(2).

Then, a liquid crystal material is dropped in the region surrounded by the sealant 705 using a dispensing method.

Then, the substrate 770 is bonded to the insulating film 501B using the sealant 705. Note that the structure KB1 is provided between the insulating film 501B and the substrate 770 to electrically connect the terminal 519D(2) and the second conductive film 752 using the conductive member CP.

The manufacturing method of the display panel 700D in this embodiment includes the step for separating the substrate 510 for use in manufacturing processes and the step for removing the insulating film 501A to expose the reflective film and the terminal. Accordingly, a step at the edge of the reflective film can be minimized to reduce the possibility of alignment defects due to the step. In addition, the surface of the terminal at which contact with other components is made can be exposed. A manufacturing method of a novel display panel that is highly convenient or reliable can be thus provided.

This embodiment can be combined with any of the other embodiments in this specification as appropriate.

Embodiment 4

In this embodiment, the structure of a transistor which can be used for the display panel of one embodiment of the present invention will be described with reference to FIGS. 20A to 20C.

Structural Example of Semiconductor Device

Figure 20A:
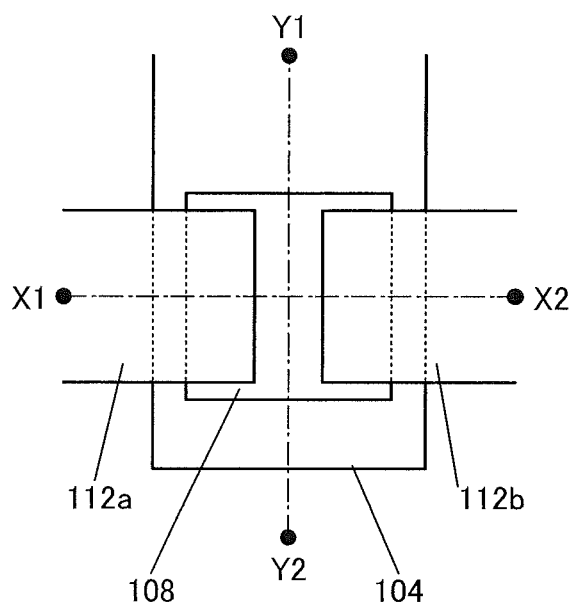
FIGS. 20A to 20D illustrate the structure of a transistor according to one embodiment of the present invention.

FIG. 20A is a top view of the transistor 100. FIG. 20B is a cross-sectional view taken along the section line X1-X2 in FIG. 20A, and FIG. 20C is a cross-sectional view taken along the section line Y1-Y2 in FIG. 20A. Note that in FIG. 20A, some components of the transistor 100 (e.g., an insulating film serving as a gate insulating film) are not illustrated to avoid complexity. In some cases, the direction of the section line Y1-Y2 is referred to as a channel length direction and the direction of the section line X1-X2 is referred to as a channel width direction. As in FIG. 20A, some components might not be illustrated in some top views of transistors described below.

Note that the transistor 100 can be used in the display panel described in Embodiment 1 or 2.

For example, when the transistor 100 is used as the transistor M, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the insulating film 501C, the conductive film 504, the insulating film 506, the semiconductor film 508, the conductive film 512A, the conductive film 512B, an insulating film 516, and the insulating film 518, respectively.

The transistor 100 includes a conductive film 104 functioning as a gate electrode over a substrate 102, an insulating film 106 over the substrate 102 and the conductive film 104, an insulating film 107 over the insulating film 106, an oxide semiconductor film 108 over the insulating film 107, and conductive films 112a and 112b functioning as source and drain electrodes electrically connected to the oxide semiconductor film 108. Over the transistor 100, specifically, over the conductive films 112a and 112b and the oxide semiconductor film 108, insulating films 114, 116, and 118 are provided. The insulating films 114, 116, and 118 function as protective insulating films for the transistor 100.

The oxide semiconductor film 108 includes a first oxide semiconductor film 108a on the conductive film 104 side and a second oxide semiconductor film 108b over the first oxide semiconductor film 108a. Furthermore, the insulating films 106 and 107 function as gate insulating films of the transistor 100.

An In-M oxide (M is Ti, Ga, Sn, Y, Zr, La, Ce, Nd, or Hf) or an In-M-Zn oxide can be used for the oxide semiconductor film 108. It is particularly preferable to use an In-M-Zn oxide for the semiconductor film 108.

The first oxide semiconductor film 108a includes a first region in which the atomic proportion of In is larger than the atomic proportion of M. The second oxide semiconductor film 108b includes a second region in which the atomic proportion of In is smaller than that in the first oxide semiconductor film 108a. The second region include a portion thinner than the first region.

The first oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the first oxide semiconductor film 108*a* including the first region in which the atomic proportion of In is larger than that of M makes it easier to change electrical characteristics of the transistor 100 in light irradiation. However, in the semiconductor device of one embodiment of the present invention, the second oxide semiconductor film 108*b* is formed over the first oxide semiconductor film 108*a*. In addition, the thickness of a portion including a channel region and the vicinity of the channel region in the second oxide semiconductor film 108*b* is smaller than the thickness of the first oxide semiconductor film 108*a*.

Furthermore, the second oxide semiconductor film 108*b* includes the second region in which the atomic proportion of In is smaller than the first oxide semiconductor film 108*a* and thus has larger Eg than that of the first oxide semiconductor film 108*a*. For this reason, the oxide semiconductor film 108 which is a layered structure of the first oxide semiconductor film 108*a* and the second oxide semiconductor film 108*b* has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 20B.

Figure 20B:
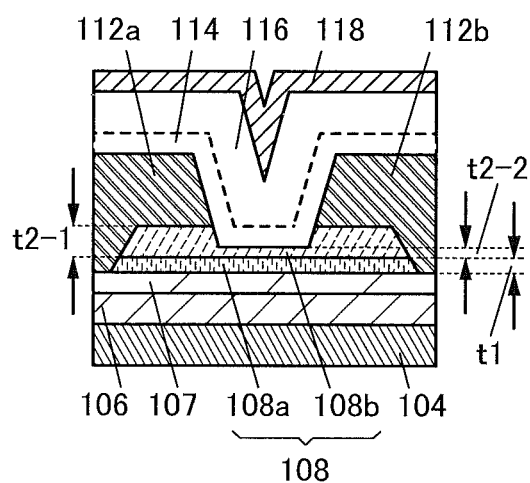
Figure 20C:
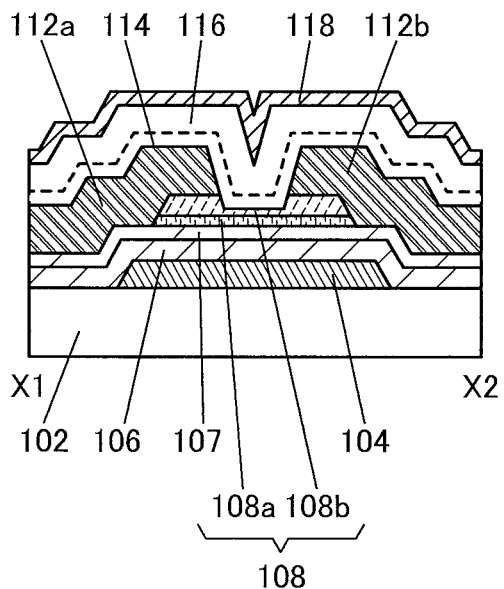
Figure 20D:
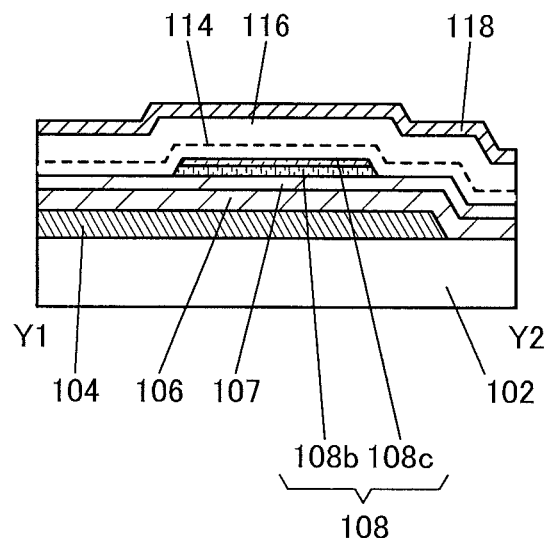

FIG. 20B is a cross-sectional enlarged view of the oxide semiconductor film 108 and the vicinity thereof in the transistor 100 illustrated in FIG. 20C.

In FIG. 20B, t1, t2-1, and t2-2 denote a thickness of the oxide semiconductor film 108*a*, one thickness of the oxide semiconductor film 108*b*, and the other thickness the oxide semiconductor film 108*b*, respectively. The oxide semiconductor film 108*b* over the oxide semiconductor film 108*a* prevents the oxide semiconductor film 108*a* from being exposed to an etching gas, an etchant, or the like when the conductive films 112*a* and 112*b* are formed. This is why the oxide semiconductor film 108*a* is not or is hardly reduced in thickness. In contrast, in the oxide semiconductor film 108*b*, a portion not overlapping with the conductive films 112*a* and 112*b* is etched by formation of the conductive films 112*a* and 112*b*, so that a depression is formed in the etched region. In other words, a thickness of the oxide semiconductor film 108*b* in a region overlapping with the conductive films 112*a* and 112*b* is t2-1, and a thickness of the oxide semiconductor film 108*b* in a region not overlapping with the conductive films 112*a* and 112*b* is t2-2.

As for the relationships between the thicknesses of the oxide semiconductor film 108*a* and the oxide semiconductor film 108*b*, t2-1>t1>t2-2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108 particularly oxygen vacancy in the oxide semiconductor film 108*a*. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108 particularly in the oxide semiconductor film 108*a*.

It is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the oxide semiconductor film 108*a*, the thickness of the portion including the channel region and the vicinity of the channel region in the oxide semiconductor film 108*b* is preferably small, and t2-2<t1 is preferably satisfied. For example, the thickness of the portion including the channel region and the vicinity of the channel region in the oxide semiconductor film 108*b* is preferably more than or equal to 1 nm and less than or equal to 20 nm, more preferably more than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102.

Alternatively, a single crystal semiconductor substrate or a polycrystalline semiconductor substrate of silicon or silicon carbide, a compound semiconductor substrate of silicon germanium, an SOI substrate, or the like can be used as the substrate 102.

Alternatively, any of these substrates provided with a semiconductor element, an insulating film, or the like may be used as the substrate 102.

In the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode and Source and Drain Electrodes>>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal element as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film which inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 includes In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 is formed of In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The oxide semiconductor film 108a can be formed using the sputtering target having an atomic ratio of In:M:Zn=2:1:3, In:M:Zn=3:1:2, or In:M:Zn=4:2:4.1. The oxide semiconductor film 108b can be formed using the sputtering target having an atomic ratio of In:M:Zn=1:1:1 or In:M:Zn=1:1:1.2. Note that the atomic ratio of metal elements in a sputtering target used for forming the oxide semiconductor film 108b does not necessarily satisfy In≥M and Zn≥M, and may satisfy In ≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108a, and an oxide semiconductor film having an energy gap more than or equal to 2.5 eV and less than or equal to 3.5 eV is preferably used as the oxide semiconductor film 108b. Furthermore, the oxide semiconductor film 108b preferably has a higher energy gap than that of the oxide semiconductor film 108a.

Each thickness of the oxide semiconductor film 108a and the oxide semiconductor film 108b is more than or equal to 3 nm and less than or equal to 200 nm, preferably more than or equal to 3 nm and less than or equal to 100 nm, more preferably more than or equal to 3 nm and less than or equal to 50 nm. Note that the above-described thickness relationships between them are preferably satisfied.

An oxide semiconductor film with low carrier density is used as the oxide semiconductor film 108b. For example, the carrier density of the oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108a and the oxide semiconductor film 108b be set to be appropriate.

Note that it is preferable to use, as the oxide semiconductor film 108a and the oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm³, preferably lower than or equal to $5\times10^{19}$ atoms/cm³, further preferably lower than or equal to $1\times10^{19}$ atoms/cm³, further preferably lower than or equal to $5\times10^{18}$ atoms/cm³, further preferably lower than or equal to $1\times10^{18}$ atoms/cm³, further preferably lower than or equal to $5\times10^{17}$ atoms/cm³, and further preferably lower than or equal to $1\times10^{16}$ atoms/cm³.

When silicon or carbon that is one of elements belonging to Group 14 is included in the first oxide semiconductor film 108a, oxygen vacancy is increased in the first oxide semiconductor film 108a, and the first oxide semiconductor film 108a becomes an n-type film. Thus, the concentration of silicon or carbon (the concentration is measured by SIMS) in the first oxide semiconductor film 108a or the concentration of silicon or carbon (the concentration is measured by SIMS) in the vicinity of an interface with the oxide semiconductor film 108a is set to be lower than or equal to $2\times10^{18}$ atoms/cm³, preferably lower than or equal to $2\times10^{17}$ atoms/cm³.

In addition, the concentration of alkali metal or alkaline earth metal of the first oxide semiconductor film 108a, which is measured by SIMS, is lower than or equal to $1\times10^{18}$ atoms/cm³, preferably lower than or equal to $2\times10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108a.

Furthermore, when including nitrogen, the oxide semiconductor film 108a easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

Each of the first and second oxide semiconductor films 108a and 108b may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function of a protective insulating film of the transistor 100. The insulating films 114 and 116 include oxygen. Furthermore, the insulating film 114 is an insulating film which can transmit oxygen. The insulating film 114 also functions as a film which relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3 \times 10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film which can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in TDS analysis; the amount of released ammonia is typically greater than or equal to $1 \times 10^{18}$/cm$^3$ and less than or equal to $5 \times 10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide (NO$_x$; x is greater than 0 and less than or equal to 2, preferably greater than or equal to 1 and less than or equal to 2), typically NO$_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1 \times 10^{18}$ spins/cm$^3$, typically higher than or equal to $1 \times 10^{17}$ spins/cm$^3$ and lower than $1 \times 10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide (NO$_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal which appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is In(CH$_3$)$_3$. The chemical formula of trimethylgallium is Ga(CH$_3$)$_3$. The chemical formula of dimethylzinc is Zn(CH$_3$)$_2$. Without limitation to the above combination, triethylgallium (chemical formula: Ga(C$_2$H$_5$)$_3$) can be used instead of trimethylgallium and diethylzinc (chemical formula: Zn(C$_2$H$_5$)$_2$) can be used instead of dimethylzinc.

For example, in the case where a hafnium oxide film is formed by a deposition apparatus using an ALD method, two kinds of gases, that is, ozone (O$_3$) as an oxidizer and a source gas which is obtained by vaporizing liquid containing a solvent and a hafnium precursor compound (e.g., a hafnium alkoxide or a hafnium amide such as tetrakis(dimethylamide)hafnium (TDMAH)) are used. Note that the chemical formula of tetrakis(dimethylamide)hafnium is Hf[N(CH$_3$)$_2$]$_4$. Examples of another material liquid include tetrakis(ethylmethylamine)hafnium.

For example, in the case where an aluminum oxide film is formed by a deposition apparatus using an ALD method, two kinds of gases, e.g., H$_2$O as an oxidizer and a source gas which is obtained by vaporizing liquid containing a solvent and an aluminum precursor compound (e.g., trimethylaluminum (TMA)) are used. Note that the chemical formula of trimethylaluminum is Al(CH$_3$)$_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., O$_2$ or dinitrogen monoxide) are supplied to react with the adsorbate.

For example, in the case where a tungsten film is formed using a deposition apparatus using an ALD method, a WF$_6$ gas and a B$_2$H$_6$ gas are sequentially introduced plural times to form an initial tungsten film, and then a WF$_6$ gas and an H$_2$ gas are used, so that a tungsten film is formed. Note that an SiH$_4$ gas may be used instead of a B$_2$H$_6$ gas.

For example, in the case where an oxide semiconductor film, e.g., an In—Ga—Zn—O film is formed using a deposition apparatus using an ALD method, an In(CH$_3$)$_3$ gas and an O$_3$ gas are sequentially introduced plural times to form an InO layer, a GaO layer is formed using a Ga(CH$_3$)$_3$ gas and an O$_3$ gas, and then a ZnO layer is formed using a Zn(CH$_3$)$_2$ gas and an O$_3$ gas. Note that the order of these layers is not limited to this example. A mixed compound layer such as an In—Ga—O layer, an In—Zn—O layer, or a Ga—Zn—O layer may be formed by mixing these gases. Note that although an H$_2$O gas which is obtained by bubbling water with an inert gas such as Ar may be used instead of an O$_3$ gas, it is preferable to use an O$_3$ gas, which does not contain H. Furthermore, instead of an In(CH$_3$)$_3$ gas, an In(C$_2$H$_5$)$_3$ gas may be used. Instead of a Ga(CH$_3$)$_3$ gas, a Ga(C$_2$H$_5$)$_3$ gas may be used. Furthermore, a Zn(CH$_3$)$_2$ gas may be used.

This embodiment can be combined with any of the other embodiments in this specification as appropriate.

Embodiment 5

In this embodiment, structures of a transistor that can be used in the display panel of one embodiment of the present invention will be described with reference to FIGS. 21A to 21C.

Structure Example of Semiconductor Device

Figure 21A:
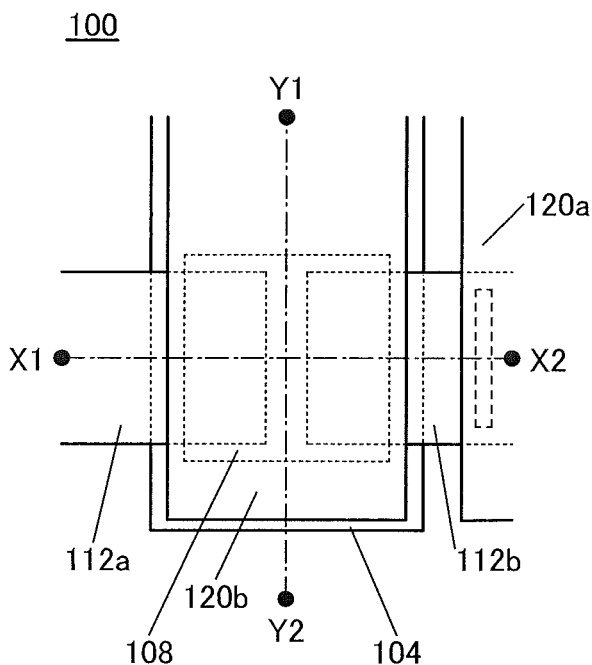
FIGS. 21A to 21C illustrate the structure of a transistor according to one embodiment of the present invention.
Figure 21B:
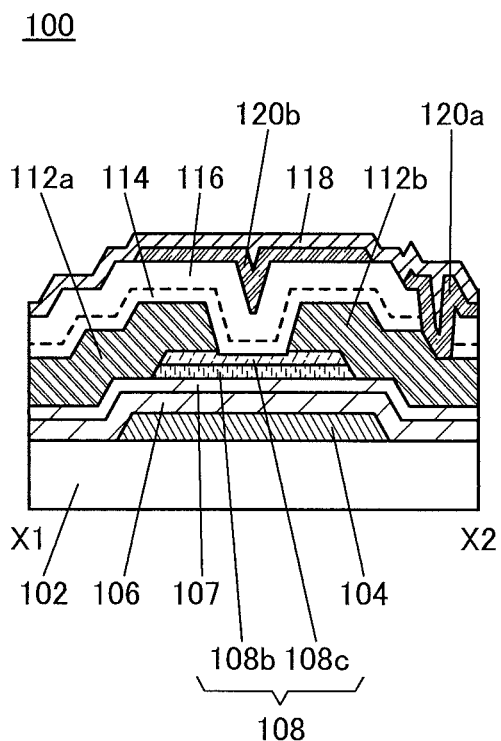
Figure 21C:
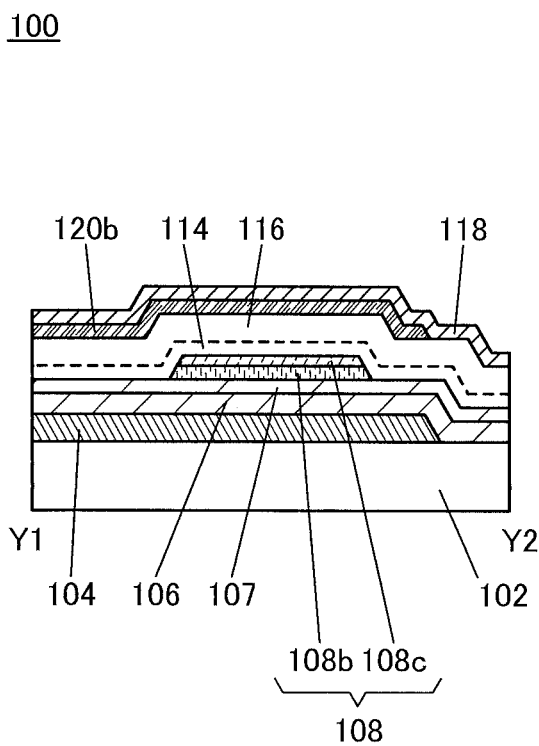

FIG. 21A is a top view of the transistor 100. FIG. 21B is a cross-sectional view taken along the cutting plane line X1-X2 in FIG. 10A, and FIG. 21C is a cross-sectional view taken along the cutting plane line Y1-Y2 in FIG. 10A. Note that in FIG. 21A, some components of the transistor 100 (e.g., an insulating film serving as a gate insulating film) are not illustrated to avoid complexity. Furthermore, the direction of the cutting plane line X1-X2 may be called a channel length direction, and the direction of the cutting plane line Y1-Y2 may be called a channel width direction. As in FIG. 21A, some components are not illustrated in some cases in top views of transistors described below.

The transistor 100 can be used for the display panel described in Embodiment 1 or 2, or the like.

For example, when the transistor 100 is used as the transistor MD, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the insulating film 501C, the conductive film 504, the insulating film 506, the semiconductor film 508, the conductive film 512A, the conductive film 512B, the insulating film 516, the insulating film 518, and the conductive film 524, respectively.

The transistor 100 includes a conductive film 104 functioning as a first gate electrode over a substrate 102, an insulating film 106 over the substrate 102 and the conductive film 104, an insulating film 107 over the insulating film 106, an oxide semiconductor film 108 over the insulating film 107, and conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100. In this specification and the like, the insulating films 106 and 107 are collectively referred to as a first insulating film, the insulating films 114 and 116 are collectively referred to as a second insulating film, and the insulating film 118 is referred to as a third insulating film in some cases.

The conductive film 120b can be used as a second gate electrode of the transistor 100.

In the case where the transistor 100 is used in a display panel, the conductive film 120a can be used as an electrode of a display element, or the like.

The oxide semiconductor film 108 includes the oxide semiconductor film 108b (on the conductive film 104 side) that functions as a first gate electrode, and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or µFE) of the transistor 100. Specifically, the field-effect mobility of the transistor 100 can exceed 10 cm$^2$/Vs, preferably exceed 30 cm$^2$/Ns.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 which is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the oxide semiconductor film becomes a conductor. The conductive films 120a and 120b having become conductors can each be referred to as oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of the Semiconductor Device>

Components of the semiconductor device of this embodiment will be described below in detail.

As materials described below, materials described in Embodiment 4 can be used.

The material that can be used for the substrate 102 described in Embodiment 4 can be used for the substrate 102 in this embodiment. Furthermore, the materials that can be used for the insulating films 106 and 107 described in Embodiment 4 can be used for the insulating films 106 and 107 in this embodiment.

In addition, the materials that can be used for the conductive films functioning as the gate electrode, the source electrode, and the drain electrode described in Embodiment 4 can be used for the conductive films functioning as the first gate electrode, the source electrode, and the drain electrode in this embodiment.

<<Oxide Semiconductor Film>>

The oxide semiconductor film 108 can be formed using the materials described above.

In the case where the oxide semiconductor film 108b includes In-M-Zn oxide, it is preferable that the atomic ratio of metal elements of a sputtering target used for forming the In-M-Zn oxide satisfy In >M. The atomic ratio between metal elements in such a sputtering target is, for example, In:M:Zn=2:1:3, In:M:Zn=3:1:2, or In:M:Zn=4:2:4.1.

In the case where the oxide semiconductor film 108c is In-M-Zn oxide, it is preferable that the atomic ratio of metal elements of a sputtering target used for forming a film of the In-M-Zn oxide satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, In:M:Zn=1:3:6, or In:M:Zn=1:4:5.

In the case where the oxide semiconductor films 108b and 108c are formed of In-M-Zn oxide, it is preferable to use a target including polycrystalline In-M-Zn oxide as the sputtering target. The use of the target including polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, more preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Further, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has few carrier traps in some cases. Further, the highly purified intrinsic or substantially highly purified intrinsic oxide semiconductor film has an extremely low off-state current; even when an element has a channel width of $1\times10^6$ μm and a channel length of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film which contains hydrogen is likely to be normally on. Accordingly, it is preferable that hydrogen be reduced as much as possible in the oxide semiconductor film 108. Specifically, in the oxide semiconductor film 108, the concentration of hydrogen which is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy is increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film which contains nitrogen is likely to have normally-on characteristics. For this reason, nitrogen in the oxide semiconductor film is preferably reduced as much as possible; the concentration of nitrogen which is measured by SIMS is preferably set to be, for example, lower than or equal to $5 \times 10^{18}$ atoms/cm$^3$.

The oxide semiconductor film 108b and the oxide semiconductor film 108c may have a non-single-crystal structure, for example. The non-single crystal structure includes a c-axis aligned crystalline oxide semiconductor (CAAC-OS) which is described later, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film which can transmit oxygen. Note that the insulating film 114 also functions as a film which relieves damage to the oxide semiconductor film 108 at the time of forming the insulating film 116 in a later step.

For example, the insulating films 114 and 116 described in Embodiment 4 can be used as the insulating films 114 and 116 in this embodiment.

<<Oxide Semiconductor Film Functioning as Conductive Film, Oxide Semiconductor Film Functioning as Second Gate Electrode>>

The material of the oxide semiconductor film 108 described above can be used for the conductive film 120a and the conductive film 120b functioning as the second gate electrode.

That is, the conductive film 120a and the conductive film 120b functioning as a second gate electrode contain a metal element which is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a and the conductive film 120b functioning as a second gate electrode are each In-M-Zn oxide, the atomic ratio of metal elements in a sputtering target used for forming the In-M-Zn oxide preferably satisfies In≥M. The atomic ratio of metal elements in such a sputtering target is In:M:Zn=2:1:3, In:M:Zn=3:1:2, In:M:Zn=4:2:4.1, or the like.

The conductive film 120a and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films which are described above can be formed by a sputtering method or a PECVD method, such films may be formed by another method, e.g., a thermal CVD method. Examples of the thermal CVD method include an MOCVD method and an ALD method. Specifically, the methods described in Embodiment 4 can be used.

This embodiment can be combined with any of the other embodiments in this specification as appropriate.

Embodiment 6

In this embodiment, a structure of an input/output device which is one embodiment of the present invention will be described with reference to FIG. 22.

Figure 22:
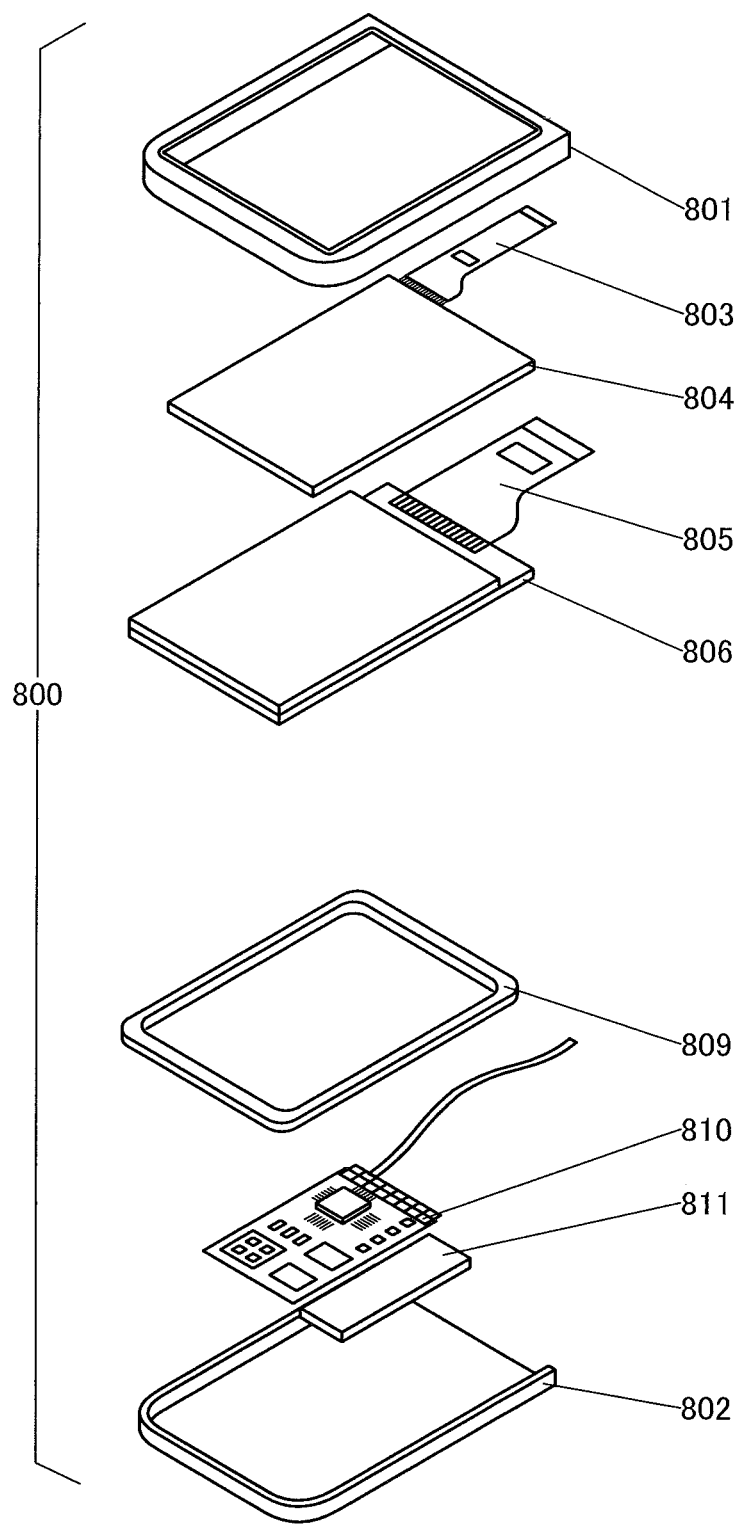
FIG. 22 illustrates the structure of an input/output device according to one embodiment of the present invention.

FIG. 22 is an exploded view of an input/output device 800 for illustrating the components.

The input/output device 800 includes a display panel 806 and a touch sensor 804 having a region overlapping with the display panel 806. Note that the input/output device 800 can be referred to as a touch panel.

The input/output device 800 is provided with a driver circuit 810 for driving the touch sensor 804 and the display panel 806, a battery 811 for supplying power to the driver circuit 810, and a housing where the touch sensor 804, the display panel 806, the driver circuit 810, and the battery 811 are stored.

<<Touch Sensor 804>>

The touch sensor 804 includes a region overlapping with the display panel 806. Note that an FPC 803 is electrically connected to the touch sensor 804.

For the touch sensor 804, a resistive touch sensor, a capacitive touch sensor, or a touch sensor using a photoelectric conversion element can be used, for example.

Note that the touch sensor 804 may be used as part of the display panel 806.

<<Display Panel 806>>

For example, the display panel described in Embodiment 1 or 2 can be used as the display panel 806. Note that an FPC 805 is electrically connected to the display panel 806.

<<Driver Circuit 810>>

As the driver circuit 810, a power supply circuit or a signal processing circuit can be used, for example. Power supplied to the battery or an external commercial power supply can be utilized.

The signal processing circuit has a function of outputting a video signal and a clock signal.

The power supply circuit has a function of supplying predetermined power.

<<Housing>>

An upper cover 801, a lower cover 802 which fits the upper cover 801, and a frame 809 which is stored in a region surrounded by the upper cover 801 and the lower cover 802 can be used for the housing, for example.

The frame 809 has a function of protecting the display panel 806, and a function of blocking electromagnetic waves generated by the operation of the driver circuit 810 or a function of a radiator plate.

Metal, a resin, an elastomer, or the like can be used for the upper cover 801, the lower cover 802, or the frame 809.

<<Battery 811>>

The battery 811 has a function of supplying power.

Note that a member such as a polarizing plate, a retardation plate, or a prism sheet can be used for the input/output device 800.

This embodiment can be combined with any of the other embodiments in this specification as appropriate.

Embodiment 7

In this embodiment, a structure of an information processing device of one embodiment of the present invention will be described with reference to FIGS. 23A and 23B, FIGS. 24A to 24D, FIGS. 25A and 25B, and FIG. 26.

Figure 23A:
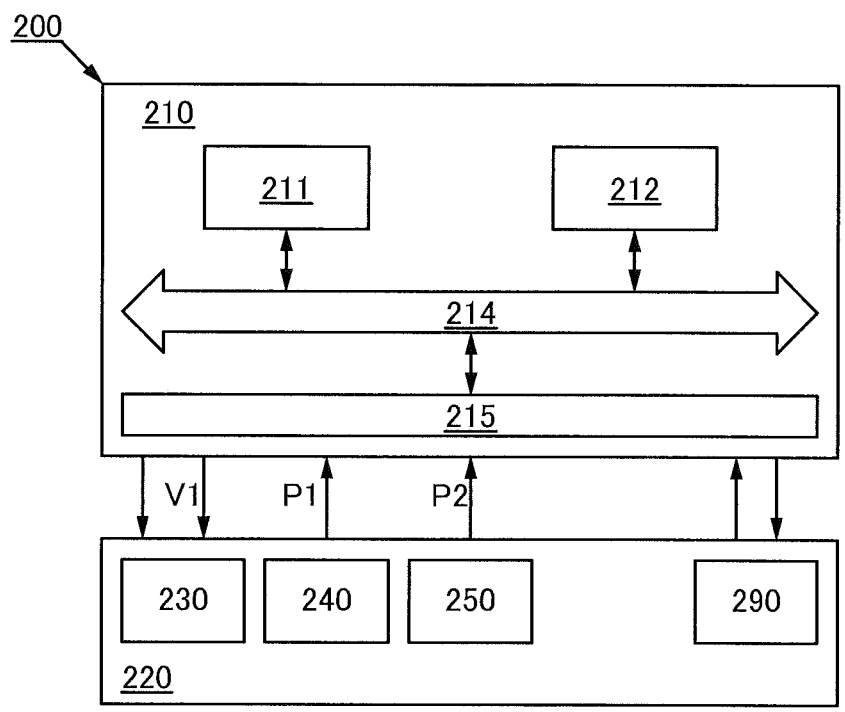
FIGS. 23A and 23B are a block diagram and a projection view illustrating the structure of an information processor according to one embodiment of the present invention.
Figure 23B:
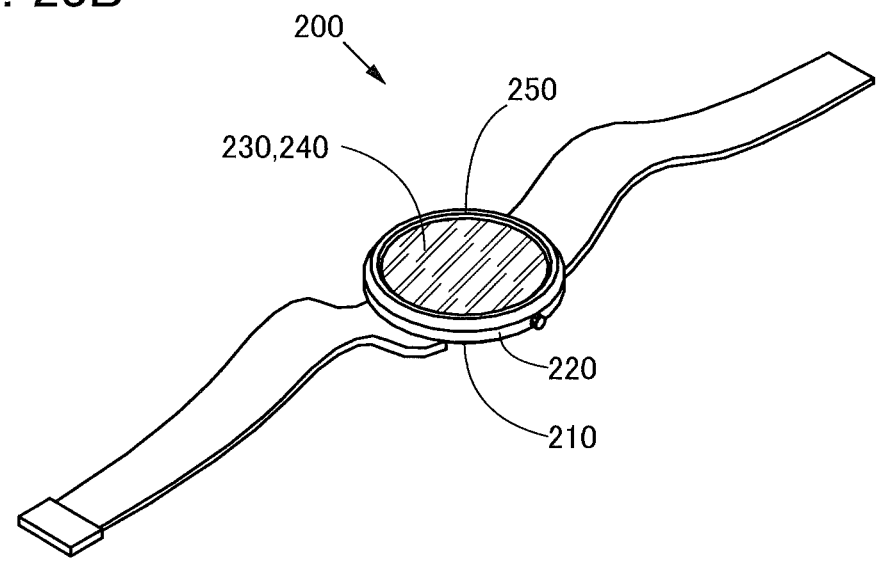

FIG. 23A is a block diagram illustrating a structure of an information processing device 200. FIG. 23B is a projection view illustrating an example of an external view of the information processing device 200.

Figure 24A:
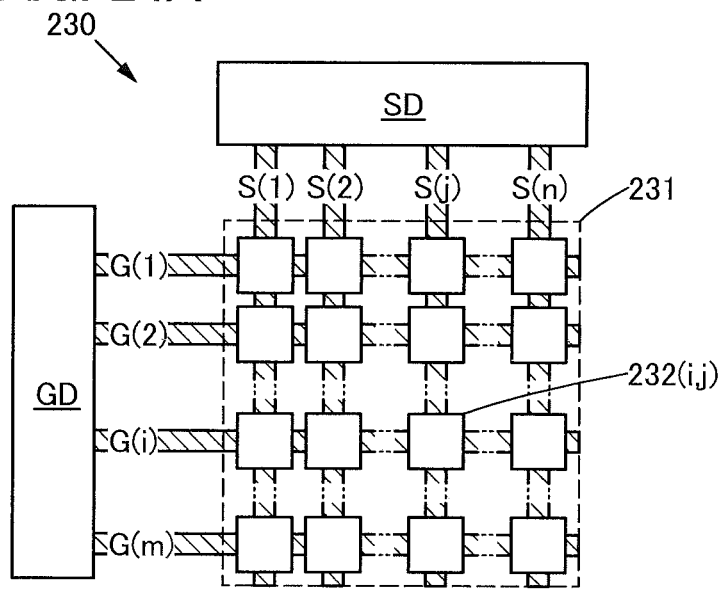
FIGS. 24A to 24C are block diagrams and a circuit diagram illustrating the structure of a display portion according to one embodiment of the present invention.
Figure 24B:
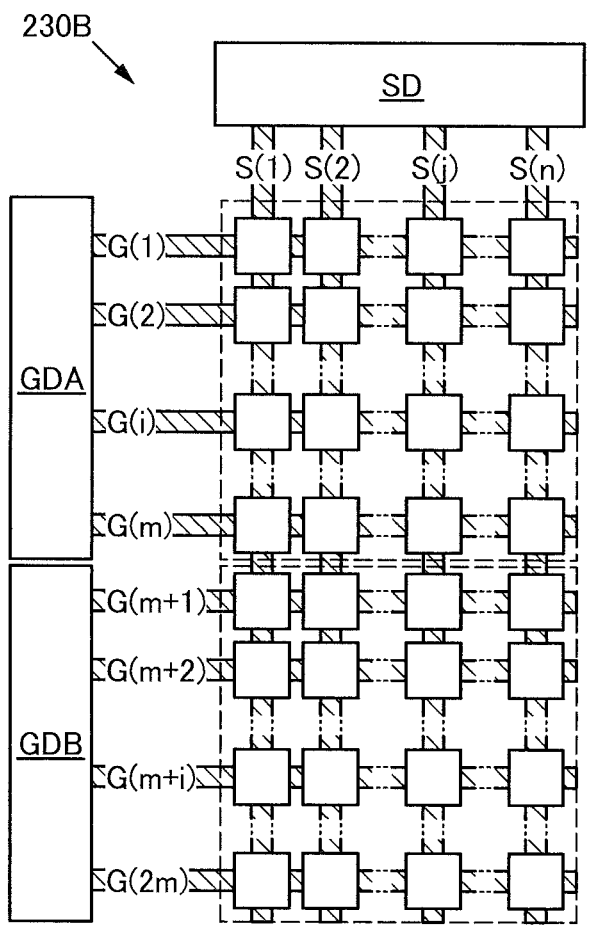
Figure 24C:
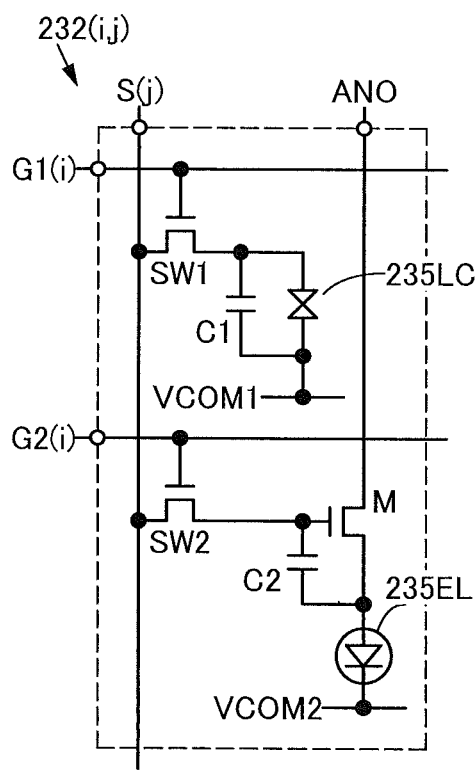

FIG. 24A is a block diagram illustrating a configuration of a display portion 230. FIG. 24B is a block diagram illustrating a configuration of a display portion 230B. FIG. 24C is a circuit diagram illustrating a configuration of a pixel 232(i,j).

Configuration Example of Information Processing Device

The information processing device 200 described in this embodiment includes an arithmetic device 210 and an input/output device 220 (see FIG. 23A).

The arithmetic device 210 is configured to receive positional information P1 and supply image information V and control information.

The input/output device 220 is configured to supply the positional information P1 and receive the image information V and the control information.

The input/output device 220 includes the display portion 230 that displays the image information V and an input portion 240 that supplies the positional information P1.

The display portion 230 includes a first display element and a second display element overlapping with the opening in the reflective film of the first display element. The display portion 230 further includes a first pixel circuit for driving the first display element and a second pixel circuit for driving the second display element.

The input portion 240 is configured to detect the position of a pointer and supply the positional information P1 determined in accordance with the position.

The arithmetic device 210 is configured to determine the moving speed of the pointer in accordance with the positional information P1.

The arithmetic device 210 is configured to determine the contrast or brightness of the image information V in accordance with the moving speed.

The information processing device 200 described in this embodiment includes the input/output device 220 that supplies the positional information P1 and receives the image information V and the arithmetic device 210 that receives the positional information P1 and supplies the image information V. The arithmetic device 210 is configured to determine the contrast or brightness of the image information V in accordance with the moving speed of the positional information P1.

With this structure, eyestrain on a user caused when the display position of image information is moved can be reduced, that is, eye-friendly display can be achieved. Moreover, the power consumption can be reduced and excellent visibility can be provided even in a bright place exposed to direct sunlight, for example. Thus, the novel information processing device that is highly convenient or reliable can be provided.

<Configuration>

The information processing device of one embodiment of the present invention includes the arithmetic device 210 or the input/output device 220.

<<Arithmetic Device 210>>

The arithmetic device 210 includes an arithmetic portion 211 and a memory portion 212. The arithmetic device 210 further includes a transmission path 214 and an input/output interface 215 (see FIG. 23A).

<<Arithmetic Portion 211>>

The arithmetic portion 211 is configured to, for example, execute a program. For example, a CPU described in Embodiment 8 can be used. Thus, power consumption can be sufficiently reduced.

<<Memory Portion 212>>

The memory portion 212 is configured to, for example, store the program executed by the arithmetic portion 211, initial information, setting information, an image, or the like.

Specifically, a hard disk, a flash memory, a memory including a transistor including an oxide semiconductor, or the like can be used for the memory portion 212.

<<Input/Output Interface 215, Transmission Path 214>>

The input/output interface 215 includes a terminal or a wiring and is configured to supply and receive information. For example, the input/output interface 215 can be electrically connected to the transmission path 214 and the input/output device 220.

The transmission path 214 includes a wiring and is configured to supply and receive information. For example, the transmission path 214 can be electrically connected to the input/output interface 215. In addition, the transmission path 214 can be electrically connected to the arithmetic portion 211 or the memory portion 212.

<<Input/Output Device 220>>

The input/output device 220 includes the display portion 230, the input portion 240, a sensor portion 250, or a communication portion 290.

<<Display Portion 230>>

The display portion 230 includes a display region 231, a driver circuit GD, and a driver circuit SD (see FIG. 24A). For example, the display panel described in Embodiment 1 or 2 can be used. Thus, low power consumption can be achieved.

The display region 231 includes a plurality of pixels 232($i$, $l$) to 232 ($i$, $n$) arranged in the row direction, a plurality of pixels 232($l,j$) to 232 ($m$, $j$) arranged in the column direction, a scan line G(i) electrically connected to the pixels 232($i$, $l$) to 232 ($i$, $n$), and a signal line S(j) electrically connected to the pixels 232($l,j$) to 232 ($m$, $j$). Note that i is an integer greater than or equal to 1 and less than or equal to m, j is an integer greater than or equal to 1 and less than or equal to n, and each of m and n is an integer greater than or equal to 1.

Note that the pixel 232($i,j$) is electrically connected to the scan line G1($i$), the scan line G2($i$), the signal line S(j), the wiring ANO, the wiring VCOM1, and the wiring VCOM2 (see FIG. 24C).

Note that the scan line G1($i$) includes the scan line G1($i$) and the scan line G2($i$) (see FIGS. 24A and 24B).

The display portion can include a plurality of driver circuits. For example, the display portion 230B can include a driver circuit GDA and a driver circuit GDB (see FIG. 24B).

<<Driver Circuit GD>>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, moving images can be smoothly displayed.

For example, the driver circuit GD is configured to supply a selection signal to one scan line at a frequency of lower than 30 Hz, preferably lower than 1 Hz, more preferably less than once per minute, in accordance with the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V.

<<Pixel 232($i,j$)>>

The pixel 232($i,j$) includes a first display element 235LC and a second display element 235EL overlapping with the opening in the reflective film of the first display element 235LC. The pixel 232($i,j$) further includes a first pixel circuit for driving the first display element 235LC and a second pixel circuit for driving the second display element 235EL (see FIG. 24C).

<<First Display Element 235LC>>

For example, a display element having a function of controlling light transmission can be used as the first display element 235LC. Specifically, a polarizing plate and a liquid crystal element, a MEMS shutter display element, or the like can be used.

Specifically, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

The first display element 235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction (also referred to as the vertical direction), the horizontal direction, or the diagonal direction of the liquid crystal layer.

For example, thermotropic liquid crystal, low-molecular liquid crystal, high-molecular liquid crystal, polymer dispersed liquid crystal, ferroelectric liquid crystal, anti-ferroelectric liquid crystal, or the like can be used. These liquid crystal materials exhibit a cholesteric phase, a smectic phase, a cubic phase, a chiral nematic phase, an isotropic phase, or the like depending on conditions. Alternatively, a liquid crystal material that exhibits a blue phase can be used.

<<Second Display Element 235EL>>

A display element having a function of emitting light, such as an organic EL element, can be used as the second display element 235EL.

Specifically, an organic EL element which emits white light can be used as the second display element 235EL. Alternatively, an organic EL element which emits blue light, green light, or red light can be used as the second display element 235EL.

<<Pixel Circuit>>

A pixel circuit including a circuit which is configured to drive the first display element 235LC and/or the second display element 235EL can be used.

For example, a pixel circuit which is electrically connected to the scan line G1($i$), the scan line G2($i$), the signal line S(j), the wiring ANO, the wiring VCOM1, and the wiring VCOM2 and which drives a light-emitting element and an organic EL element is described (see FIG. 24C).

Alternatively, for example, a switch, a transistor, a diode, a resistor, a capacitor, or an inductor can be used in the pixel circuit.

For example, one or a plurality of transistors can be used as a switch. Alternatively, a plurality of transistors connected in parallel, in series, or in combination of parallel connection and series connection can be used as a switch.

For example, a capacitor may be formed by the first electrode of the first display element 235LC and a conductive film having a region overlapping with the first electrode.

For example, the pixel circuit includes a transistor functioning as the switch SW1, the first display element 235LC, and the capacitor C1. A gate electrode of the transistor is electrically connected to the scan line G1 ($i$), and a first electrode of the transistor is electrically connected to the signal line S(j). A first electrode of the first display element 235LC is electrically connected to a second electrode of the transistor, and a second electrode of the first display element 235LC is electrically connected to the wiring VCOM1. A first electrode of the capacitor C1 is electrically connected to the second electrode of the transistor, and a second electrode of the capacitor C1 is electrically connected to the wiring VCOM1.

The pixel circuit includes the transistor functioning as the switch SW2. A gate electrode of the transistor is electrically connected to the scan line G2(i), a first electrode of the transistor is electrically connected to the signal line S(j). In addition, the pixel circuit includes the transistor M. A gate electrode of the transistor M is electrically connected to a second electrode of the transistor functioning as the switch SW2. A first electrode of the transistor M is electrically connected to the wiring ANO. In addition, the pixel circuit includes the capacitor C2. A first electrode of the capacitor C2 is electrically connected to the second electrode of the transistor functioning as the switch SW2. A second electrode of the capacitor C2 is electrically connected to the second electrode of the transistor M. In addition, the pixel circuit includes a second display element 235EL. A first electrode and a second electrode of the second display element 235EL are electrically connected to the second electrode of the transistor M and the wiring VCOM2, respectively.

<<Transistor>>

For example, a semiconductor film formed at the same step can be used for transistors in the driver circuit and the pixel circuit.

As the transistors in the driver circuit and the pixel circuit, bottom-gate transistors, top-gate transistors, or the like can be used.

For example, a manufacturing line for a bottom-gate transistor including amorphous silicon as a semiconductor can be easily remodeled into a manufacturing line for a bottom-gate transistor including an oxide semiconductor as a semiconductor. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 4 can be used. Specifically, a semiconductor containing silicon can be used for a semiconductor film. For example, single crystal silicon, polysilicon, microcrystalline silicon, or amorphous silicon can be used for the semiconductor of the transistor.

Note that the temperature for forming a transistor using polysilicon in a semiconductor is lower than the temperature for forming a transistor using single crystal silicon in a semiconductor.

In addition, the transistor using polysilicon in a semiconductor has higher field-effect mobility than the transistor using amorphous silicon in a semiconductor, and therefore a pixel including the transistor using polysilicon can have a high aperture ratio. Moreover, pixels arranged at a high density, a gate driver circuit, and a source driver circuit can be formed over the same substrate. As a result, the number of components included in an electronic device can be reduced.

In addition, the transistor using polysilicon in a semiconductor has higher reliability than the transistor using amorphous silicon in a semiconductor.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit in the transistor that uses an oxide semiconductor for the semiconductor film can hold an image signal for a longer time than a pixel circuit in a transistor that uses amorphous silicon for a semiconductor film. Specifically, the selection signal can be supplied at a frequency of lower than 30 Hz, preferably lower than 1 Hz, more preferably less than once per minute while flickering is suppressed. Consequently, eyestrain on a user of the information processing device can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Input Portion 240>>

A variety of human interfaces or the like can be used as the input portion 240 (see FIG. 12A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 250>>

The sensor portion 250 is configured to acquire information P2 by measuring the surrounding state.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image data is displayed using the first display element 235LC. When the arithmetic device 210 determines that it is dim, image data is displayed using the first display element 235LC and the second display element 235EL. When the arithmetic device 210 determines that it is dark, image data is displayed using the second display element 235EL.

Specifically, an image is displayed with a reflective display element and/or a self-luminous display element depending on the ambient brightness. For example, a liquid crystal element and an organic EL element can be used as the reflective display element and the self-luminous display element, respectively.

Thus, image information can be displayed in such a manner that, for example, a reflective display element is used under strong ambient light, a reflective display element and a self-luminous display element are used in dim light, and a self-luminous display element is used in dark light. Thus, a novel display device with high visibility and low power consumption can be provided. A novel data processor which is highly convenient or reliable can be provided.

For example, a sensor measuring chromaticity of ambient light, such as a CCD camera, can be used in the sensor portion 250, white balance can be adjusted in accordance with the chromaticity of ambient light measured by the sensor portion 250.

Specifically, in the first step, imbalance disruption of white balance of ambient light is measured.

In the second step, the intensity of light of a color which is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel data processor which can display an image with low power consumption or with adjusted white balance and which is highly convenient and reliable can be provided.

<<Communication Portion 290>>

The communication portion 290 is configured to supply and acquire information to/from a network.

<<Program>>

A program of one embodiment of the present invention will be described with reference to FIGS. 25A and 25B and FIG. 26.

Figure 25A:
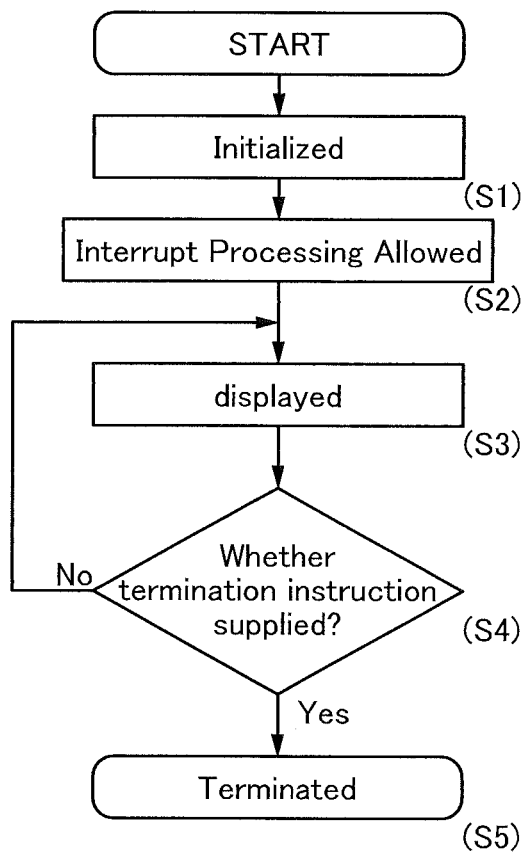
FIGS. 25A and 25B are flow charts illustrating a program according to one embodiment of the present invention.
Figure 25B:
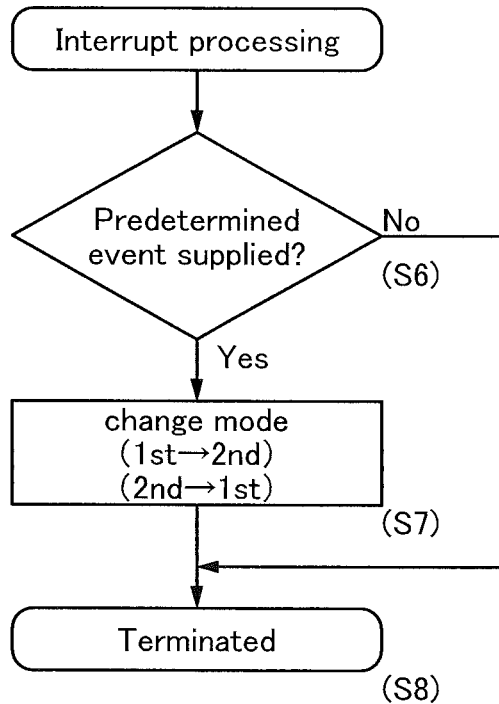

FIG. 25A is a flow chart showing main processing of the program of one embodiment of the present invention, and FIG. 25B is a flow chart showing interrupt processing.

Figure 26:
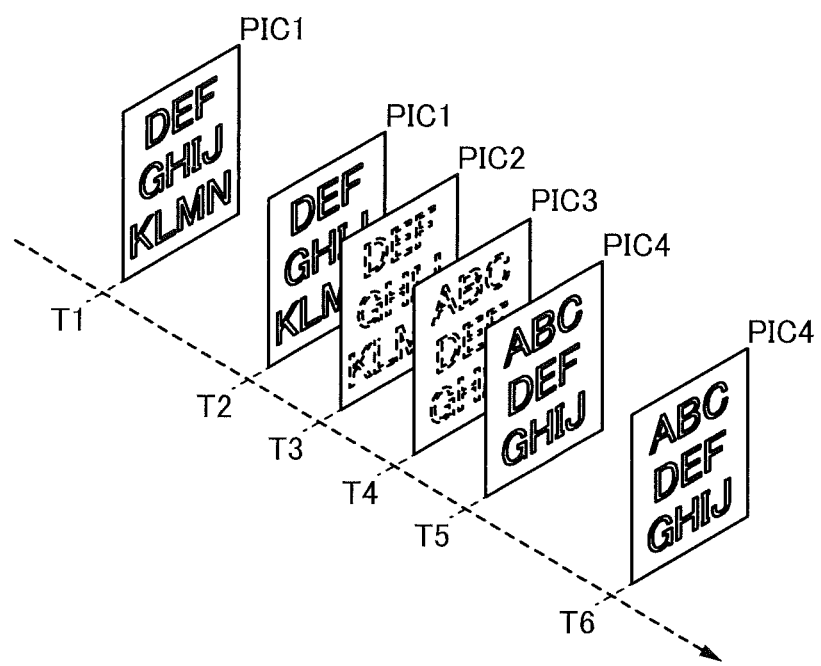
FIG. 26 schematically illustrates image information according to one embodiment of the present invention.

FIG. 26 schematically illustrates a method for displaying image information on the display portion 230.

The program of one embodiment of the present invention has the following steps (see FIG. 25A).

In a first step, setting is initialized (see (S1) in FIG. 25A).

For instance, predetermined image information and the second mode can be used for the initialization.

For example, a still image can be used as the predetermined image information. Alternatively, a mode in which the selection signal is supplied at a frequency of lower than 30 Hz, preferably lower than 1 Hz, more preferably less than once per minute can be used as the second mode. For example, in the case where the time is displayed on the data processor on the second time scale, a mode in which the selection signal is supplied at a frequency of 1 Hz can be used as the second mode. In the case where the time is displayed on the data processor on the minute time scale, a mode in which the selection signal is supplied once per minute can be used as the second mode.

In a second step, interrupt processing is allowed (see S2 in FIG. 25A). Note that an arithmetic device allowed to execute the interrupt processing can perform the interrupt processing in parallel with the main processing. The arithmetic device which has returned from the interrupt processing to the main processing can reflect the results of the interrupt processing in the main processing. For example, in the case where the time is displayed on the information processing device on the second time scale, a mode in which the selection signal is supplied at a frequency of 1 Hz can be used as the second mode. In the case where the time is displayed on the information processing device on the minute time scale, a mode in which the selection signal is supplied once per minute can be used as the second mode.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

In a third step, image information is displayed in a mode selected in the first step or the interrupt processing (see S3 in FIG. 25A).

For instance, predetermined image information is displayed in the second mode, in accordance with the initialization.

Specifically, the predetermined image information is displayed in a mode in which the selection signal is supplied to one scan line at a frequency of lower than 30 Hz, preferably lower than 1 Hz, more preferably less than once per minute.

For example, the selection signal is supplied at Time T1 so that first image information PIC1 is displayed on the display portion 230 (see FIG. 26). At Time T2, which is, for example, one second after Time T1, the selection signal is supplied so that the predetermined image information is displayed.

Alternatively, in the case where a predetermined event is not supplied in the interrupt processing, image information is displayed in the second mode.

For example, the selection signal is supplied at Time T5 so that fourth image information PIC4 is displayed on the display portion 230. At Time T6, which is, for example, one second after Time T5, the selection signal is supplied so that the same image information is displayed. Note that the length of a period from Time T5 to Time T6 can be equal to that of a period from Time T1 to Time T2.

For instance, in the case where the predetermined event is supplied in the interrupt processing, predetermined image information is displayed in the first mode.

Specifically, in the case where an event associated with a "page turning instruction" is supplied in the interrupt processing, image information is switched from one to another in a mode in which the selection signal is supplied to one scan line at a frequency of 30 Hz or higher, preferably 60 Hz or higher.

Alternatively, in the case where an event associated with the "scrolling instruction" is supplied in the interrupt processing, second image information PIC2, which includes part of the displayed first image information PIC1 and the following part, is displayed in a mode in which the selection signal is supplied to one scan line at a frequency of 30 Hz or higher, preferably 60 Hz or higher.

Thus, for example, moving images in which images are gradually switched in accordance with the "page turning instruction" can be displayed smoothly. Alternatively, a moving image in which an image is gradually moved in accordance with the "scrolling instruction" can be displayed smoothly.

Specifically, the selection signal is supplied at Time T3 after the event associated with the "scrolling instruction" is supplied so that the second image information PIC2 whose display position and the like are changed from those of the first image information PIC1 is displayed (see FIG. 26). The selection signal is supplied at Time T4 so that third image information PIC3 whose display position and the like are changed from those of the second image information PIC2 is displayed. Note that each of a period from Time T2 to Time T3, a period from Time T3 to Time T4, and a period from Time T4 to Time T5 is shorter than the period from Time T1 to Time T2.

In the fourth step, the program moves to the fifth step when a termination instruction is supplied, and the program moves to the third step when the termination instruction is not supplied (see S4 in FIG. 25A).

Note that in the interrupt processing, for example, the termination instruction can be supplied.

In the fifth step, the program terminates (see S5 in FIG. 25A).

The interrupt processing includes sixth to eighth steps described below (see FIG. 25B).

In the sixth step, the processing proceeds to the seventh step when a predetermined event has been supplied, whereas the processing proceeds to the eighth step when the predetermined event has not been supplied (see S6 in FIG. 25B).

For example, whether the predetermined event is supplied in a predetermined period or not can be a branch condition. Specifically, the predetermined period can be longer than 0 seconds and shorter than or equal to 5 seconds, preferably shorter than or equal to 1 second, further preferably shorter than or equal to 0.5 seconds, still further preferably shorter than or equal to 0.1 seconds.

For example, the predetermined event can include an event associated with the termination instruction.

In the seventh step, the mode is changed (see S7 in FIG. 25B). Specifically, the mode is changed to the second mode when the first mode has been selected, or the mode is changed to the first mode when the second mode has been selected.

In the eighth step, the interrupt processing terminates (see S8 in FIG. 25B).

<<Predetermined Event>>

A variety of instructions can be associated with a variety of events.

The following instructions can be given as examples: "page-turning instruction" for switching displayed image information from one to another and "scroll instruction" for moving the display position of part of image information and displaying another part continuing from that part.

For example, the following events can be used: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as parameters assigned to an instruction associated with the predetermined event.

Specifically, a parameter that determines the page-turning speed or the like can be used to execute the "page-turning instruction," and a parameter that determines the moving speed of the display position or the like can be used to execute the "scroll instruction."

For example, the display brightness, contrast, or saturation may be changed in accordance with the page-turning speed and/or the scroll speed.

Specifically, in the case where the page-turning speed and/or the scroll speed are/is higher than the predetermined speed, the display brightness may be decreased in synchronization with the speed.

Alternatively, in the case where the page-turning speed and/or the scroll speed are/is higher than the predetermined speed, the contrast may be decreased in synchronization with the speed.

For example, the speed at which user's eyes cannot follow displayed images can be used as the predetermined speed.

The contrast can be reduced in such a manner that the gray level of a bright region (with a high gray level) included in image information is brought close to the gray level of a dark region (with a low gray level) included in the image information.

Alternatively, the contrast can be reduced in such a manner that the gray level of the dark region included in image information is brought close to the gray level of the bright region included in the image information.

Specifically, in the case where the page-turning speed and/or the scroll speed are/is higher than the predetermined speed, display may be performed such that the yellow tone is increased or the blue tone is decreased in synchronization with the speed.

Image information may be generated based on the usage ambience of the information processing device 200 acquired by the sensor portion 250. For example, a color selected from user's selections in accordance with the acquired ambient brightness or the like can be used as the background color of the image information (see FIG. 23B). Thus, favorable environment can be provided for a user of the information processing device 200.

Image information may be generated in accordance with received information distributed among a specific space using the communication portion 290. For example, educational materials can be distributed among a classroom and displayed to be used as a school book. Alternatively, materials transmitted among a conference room in a company can be received and displayed.

This embodiment can be combined with any of the other embodiments in this specification as appropriate.

Embodiment 8

In this embodiment, a semiconductor device (memory device) that can retain stored data even when not powered and that has an unlimited number of write cycles, and a CPU including the semiconductor device will be described. The CPU described in this embodiment can be used for the information processing device described in Embodiment 7, for example.

<Memory Device>

Figure 27A:
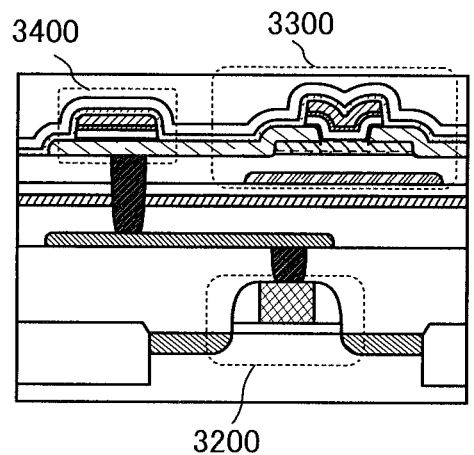
FIGS. 27A to 27C are a cross-sectional view and circuit diagrams illustrating the structure of a semiconductor device according to one embodiment of the present invention.
Figure 27B:
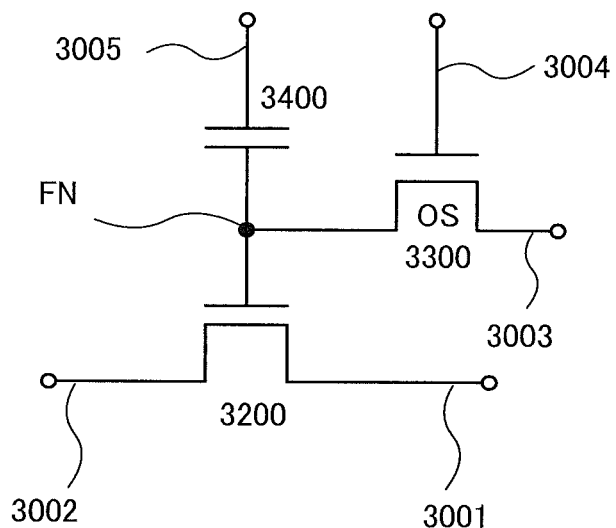
Figure 27C:
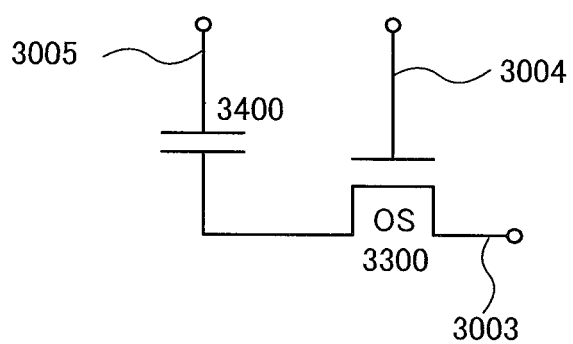

An example of a semiconductor device (memory device) which can retain stored data even when not powered and which has an unlimited number of write cycles is shown in FIGS. 27A to 27C. Note that FIG. 27B is a circuit diagram of the structure in FIG. 27A.

The semiconductor device illustrated in FIGS. 27A and 27B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 27B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 27A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 which is needed to turn on the transistor 3200. Thus, the potential of the fifth wiring 3005 is set to a potential $V_0$ which is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. On the other hand, in the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 27C is different from the semiconductor device illustrated in FIG. 27A in that the transistor 3200 is not provided. Also in this case, writing and retaining operation of data can be performed in a manner similar to the semiconductor device illustrated in FIG. 27A.

Next, reading of data of the semiconductor device illustrated in FIG. 27C is described. When the transistor 3300 is turned on, the third wiring 3003 which is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0) (C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), in addition to a central processing unit (CPU), and a radio frequency identification (RF-ID) tag, for example.

<CPU>

A CPU including the above memory device is described below.

Figure 28:
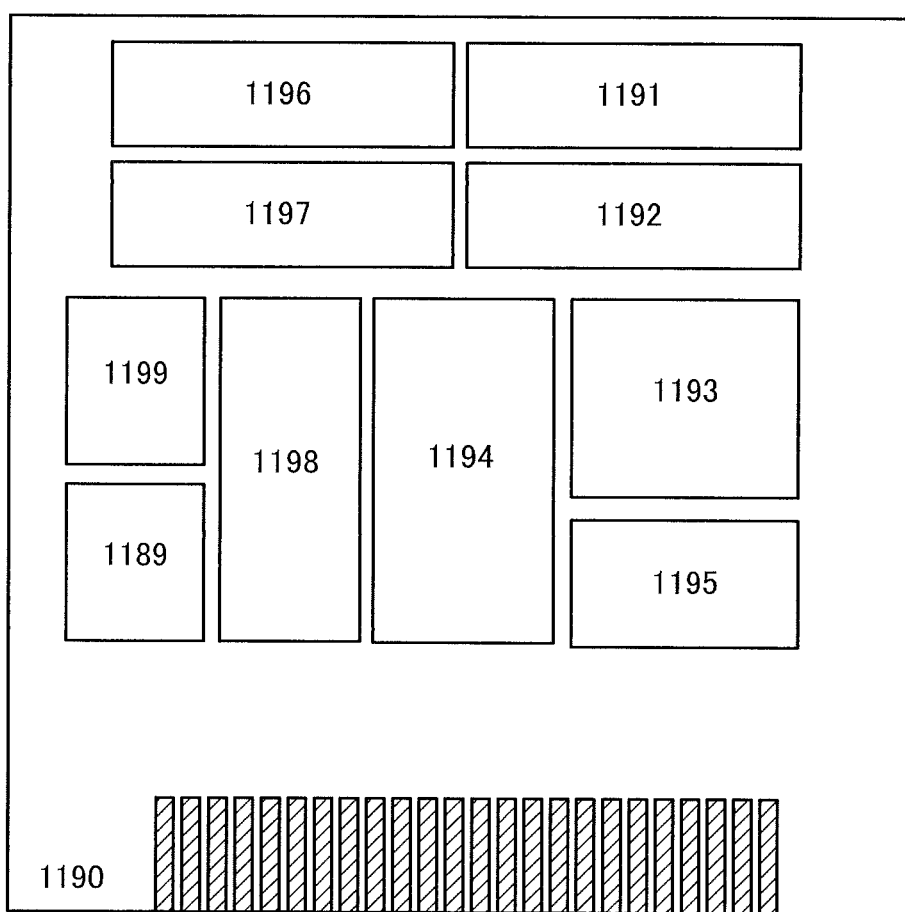
FIG. 28 is a block diagram illustrating the structure of a CPU according to one embodiment of the present invention.

FIG. 28 is a block diagram illustrating a configuration example of the CPU including the above memory device.

The CPU illustrated in FIG. 28 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface (BUS I/F) 1198, a rewritable ROM 1199, and a ROM interface (ROM I/F) 1189. A semiconductor substrate, an SOI substrate, a glass substrate, or the like is used as the substrate 1190. The ROM 1199 and the ROM interface 1189 may be provided over a separate chip. Needless to say, the CPU in FIG. 28 is just an example in which the configuration is simplified, and an actual CPU may have a variety of configurations depending on the application. For example, the CPU may have the following configuration: a structure including the CPU illustrated in FIG. 28 or an arithmetic circuit is considered as one core; a plurality of the cores are included; and the cores operate in parallel. The number of bits that the CPU can process in an internal arithmetic circuit or in a data bus can be, for example, 8, 16, 32, or 64.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal on the basis of a reference clock signal, and supplies the internal clock signal to the above circuits.

In the CPU illustrated in FIG. 28, a memory cell is provided in the register 1196.

In the CPU illustrated in FIG. 28, the register controller 1197 selects operation of retaining data in the register 1196 in accordance with an instruction from the ALU 1191. That is, the register controller 1197 selects whether data is retained by a flip-flop or by a capacitor in the memory cell included in the register 1196. When data retaining by the flip-flop is selected, a power supply voltage is supplied to the memory cell in the register 1196. When data retaining by the capacitor is selected, the data is rewritten in the capacitor, and supply of the power supply voltage to the memory cell in the register 1196 can be stopped.

Figure 29:
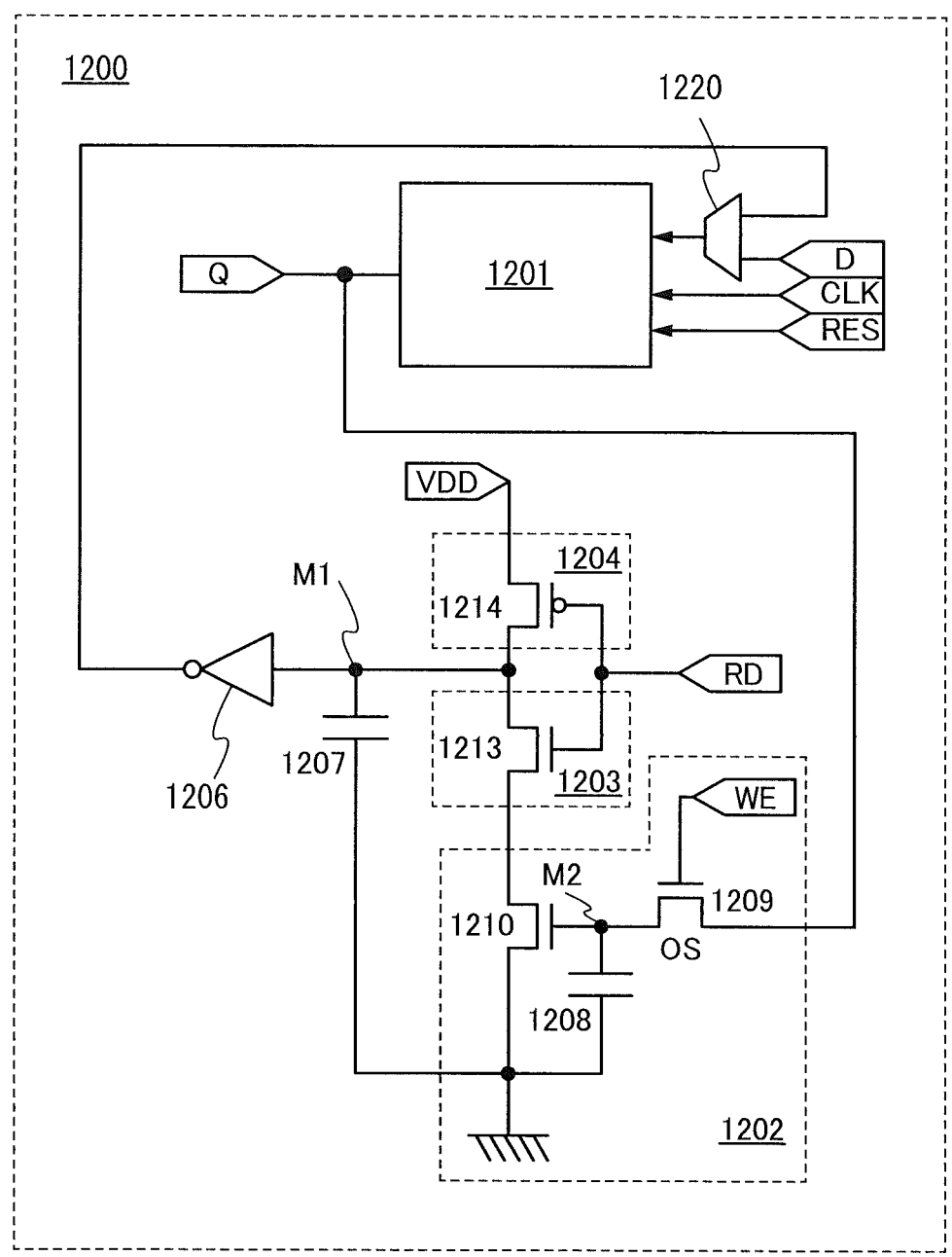
FIG. 29 is a circuit diagram illustrating the structure of a storage element according to one embodiment of the present invention.

FIG. 29 is an example of a circuit diagram of a memory element that can be used for the register 1196. A memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, a ground potential (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a wiring that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a wiring that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the wiring that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the wiring that can supply a low power supply potential (e.g., a GND line).

The capacitor 1207 and the capacitor 1208 are not necessarily provided as long as the parasitic capacitance of the transistor, the wiring, or the like is actively utilized.

A control signal WE is input to a first gate (first gate electrode) of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 29 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 29, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 29, the transistors included in the memory element 1200 except for the transistor 1209 can each be a transistor in which a channel is formed in a layer formed using a semiconductor other than an oxide semiconductor or in the substrate 1190. For example, the transistor can be a transistor whose channel is formed in a silicon layer or a silicon substrate. Alternatively, a transistor in which a channel is formed in an oxide semiconductor film can be used for all the transistors in the memory element 1200. Further alternatively, in the memory element 1200, a transistor in which a channel is formed in an oxide semiconductor film can be included besides the transistor 1209, and a transistor in which a channel is formed in a layer formed using a semiconductor other than an oxide semiconductor or the substrate 1190 can be used for the rest of the transistors.

As the circuit 1201 in FIG. 29, for example, a flip-flop circuit can be used. As the logic element 1206, for example, an inverter or a clocked inverter can be used.

In a period during which the memory element 1200 is not supplied with the power supply voltage, the semiconductor device described in this embodiment can retain data stored in the circuit 1201 by the capacitor 1208 that is provided in the circuit 1202.

The off-state current of a transistor in which a channel is formed in an oxide semiconductor film is extremely small. For example, the off-state current of a transistor in which a channel is formed in an oxide semiconductor film is significantly smaller than that of a transistor in which a channel is formed in silicon having crystallinity. Thus, when the transistor in which a channel is formed in an oxide semiconductor film is used as the transistor 1209, a signal is retained in the capacitor 1208 for a long time also in a period during which the power supply voltage is not supplied to the memory element 1200. The memory element 1200 can accordingly retain the stored content (data) also in a period during which the supply of the power supply voltage is stopped.

Since the memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Thus, after supply of the power supply voltage to the memory element 1200 is restarted, the signal retained by the capacitor 1208 can be converted into the one corresponding to the state (the on state or the off state) of the transistor 1210 to be read from the circuit 1202. Consequently, an original signal can be accurately read even when a potential corresponding to the signal retained by the capacitor 1208 changes to some degree.

By using the above-described memory element 1200 in a memory device such as a register or a cache memory included in a processor, data in the memory device can be prevented from being lost owing to the stop of the supply of the power supply voltage. Furthermore, shortly after the supply of the power supply voltage is restarted, the memory device can be returned to the same state as that before the power supply is stopped. Thus, the power supply can be stopped even for a short time in the processor or one or a plurality of logic circuits included in the processor, resulting in lower power consumption.

Although the memory element 1200 is used in a CPU in this embodiment, the memory element 1200 can also be used in an LSI such as a digital signal processor (DSP), a custom LSI, or a programmable logic device (PLD), and a radio frequency identification (RF-ID).

At least part of this embodiment can be implemented in combination with any of the other embodiments described in this specification as appropriate.

Embodiment 9

In this embodiment, a display module and electronic devices which include a reflective display device of one embodiment of the present invention will be described with reference to FIGS. 30A to 30H.

FIGS. 30A to 30G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 30A:
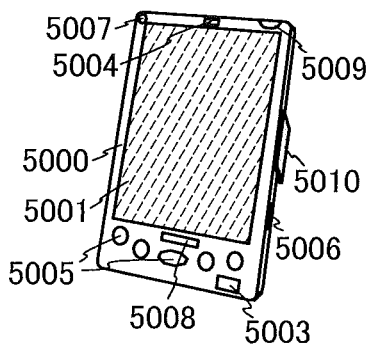
FIGS. 30A to 30H illustrate the structures of electronic devices according to one embodiment of the present invention.
Figure 30B:
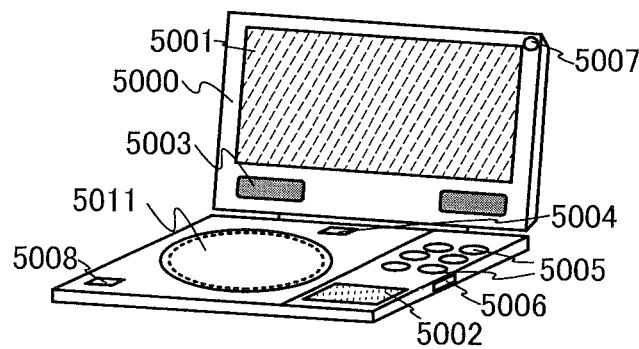
Figure 30C:
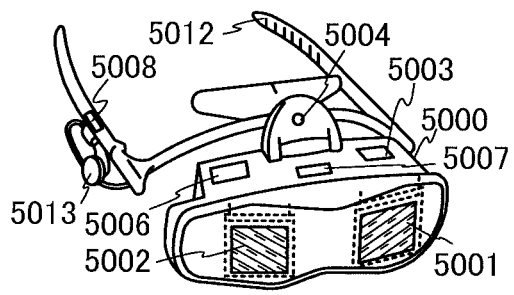
Figure 30D:
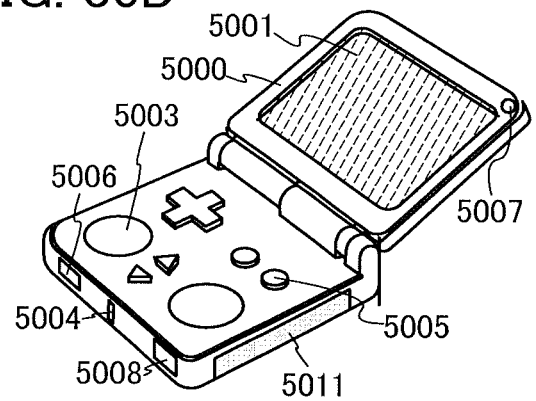
Figure 30E:
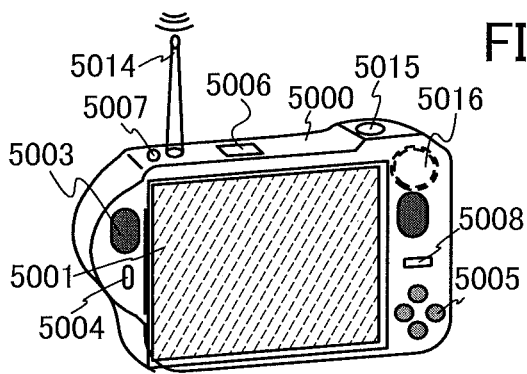
Figure 30F:
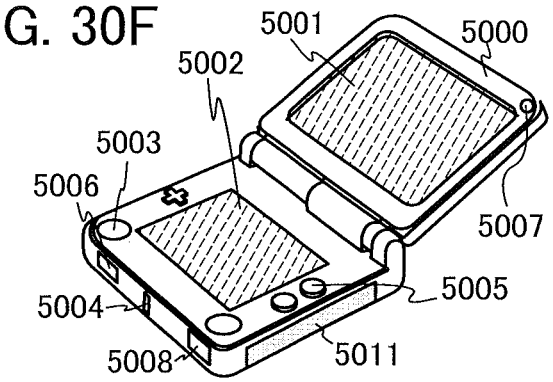
Figure 30G:
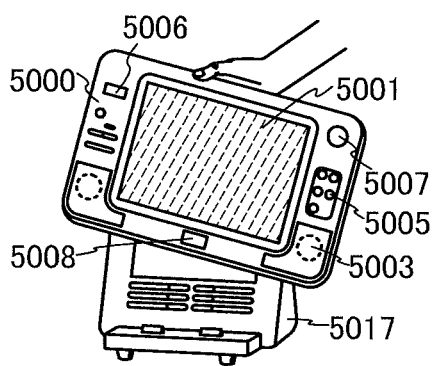

FIG. 30A illustrates a mobile computer which can include a switch 5009, an infrared port 5010, and the like in addition to the above components. FIG. 30B illustrates a portable image reproducing device (e.g., a DVD reproducing device) provided with a recording medium, and the portable image reproducing device can include a second display portion 5002, a recording medium reading portion 5011, and the like in addition to the above components. FIG. 30C illustrates a goggle-type display which can include the second display portion 5002, a support portion 5012, an earphone 5013, and the like in addition to the above components. FIG. 30D illustrates a portable game console which can include the recording medium reading portion 5011 and the like in addition to the above components. FIG. 30E illustrates a digital camera with a television reception function, and the digital camera can include an antenna 5014, a shutter button 5015, an image receiving portion 5016, and the like in addition to the above components. FIG. 30F illustrates a portable game console which can include the second display portion 5002, the recording medium reading portion 5011, and the like in addition to the above components. FIG. 30G illustrates a portable television receiver which can include a charger 5017 capable of transmitting and receiving signals, and the like in addition to the above components.

The electronic devices in FIGS. 30A to 30G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 30A to 30G are not limited thereto, and the electronic devices can have a variety of functions.

Figure 30H:
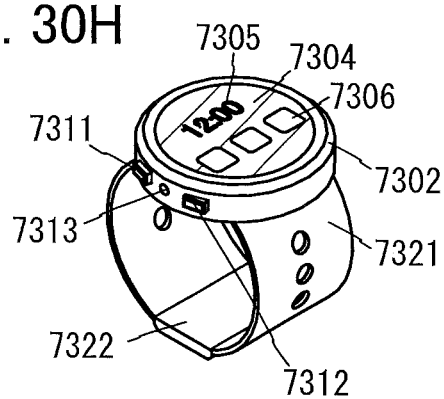

FIG. 30H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 30H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

Example 1

In this example, a fabricated display panel of one embodiment of the present invention will be described with reference to FIGS. 31A1 to 31C.

FIGS. 31A to 31C are photos of the fabricated display panel displaying images. FIGS. 31A1 to 31A3 and FIG. 31C are photos for showing the display quality of the display panel when the first display element was used. FIGS. 31B1 to 31B3 are photos for showing the display quality of the display panel when the second display element was used.

Table 1 shows the specifications of the fabricated display panel.

TABLE 1

| | |
|---|---|
| Panel size | 1.55 inch |
| Effective pixels | 320 × RGB (H) × 320 (V) |
| Pixel size | 29 μm (H) × 87 μm (V) |
| Resolution | 292 ppi |
| First display element | Reflective liquid crystal element (ECB mode) |
| Second display element | Organic EL element (Bottom emission) |
| Pixel circuit | LCD: 1Tr + 1 C |
| | EL: 2Tr + 1 C |
| Aperture ratio | LCD: 69% |
| | EL: 3.9% |
| Scan line driver circuit | incorporated |
| Signal line driver circuit | COF |

A reflective liquid crystal element of an electrically controlled birefringence (ECB) mode was used as the first display element included in the fabricated display panel, which is one embodiment of the present invention. A white-light-emitting organic EL element was used as the second display element.

The fabricated display panel included a coloring layer having regions overlapping with the first display element and the second display element. Full-color display was performed utilizing light passing through the coloring layer.

<<Evaluation>>

The display panel made displays using the first display element in a light room equipped with a fluorescent lamp (see FIGS. 31A1 to 31A3). The display panel offered good fall-color display using the reflective liquid crystal element.

In addition, using the first display element, the display panel performed display outdoors in fine weather during the daytime (see FIG. 31C). Even under such strong ambient light, the display panel offered good full-color display using the reflective liquid crystal element.

The display panel performed display in a dark place using the second display element (see FIGS. 31B1 to 31B3). The display panel offered good full-color display using the organic EL element.

In this specification and the like, for example, when it is explicitly described that X and Y are connected, the case where X and Y are electrically connected, the case where X and Y are functionally connected, and the case where X and Y are directly connected are included therein. Accordingly, another element may be interposed between elements having a connection relation shown in drawings and texts, without limiting to a predetermined connection relation, for example, the connection relation shown in the drawings and the texts.

Here, X and Y each denote an object (e.g., a device, an element, a circuit, a line, an electrode, a terminal, a conductive film, or a layer).

For example, in the case where X and Y are directly connected, an element that enables electrical connection between X and Y (e.g., a switch, a transistor, a capacitor, an inductor, a resistor, a diode, a display element, a light-emitting element, or a load) is not connected between X and Y, and X and Y are connected without the element that enables electrical connection between X and Y (e.g., a switch, a transistor, a capacitor, an inductor, a resistor, a diode, a display element, a light-emitting element, or a load) provided therebetween.

For example, in the case where X and Y are electrically connected, one or more elements that enable electrical connection between X and Y (e.g., a switch, a transistor, a capacitor, an inductor, a resistor, a diode, a display element, a light-emitting element, or a load) can be connected between X and Y. A switch is controlled to be on or off. That is, a switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable functional connection between X and Y (e.g., a logic circuit such as an inverter, a NAND circuit, or a NOR circuit; a signal converter circuit such as a DA converter circuit, an AD converter circuit, or a gamma correction circuit; a potential level converter circuit such as a power source circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, or a buffer circuit; a signal generation circuit; a memory circuit; and/or a control circuit) can be connected between X and Y. Note that for example, in the case where a signal output from X is transmitted to Y even when another circuit is interposed between X and Y, X and Y are functionally connected. Note that the case where X and Y are functionally connected includes the case where X and Y are directly connected and the case where X and Y are electrically connected.

Note that when it is explicitly described that X and Y are electrically connected, the case where X and Y are electrically connected (i.e., the case where X and Y are connected with another element or another circuit provided therebetween), the case where X and Y are functionally connected (i.e., the case where X and Y are functionally connected with another circuit provided therebetween), and the case where X and Y are directly connected (i.e., the case where X and Y are connected without another element or another circuit provided therebetween) are included therein. That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit structure is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path". Another example of the expression is "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path". Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXPLANATION OF REFERENCE

ACF1: conductive material, ACF2: conductive material, AF1: alignment film, AF2: alignment film, ANO: wiring, C1: capacitor, C2: capacitor, CF1: coloring film, CF2: coloring film, CP: conductive member, CS: wiring, G: scan line, G1: scan line, G2: scan line, GD: driver circuit, SD: driver circuit, GDA: driver circuit, GDB: driver circuit, KB1: structure, KB2: structure, KB3: structure, M: transistor, MB: transistor, MD: transistor, MDB: transistor, M1: node, M2: node, P1: positional information, P2: information, SW1: switch, SW2: switch, T1: time, T2: time, T3: time, T4: time, T5: time, T6: time, V: image data, V0: potential, V1: potential, VCOM1: wiring, VCOM2: wiring, VDD: power supply potential, FPC1: flexible printed circuit board, FPC2: flexible printed circuit board, PIC1: image data, PIC2: image data, PIC3: image data, PIC4: image data, 100: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 118: insulating film, 120a: conductive film, 120b: conductive film, 150: transistor, 200: data processor, 210: arithmetic device, 211: arithmetic portion, 212: memory portion, 214: transmission path, 215: input/output interface, 220: input/output device, 230: display portion, 230B: display portion, 231: display region, 232: pixel, 235EL: display element, 235LC: display element, 240: input portion, 250: sensor portion, 290: communication portion, 501A: insulating film, 501B: insulating film, 501C: insulating film, 501D: insulating film, 504: conductive film, 504C: contact, 505: bonding layer, 506: insulating film, 508: semiconductor film, 510: substrate, 510W: separation film, 511: wiring, 512A: conductive film, 512B: conductive film, 516: insulating film, 518: insulating film, 520: functional layer, 519: terminal, 519B: terminal, 519D: terminal, 520D: functional layer, 521A: insulating film, 521B: insulating film, 524: conductive film, 528: insulating film, 550: display element, 550B: display element, 551: conductive film, 552: conductive film, 553: layer containing a light-emitting organic compound, 553B: layer containing a light-emitting organic compound, 570: substrate, 570B: insulating film, 591: contact, 592: contact, 593: contact, 700: display panel, 700B: display panel, 700C: display panel, 700D: display panel, 700E: display panel, 700F: display panel, 702: pixel, 704: conductive film, 704C: contact, 705: sealant, 719: terminal, 730: pixel circuit, 750: display element, 751: conductive film, 751T: conductive film, 751H: opening, 752: conductive film, 752C: conductive film, 753: layer containing a liquid crystal material, 7531: layer containing electronic ink, 770: substrate, 770P: optical film, 771: insulating film, 800: input/output device, 801: upper cover, 802: lower cover, 803: FPC, 804: touch sensor, 805: FPC, 806: display panel, 809: frame, 810: driver circuit, 811: battery, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, 7322: clasp.

This application is based on Japanese Patent Application serial no. 2015-081519 filed with Japan Patent Office on Apr. 13, 2015, Japanese Patent Application serial no. 2015-115638 filed with Japan Patent Office on Jun. 8, 2015, and Japanese Patent Application serial no. 2015-150202 filed with Japan Patent Office on Jul. 30, 2015, the entire contents of which are hereby incorporated by reference.

The invention claimed is:
1. A semiconductor device comprising:
a first transistor;
a second transistor;
a third transistor;
a first capacitor;
a second capacitor;
a first display element;
a second display element;
a first wiring;
a second wiring;
a third wiring;
a fourth wiring; and
a fifth wiring,
wherein one of source and drain of the first transistor is electrically connected to the first wiring, wherein a gate of the first transistor is electrically connected to the second wiring,
wherein the other of the source and the drain of the first transistor is electrically connected to the first display element and one of electrodes of the first capacitor,
wherein the other of electrodes of the first capacitor is electrically connected to the fourth wiring and the first display element,
wherein one of the source and the drain of the second transistor is electrically connected to a gate of the third transistor and one of electrodes of the second capacitor,
wherein one of source and drain of the third transistor is electrically connected to the third wiring,
wherein the other of the source and the drain of the third transistor is electrically connected to the other of electrodes of the second capacitor and the second display element, and
wherein the fifth wiring is electrically connected to the second display element.

2. The semiconductor device according to claim 1, further comprising a sixth wiring,
wherein a gate of the second transistor is electrically connected to the sixth wiring, and
wherein the other of source and drain of the second transistor is electrically connected to the first wiring.

3. The semiconductor device according to claim 1, further comprising:
a sixth wiring; and
a seventh wiring,
wherein a gate of the second transistor is electrically connected to the sixth wiring, and
wherein the other of source and drain of the second transistor is electrically connected to the seventh wiring.

4. The semiconductor device according to claim 1, further comprising a sixth wiring,
wherein the other of source and drain of the second transistor is electrically connected to the sixth wiring, and
wherein a gate of the second transistor is electrically connected to the second wiring.

5. The semiconductor device according to claim 1, further comprising a driver circuit,
wherein the driver circuit is electrically connected to the second wiring.

6. An information processing device comprising:
an arithmetic device comprising a memory portion that stores a program; and
an input/output device,
wherein the arithmetic device is configured to receive positional information and supply image information and control information,
wherein the input/output device is configured to supply the positional information and receive the image information and the control information,
wherein the input/output device comprises a display portion that displays the image information and an input portion that supplies the positional information,
wherein the display portion comprises the semiconductor device according to claim 1,
wherein the input portion is configured to detect a position of a pointer and supply positional information determined in accordance with the position,
wherein the arithmetic device is configured to determine a moving speed of the pointer in accordance with the positional information, and
wherein the arithmetic device is configured to adjust a contrast or brightness of the image information in accordance with the moving speed of the pointer.

7. The information processing device according to claim 6,
wherein a contrast is reduced in such a manner that a gray level of a bright region included in the image information is brought close to a gray level of a dark region included in the image information.

8. The information processing device according to claim 6, wherein the program comprises:
a first step of initializing setting;
a second step of allowing interrupt processing;
a third step of displaying image information in a first or second mode selected in the first step or the interrupt processing;
a fourth step of determining to move to a fifth step when a termination instruction is supplied and to move to the third step when the termination instruction is not supplied; and
the fifth step of terminating the program,
wherein the interrupt processing comprises sixth to eighth steps:
the sixth step of determining to move to the seventh step when a predetermined event is supplied and to move to the eighth step when the predetermined event is not supplied;
the seventh step of changing a mode; and
the eighth step of terminating the interrupt processing, and
wherein in the first mode in the third step, a contrast of image information when a moving speed of a pointer is higher than a predetermined speed is lower than a contrast of image information when the moving speed of the pointer is lower than the predetermined speed.

9. The semiconductor device according to claim 1, further comprising:
a display panel; and
a touch sensor overlapped with the display panel.

10. The semiconductor device according to claim 1,
wherein the first display element is a reflective liquid crystal element,
wherein the semiconductor device is configured to supply a selection signal at a first mode or a second mode, and
wherein a frequency of second mode is lower than that of the first mode.

11. The semiconductor device according to claim 10,
wherein the first transistor comprises oxide metal.

12. An electronic device comprising:
the semiconductor device according to claim 1, and
at least one of a switch, an infrared port, an antenna, a shutter button, or an image receiving portion.

13. A semiconductor device comprising:
a first transistor;
a second transistor;
a third transistor;
a first capacitor;
a second capacitor;
a first display element;
a second display element;
a first wiring;
a second wiring;
a third wiring;
a fourth wiring;
a fifth wiring;
a sixth wiring; and
a seventh wiring, wherein one of source and drain of the first transistor is electrically connected to the first wiring,
wherein a gate of the first transistor is electrically connected to the second wiring,
wherein the other of the source and the drain of the first transistor is electrically connected to the first display element and one of electrodes of the first capacitor,
wherein the other of electrodes of the first capacitor is electrically connected to the seventh wiring,
wherein the fifth wiring is electrically connected to the first display element,
wherein one of source and drain of the second transistor is electrically connected to the first wiring,
wherein a gate of the second transistor is electrically connected to the third wiring,
wherein the other of the source and the drain of the second transistor is electrically connected to a gate of the third transistor and one of electrodes of the second capacitor,
wherein one of source and drain of the third transistor is electrically connected to the fourth wiring,
wherein the other of the source and the drain of the third transistor is electrically connected to the other of electrodes of the second capacitor and the second display element, and
wherein the sixth wiring is electrically connected to the second display element.

14. The semiconductor device according to claim 13, further comprising a driver circuit,
wherein the driver circuit is electrically connected to the second wiring and the third wiring.

15. An information processing device comprising:
an arithmetic device comprising a memory portion that stores a program; and
an input/output device,
wherein the arithmetic device is configured to receive positional information and supply image information and control information,
wherein the input/output device is configured to supply the positional information and receive the image information and the control information,
wherein the input/output device comprises a display portion that displays the image information and an input portion that supplies the positional information,
wherein the display portion comprises the semiconductor device according to claim 13,
wherein the input portion is configured to detect a position of a pointer and supply positional information determined in accordance with the position,
wherein the arithmetic device is configured to determine a moving speed of the pointer in accordance with the positional information, and
wherein the arithmetic device is configured to adjust a contrast or brightness of the image information in accordance with the moving speed of the pointer.

16. The information processing device according to claim 15,
wherein a contrast is reduced in such a manner that a gray level of a bright region included in the image information is brought close to a gray level of a dark region included in the image information.

17. The information processing device according to claim 15, wherein the program comprises:
a first step of initializing setting;
a second step of allowing interrupt processing;
a third step of displaying image information in a first or second mode selected in the first step or the interrupt processing;
a fourth step of determining to move to a fifth step when a termination instruction is supplied and to move to the third step when the termination instruction is not supplied; and
the fifth step of terminating the program,
wherein the interrupt processing comprises sixth to eighth steps:
the sixth step of determining to move to the seventh step when a predetermined event is supplied and to move to the eighth step when the predetermined event is not supplied;
the seventh step of changing a mode; and
the eighth step of terminating the interrupt processing, and
wherein in the first mode in the third step, a contrast of image information when a moving speed of a pointer is higher than a predetermined speed is lower than a contrast of image information when the moving speed of the pointer is lower than the predetermined speed.

18. The semiconductor device according to claim 13, further comprising:
a display panel; and
a touch sensor overlapped with the display panel.

19. The semiconductor device according to claim 13,
wherein the first display element is a reflective liquid crystal element,
wherein the semiconductor device is configured to supply a selection signal at a first mode or a second mode, and
wherein a frequency of second mode is lower than that of the first mode.

20. The semiconductor device according to claim 19,
wherein the first transistor comprises oxide metal.

21. An electronic device comprising:
the semiconductor device according to claim 13, and
at least one of a switch, an infrared port, an antenna, a shutter button, or an image receiving portion.

22. A semiconductor device comprising:
a first transistor;
a second transistor;
a third transistor;
a first capacitor;
a second capacitor;
a first display element;
a second display element;
a first wiring;
a second wiring;
a third wiring;
a fourth wiring;
a fifth wiring;
a sixth wiring;
a seventh wiring; and
an eighth wiring,
wherein one of source and drain of the first transistor is electrically connected to the first wiring,
wherein a gate of the first transistor is electrically connected to the second wiring,
wherein the other of the source and the drain of the first transistor is electrically connected to the first display element and one of electrodes of the first capacitor,
wherein the other of electrodes of the first capacitor is electrically connected to the eighth wiring,
wherein the fifth wiring is electrically connected to the first display element,
wherein one of source and drain of the second transistor is electrically connected to the seventh wiring,
wherein a gate of the second transistor is electrically connected to the third wiring, wherein the other of the source and the drain of the second transistor is electrically connected to a first gate of the third transistor, a second gate of the third transistor, and one of electrodes of the second capacitor, wherein one of source and drain of the third transistor is electrically connected to the fourth wiring and the other of electrodes of the second capacitor, wherein the other of the source and the drain of the third transistor is electrically connected to the second display element, and wherein the sixth wiring is electrically connected to the second display element.

23. The semiconductor device according to claim 22, further comprising a driver circuit,
wherein the driver circuit is electrically connected to the second wiring and the third wiring.

24. An information processing device comprising:
an arithmetic device comprising a memory portion that stores a program; and
an input/output device,
wherein the arithmetic device is configured to receive positional information and supply image information and control information,
wherein the input/output device is configured to supply the positional information and receive the image information and the control information,
wherein the input/output device comprises a display portion that displays the image information and an input portion that supplies the positional information,
wherein the display portion comprises the semiconductor device according to claim 22,
wherein the input portion is configured to detect a position of a pointer and supply positional information determined in accordance with the position,
wherein the arithmetic device is configured to determine a moving speed of the pointer in accordance with the positional information, and
wherein the arithmetic device is configured to adjust a contrast or brightness of the image information in accordance with the moving speed of the pointer.

25. The information processing device according to claim 24,
wherein a contrast is reduced in such a manner that a gray level of a bright region included in the image information is brought close to a gray level of a dark region included in the image information.

26. The information processing device according to claim 24, wherein the program comprises:
a first step of initializing setting;
a second step of allowing interrupt processing;
a third step of displaying image information in a first or second mode selected in the first step or the interrupt processing;
a fourth step of determining to move to a fifth step when a termination instruction is supplied and to move to the third step when the termination instruction is not supplied; and
the fifth step of terminating the program,
wherein the interrupt processing comprises sixth to eighth steps:
the sixth step of determining to move to the seventh step when a predetermined event is supplied and to move to the eighth step when the predetermined event is not supplied;
the seventh step of changing a mode; and
the eighth step of terminating the interrupt processing, and
wherein in the first mode in the third step, a contrast of image information when a moving speed of a pointer is higher than a predetermined speed is lower than a contrast of image information when the moving speed of the pointer is lower than the predetermined speed.

27. The semiconductor device according to claim 22, further comprising:
a display panel; and
a touch sensor overlapped with the display panel.

28. The semiconductor device according to claim 22,
wherein the first display element is a reflective liquid crystal element,
wherein the semiconductor device is configured to supply a selection signal at a first mode or a second mode, and
wherein a frequency of second mode is lower than that of the first mode.

29. The semiconductor device according to claim 28, wherein the first transistor comprises oxide metal.

30. An electronic device comprising:
the semiconductor device according to claim 22, and
at least one of a switch, an infrared port, an antenna, a shutter button, or an image receiving portion.

* * * * *